United States Patent
Smith et al.

(10) Patent No.: US 11,322,401 B2
(45) Date of Patent: May 3, 2022

(54) REVERSE CONTACT AND SILICIDE PROCESS FOR THREE-DIMENSIONAL SEMICONDUCTOR DEVICES

(71) Applicant: Tokyo Electron Limited, Tokyo (JP)

(72) Inventors: Jeffrey Smith, Albany, NY (US); Lars Liebmann, Albany, NY (US); Daniel Chanemougame, Albany, NY (US); Hiroki Niimi, Cohoes, NY (US); Kandabara Tapily, Albany, NY (US); Subhadeep Kal, Albany, NY (US); Jodi Grzeskowiak, Albany, NY (US); Anton Devilliers, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 38 days.

(21) Appl. No.: 17/034,930

(22) Filed: Sep. 28, 2020

(65) Prior Publication Data

US 2021/0098294 A1 Apr. 1, 2021

Related U.S. Application Data

(60) Provisional application No. 62/907,107, filed on Sep. 27, 2019.

(51) Int. Cl.
*H01L 21/768* (2006.01)
*H01L 21/28* (2006.01)
(Continued)

(52) U.S. Cl.
CPC .. *H01L 21/76889* (2013.01); *H01L 21/28097* (2013.01); *H01L 21/32053* (2013.01);
(Continued)

(58) Field of Classification Search
CPC ........ H01L 21/76889; H01L 21/28097; H01L 21/32053; H01L 21/76802; H01L 21/76877; H01L 21/823418; H01L 21/823431; H01L 21/823443; H01L 21/823821; H01L 27/092; H01L 29/66795; H01L 21/743; H01L 21/76895;
(Continued)

(56) References Cited

U.S. PATENT DOCUMENTS 10,833,003 B1 * 11/2020 Chou .............. H01L 21/823871

* cited by examiner

*Primary Examiner* — Thanhha S Pham
(74) *Attorney, Agent, or Firm* — Oblon, McClelland, Maier & Neustadt, L.L.P.

(57) ABSTRACT

A method of fabricating a semiconductor device is provided. The method includes forming BPR structures filled with a replacement BPR material, first S/D structures, first replacement silicide layers, and a pre-metallization dielectric that covers the first replacement silicide layers and the first S/D structures. The method also includes forming first interconnect openings in the pre-metallization dielectric and first replacement interconnect layers in the first interconnect openings. The first replacement interconnect layers are connected to the first replacement silicide layers. A thermal process is executed. The method further includes replacing, from a first side of the first wafer, a first group of the first replacement interconnect layers, a first group of the first replacement silicide layers, and the replacement BPR material, and replacing, from a second side of the first wafer, a second group of the first replacement interconnect layers, and a second group of the first replacement silicide layers.

20 Claims, 24 Drawing Sheets

(51) Int. Cl.
*H01L 21/3205* (2006.01)
*H01L 21/8234* (2006.01)
*H01L 29/66* (2006.01)
*H01L 21/8238* (2006.01)
*H01L 27/092* (2006.01)

(52) U.S. Cl.
CPC .. *H01L 21/76802* (2013.01); *H01L 21/76877* (2013.01); *H01L 21/823418* (2013.01); *H01L 21/823431* (2013.01); *H01L 21/823443* (2013.01); *H01L 21/823821* (2013.01); *H01L 27/092* (2013.01); *H01L 29/66795* (2013.01)

(58) Field of Classification Search
CPC ........... H01L 21/76897; H01L 23/5286; H01L 23/535; H01L 21/8221; H01L 27/088; H01L 21/823814; H01L 27/0886; H01L 29/42392; H01L 29/78696; H01L 21/823475; H01L 21/823871
See application file for complete search history.

REVERSE CONTACT AND SILICIDE PROCESS FOR THREE-DIMENSIONAL SEMICONDUCTOR DEVICES

INCORPORATION BY REFERENCE

This present disclosure claims the benefit of U.S. Provisional Application No. 62/907,107, filed on Sep. 27, 2019, the entire content of which is incorporated herein by reference in its entirety.

FIELD OF THE INVENTION

This disclosure relates to integrated circuits and the fabrication of microelectronic devices.

BACKGROUND

In the manufacture of a semiconductor device (especially on the microscopic scale), various fabrication processes are executed such as film-forming depositions, etch mask creation, patterning, photoresist development, material etching and removal, as well as doping treatments. These processes are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other. Fabrication of 3D semiconductor devices poses many new and unique challenges associated with scaling, post-fabrication processing, as well as other aspects of the 3D fabrication process.

SUMMARY

The present disclosure relates to fabrication of a semiconductor device.

A first aspect is a method of fabricating a semiconductor device. In the disclosed method, buried power rail (BPR) structures are formed over a substrate of a first wafer. The BPR structures are separated from each other along a top surface of the substrate by fin structures, and the BPR structures are filled with a replacement BPR material. First source/drain (S/D) structures of first field-effect transistors (FETs) are formed over the substrate. The first S/D structures are positioned at ends of first channel structures of the first FETs, and the first channel structures are positioned over the fin structures and extending along the top surface of the substrate. The method also includes forming first replacement silicide layers on surfaces of the first S/D structures and a pre-metallization dielectric that covers the first replacement silicide layers and the first S/D structures. The method further includes forming first interconnect openings in the pre-metallization dielectric and first replacement interconnect layers in the first interconnect openings, where the first replacement interconnect layers are connected to the first replacement silicide layers. A thermal process can be executed for the first wafer. The method further includes replacing, from a first side of the first wafer, a first group of the first replacement interconnect layers, a first group of the first replacement silicide layers, and the replacement BPR material, and replacing, from a second side of the first wafer, a second group of the first replacement interconnect layers, and a second group of the first replacement silicide layers. The first side and the second side are opposing sides to each other.

In some embodiments, the BPR structures are connected to the first group of the first replacement interconnect layers, and the first group of the first replacement interconnect layers are connected to the first group of the first replacement silicide layers. The second group of the first replacement silicide layers are connected to the second group of the first replacement interconnect layers.

In some embodiments, replacing the first group of the first replacement interconnect layers, the first group of the first replacement silicide layers, and the replacement BPR material can include bonding a second wafer to the second side of the first wafer so that the substrate of the first wafer is exposed from the first side, etching from the first side of the first wafer so that the BPR structures are exposed from the first side, removing the replacement BPR material, removing the first group of the first replacement interconnect layers and the first group of the first replacement silicide layers, filling the removed first group of the first replacement silicide layers with first silicide layers, filling the removed first group of the first replacement interconnect layers with first interconnect layers, and filling the BPR structures with a BPR material.

In some embodiments, replacing the second group of the first replacement interconnect layers and the second group of the first replacement silicide layers can include bonding a third wafer to the first side of the first wafer, removing the second wafer from the second side so that the pre-metallization dielectric of the first wafer is exposed from the second side, forming an interlayer dielectric (ILD) over the pre-metallization dielectric, forming a patterned mask over the ILD, forming first via openings based on the patterned mask where the first via openings extend into the ILD and the pre-metallization dielectric to uncover the second group of the first replacement interconnect layers, removing the second group of the first replacement interconnect layers and the second group of the first replacement silicide layers, filling the removed second group of the first replacement silicide layers with second silicide layers, and filling the removed second group of the first replacement interconnect layers with second interconnect layers.

In some embodiments, before executing the thermal process for the first wafer, the first replacement interconnect layers can be recessed in the first interconnect openings. First dielectric caps are formed on the first replacement interconnect layers, and the first interconnect openings are refilled with the pre-metallization dielectric. The pre-metallization dielectric can be recessed to uncover second channel structures of second FETs where the second channel structures are positioned over the first channel structures and separated from the first channel structures and the second FETs are positioned over the first FETs and separated from the first FETs. Second S/D structures of the second FETs can be formed where the second S/D structures are positioned at ends of the second channel structure and separated from the first S/D structures. Second replacement silicide layers are formed on surfaces of the second S/D structures, and the pre-metallization dielectric is deposited to cover the second replacement silicide layers and the second S/D structures. Second interconnect openings can be formed in the pre-metallization dielectric. The second interconnect openings uncover the second replacement silicide layers. Second replacement interconnect layers are formed in the second interconnect openings.

In some embodiments, after forming the second replacement interconnect layers in the second interconnect openings, the second replacement interconnect layers can be recessed in the second interconnect openings. Second dielectric caps are formed on the second replacement interconnect layers, and the second interconnect openings are refilled with the pre-metallization dielectric.

In some embodiments, after executing the thermal process for the first wafer, the method can further include replacing, from the first side of the first wafer, a first group of the second replacement interconnect layers and a first group of the second replacement silicide layers and replacing, from the second side of the first wafer, a second group of the second replacement interconnect layers and a second group of the second replacement silicide layers. The BPR structures are connected to the first group of the second replacement interconnect layers, and the first group of the second replacement interconnect layers are connected to the first group of the second replacement silicide layers. The second group of the second replacement silicide layers are connected to the second group of the second replacement interconnect layers.

In some embodiments, replacing the first group of the second replacement interconnect layers and the first group of the second replacement silicide layers can include removing the first group of the second replacement interconnect layers and the first group of the second replacement silicide layers after removing the replacement BPR material. The removed first group of the second replacement silicide layers can be refilled with third silicide layers. The first group of the second replacement interconnect layers can be refilled with third interconnect layers.

In some embodiments, replacing the second group of the second replacement interconnect layers and the second group of the second replacement silicide layers can include forming second via openings based on the patterned mask. The second via openings extend into the ILD and the pre-metallization dielectric to uncover the second group of the second replacement interconnect layers. The second group of the second replacement interconnect layers and the second group of the second replacement silicide layers are removed. The removed second group of the second replacement silicide layers can be filled with fourth silicide layers, and the removed second group of the second replacement interconnect layers can be filled with fourth interconnect layers.

In some embodiments, the first silicide is the same as the second silicide. The third silicide is the same as the fourth silicide. The first interconnect material is the same as the second interconnect material. The third interconnect material is the same as the fourth interconnect material. The BPR material is a conductive metal.

In some embodiments, prior to executing the thermal process for the first wafer, first gate structures can be formed on surfaces of the first channel structures, and second gate structures can be formed on surfaces of the second channel structures. The first gate structure includes a first interface layer on the surfaces of the first channel structure, a first high-k dielectric film on the first interface layer, and a first conductive barrier layer on the first high-k dielectric film. The second gate structure includes a second interface layer on the surfaces of the second channel structure, a second high-k dielectric film on the second interface layer, and a second conductive barrier layer on the second high-k dielectric film.

In some embodiments, after executing the thermal process for the first wafer, a first work function metal is formed over the first conductive barrier layer, and a second work function metal is formed over the second conductive barrier layer.

In some embodiments, after filling the BPR structures with the BPR material, the fin structures can be removed from the first side. The removed fin structures are filled with an insulating material.

In some embodiments, the thermal process includes heating the first wafer above 500 degrees Celsius.

A second aspect is a method of fabricating a semiconductor device. In the disclosed method, BPR structures are formed over a substrate of a first wafer. The BPR structures are separated from each other along a top surface of the substrate by fin structures, and the BPR structures are filled with a replacement BPR material. First channel structures of first FETs are formed over the fin structures, and second channel structures of second FETs are formed over the first channel structures. The first channel structures and the second channel structures extend along the top surface of the substrate. The method also includes forming first S/D structures at ends of the first channel structures, first replacement silicide layers on surfaces of the first S/D structures, and first replacement interconnect structures over the first replacement silicide layers. The method further includes forming second S/D structures at ends of the second channel structures, second replacement silicide layers on surfaces of the second S/D structures, and second replacement interconnect structures over the second replacement silicide layers. A thermal process can be executed for the first wafer. The method further includes replacing, from a first side of the first wafer, a first group of the first replacement interconnect layers, a first group of the second replacement interconnect layers, a first group of the first replacement silicide layers, a first group of the second replacement silicide layers, and the replacement BPR material and replacing, from a second side of the first wafer, a second group of the first replacement interconnect layers, a second group of the second replacement interconnect layers, a second group of the first replacement silicide layers, and a second group of the second replacement silicide layers. The first side and the second side are opposing sides to each other.

In some embodiments, forming the first replacement interconnect structures can include depositing a pre-metallization dielectric that covers the first replacement silicide layers and the first S/D structures, forming first interconnect openings in the pre-metallization dielectric where the first interconnect openings uncover the first replacement silicide layers, filling the first interconnect openings with the first replacement interconnect structures, recessing the first replacement interconnect structures in the first interconnect openings, and forming first dielectric caps on the first replacement interconnect structures.

In some embodiments, forming the second S/D structures, the second replacement silicide layers, and the second replacement interconnect structures can include refilling the first interconnect openings with the pre-metallization dielectric, recessing the pre-metallization dielectric to uncover the second channel structures of the second FETs, forming the second S/D structures at the ends of the second channel structures, forming the second replacement silicide layers on the surfaces of the second S/D structures, depositing the pre-metallization dielectric to cover the second replacement silicide layers and the second S/D structures of the second FETs, forming second interconnect openings in the second dielectric where the second interconnect openings uncover the second replacement silicide layers, filling the second interconnect openings with the second replacement interconnect structures, recessing the second replacement interconnect structure in the second interconnect openings, forming second dielectric caps on the second replacement interconnect structures, and refilling the second interconnect openings with the pre-metallization dielectric.

In some embodiments, replacing the first group of the first replacement interconnect layers, the first group of the second replacement interconnect layers, the first group of the first replacement silicide layers, the first group of the second replacement silicide layers, and the replacement BPR material can include bonding a second wafer to the second side of the first wafer so that the substrate of the first wafer is exposed from the first side and etching the first wafer from the first side so that the BPR structures are exposed from the first side. The replacement BPR material, the first group of the first replacement interconnect layers, the first group of the first replacement silicide layers, the first group of the second replacement interconnect layers, and the first group of the second replacement silicide layers can be removed. The removed first group of the first replacement silicide layers, the removed first group of the second replacement silicide layers, the removed first group of the first replacement interconnect layers, the removed first group of the second replacement interconnect layers, and the BPR structures can be filled with a first silicide, a second silicide, a first interconnect material, a second interconnect material, and a BPR material, respectively.

In some embodiments, replacing the second group of the first replacement interconnect layers, the second group of the second replacement interconnect layers, the second group of the first replacement silicide layers, and the second group of the second replacement silicide layers can include bonding a third wafer to the first side of the first wafer. The second wafer is removed from the second side so that the pre-metallization dielectric of the first wafer is exposed from the second side. An interlayer dielectric (ILD) is formed over the pre-metallization dielectric, and a patterned mask is formed over the ILD. First via openings and second via openings can be formed based on the patterned mask. The first via openings and the second via openings extend into the ILD and the pre-metallization dielectric to uncover the second group of the first replacement interconnect layers and the second group of the second replacement interconnect layers, respectively. The second group of the first replacement interconnect layers, the second group of the second replacement interconnect layers, the second group of the first replacement silicide layers, and the second group of the second replacement silicide layers can be removed. The removed second group of the first replacement silicide layers, the removed second group of the second replacement silicide layers, the removed second group of the first replacement interconnect layers, and the removed second group of the second replacement interconnect layers can be filled with a third silicide, a fourth silicide, a third interconnect material, and a fourth interconnect material, respectively.

In some embodiments, the first silicide, the second silicide, the third silicide, and the fourth silicide are a same silicide material. The first interconnect material, the second interconnect material, the third interconnect material, the fourth interconnect material, and the BPR material are a same conductive metal.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
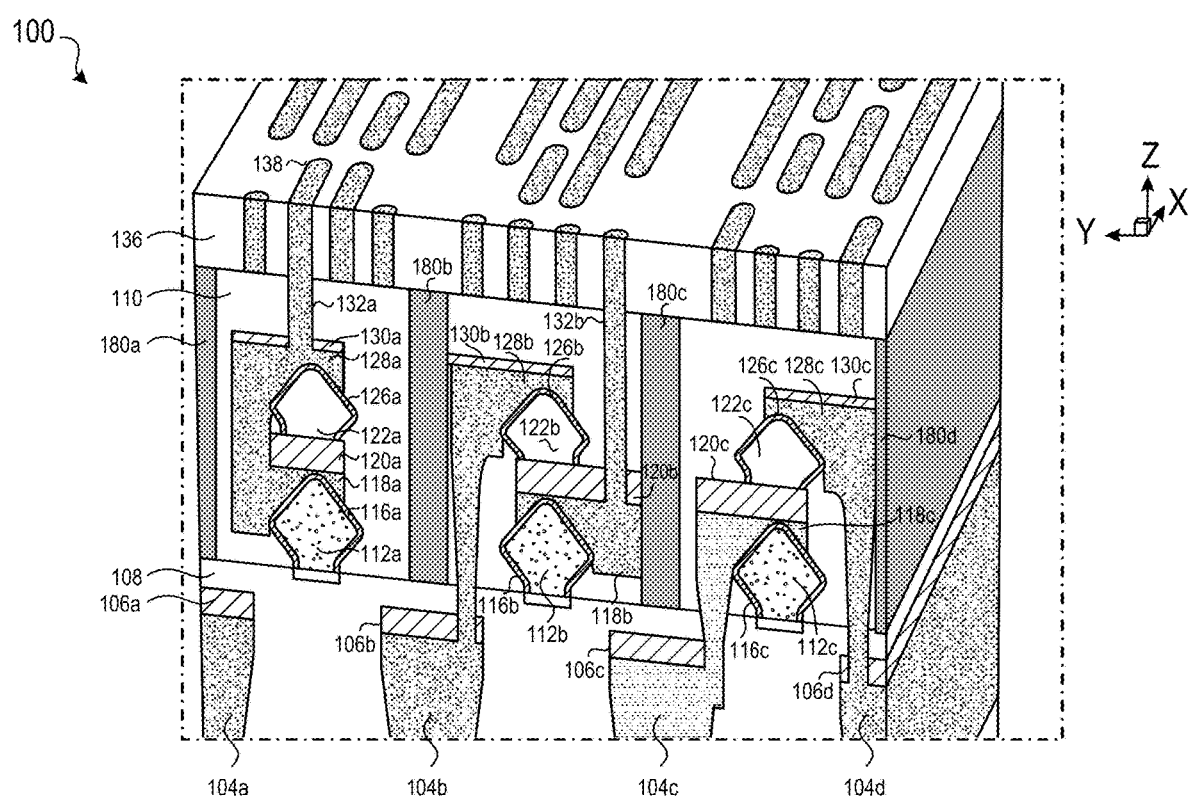
FIG. 1 is a perspective view of a semiconductor device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration is seen as a viable option to continue semiconductor scaling in spite of inevitable saturation in critical dimension scaling. As the contacted gate pitch reaches its scaling limit due to manufacturing variability and electrostatic device limitations, two-dimensional transistor density scaling stops. Even experimental new transistor designs, such as vertical channel gate-all-around transistors, that may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e., the vertical stacking of multiple devices, aims to overcome these scaling limitations by increasing transistor density in a volume rather than an area. This idea has been successfully demonstrated and implemented by the flash memory industry with the adoption of 3D NAND. Mainstream CMOS VLSI scaling, as used for example in CPU or GPU products, is exploring adoption of 3D integration as a primary means of moving the semiconductor roadmap forward, and thus desires enabling technologies.

Replacement metal gate (RMG) module integration has been successfully used for semiconductor manufacturing. In the RMG process, an intended metal gate is first formed using either polysilicon or amorphous silicon. Use of these temporary materials enables performing high temperature thermal processing on the source and drain side of the device. Such thermal processing can typically damage desired metal gate material if the metal gate was already formed using desired or final work function metals (WFM). The damage can include causing a significant threshold voltage shift on the device. Accordingly, the RMG process keeps a "dummy" gate with a sacrificial or temporary material such as a polysilicon or an amorphous silicon structure. With a dummy gate in place, several high-temperature thermal processes can be executed. For example, source and drain epitaxy pre-clean and reactor heat-up is typically performed at 750-780° C. ranges. Source and drain epitaxy growth is typically executed between 500° C. and 800° C. (depending on Ge content and in-situ nature of doping species). Source and drain dopant activation can be executed using laser spike anneal (LSA) at temperatures ranging from 800° C. up to 1250° C. with durations ranging from sub-millisecond to full second durations.

In the RMG process integration, source and drain structures are generally comprised of boron-doped SiGe for PMOS and phosphorous and/or arsenic doped silicon for NMOS. These source and drain structures are then "capped" with a given dielectric etch-stop layer (CESL) to protect the silicon epitaxy surface from oxidation as well as to provide an etch-stopping layer to prevent damage to the source and drain region, when the via-to-drain contact is formed through the pre-metallization dielectric which the source and drain structure is contained within. In such an integration flow, processes critically sensitive to thermal processing can be performed last.

There are several components or steps of such FEOL (front-end-of-line) integrations. Dummy gates are formed, typically by using polysilicon or amorphous silicon. NMOS and/or PMOS source-drain is grown via epitaxy with in-situ dopant addition that is typically performed at temperatures ranging from 500° C. to 800° C. The silicon FIN or nanosheet pre-clean can be done to remove native oxide from the silicon surface within a range of 750° C. to 780° C. Optionally, additional doping species can be implanted through a complementary blocking and implant process. The contact structure is encased and the source and drain are wrapped with a protective etch-stop dielectric layer such as SiN or SiCN. The contact area is filled with a pre-metallization dielectric material such as silicon oxide. The dummy gate structures are then opened or uncovered then the polysilicon or amorphous silicon is removed along with a protective thermal or chemical oxide liner protecting the channel material. For nanosheet devices, this can include removal of the silicon germanium layers separating the intended silicon channels. An interface layer, such as a thermal oxide or chemical oxide, can be deposited or formed over the intended channel material(s). A high-k dielectric film such as HfO or varieties of HfO coupled with dipole forming layers such as LaO and AlO are formed over the interface layer material to cover the channel material(s). The high-k dielectric can be capped with a conductive barrier material such as TiN. A high-k reliability or drive anneal is executed to reduce the formation of charge traps. Such reliability anneals are typically executed within a range of 700° C. to 750° C. A laser spike anneal (LSA) treatment activates dopants within the source and drain area. Such activation anneals are done within a range of 800° C. to 1250° C. with durations ranging from sub-millisecond to full second. The replacement metal gate (RMG) process can be continued in which NMOS and PMOS work function metals are deposited, etched-tuned to set various threshold voltages, and then filled with a high-conductance metal. Via-to-drain contacts can then be opened from M0 (or metal zero level) down to the respective source and drain epitaxy structures through a pre-metallization dielectric. The CESL etch-stop and protective dielectric layer can be removed, and then selective self-aligned silicidation of the source and drain can be followed by metallization of the via-to-drain structure.

With this RMG method, the silicide is formed after all of the individual process steps with high thermal requirements and is thus kept under the temperature in which phase change or agglomeration of the silicide can occur. Such phase change or agglomeration drastically alters the contact resistivity and negatively impacts power and performance of the device. It is known that such phase change of common silicide materials can occur at temperatures as low as 700° C.

With a push toward higher performance and lower power devices, more focus is placed on improving contact resistance. One possible path for improvement is to migrate toward what is referred to a wrap-around contact (WAC) in which the silicide is wrapped completely around the surface of the source and drain epitaxy, or at least as much around as possible.

The WAC integration process can be done through several optional methods. In one method, a guided source and drain epitaxy growth is executed that mirrors a FIN shape as closely as possible. As such, an opening and forming of a silicide around the FIN-shaped epitaxy can exist with current integration methods excluding the means by which to form a source and drain structure containing a FIN-shape. Such processes can be realized by recessing the FIN structure within a sidewall spacer and then subsequently using the sidewall spacer to guide the epitaxy growth to continue within the FIN shape. The silicide process would still be performed following the RMG and all high thermal FEOL steps.

In another WAC method, a conventional source and drain contact are formed using a spacer-assisted method after forming the via-to-drain contact in which a thin etch-selective spacer is deposited within the confines of the via-to-drain structure. Next an opening is anisotropically "punched" through at the bottom of the via-to-drain structure. Then the pre-metallization dielectric material surrounding the source and drain contact can be isotropically etched to form a spherical opening which surrounds the entire or most of the surface of the source and drain epitaxy structure from which a silicide can be grown. This silicide process is still executed following the RMG and all high thermal FEOL steps.

In another WAC method, a conventional source and drain contact is formed and then the self-aligned silicide is immediately formed around the contact. In this manner, a conventional via-to-drain structure can be used to make contact to the silicide without any further processing to ensure that the bottom of the via-to-drain structure is adequately wrapping around the entire contact structure. This process is done prior to any RMG processing where the higher thermal processing is done, so this requires all processes in the RMG module, dopant activation, and reliability drive anneals to be executed at temperatures or conditions which do not result in a phase change of the silicide. One challenge with this WAC method, however, is that reducing the thermal processing temperatures of the reliability drive anneals, source and drain dopant activation anneals, and source and drain epitaxy growth results in some cumulative degradation in both power and performance of the device. For example, transitioning to lower epitaxy deposition temperatures for in-situ doped films may result in a much lower solubility of phosphorous within epitaxy silicon and this lower concentration of dopants would result in higher contact resistance. For conditions where the in-situ dopant concentration can be complemented by additional implantation of dopant species, this poses no problem. Nevertheless, as devices scale to smaller dimensions in size, this becomes much more unfeasible.

For 3D devices such as complementary FET devices (CFET) in which complementary devices are positioned vertically overtop one another, it is viewed as implausible to incorporate any type of conventional implantation process for stacked complementary devices given that NMOS and PMOS would occupy the same space in the vertical orientation from which the implant would be done. Similarly, reducing the reliability anneal temperature by going to higher pressure reliability anneals have been shown to be less effective compared to the higher temperature anneals. Therefore, the concern for doing any type of silicide processing ahead of the RMG module is that there would be some trade-off with respect to gaining area benefit with a complementary FET design but at the expense of potentially reduced performance and/or increased power. A comparison of a standard contact, a wrap-around contact using a silicide formation ahead of the RMG module, and a wrap-around contact based on CFET designs can be shown in FIGS. 2A-2C.

Figure 2A:
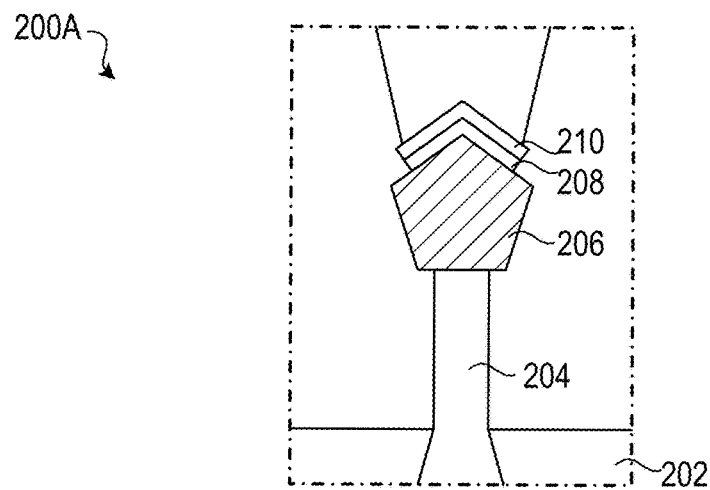
FIGS. 2A, 2B, and 2C are cross-sectional views of a standard contact, a first wrap-around contact, and a second wrap-around contact, respectively, in accordance with some embodiments.

FIG. 2A is a cross-sectional view of the standard contact that can be applied in a FINFET structure. As shown in FIG. 2A, a silicon fin 204 can protrude from a dielectric layer 202. A source/drain (S/D) structure 206 can be disposed on the silicon fin 204. In some embodiments, the S/D structure 206 can be made of silicon doped with phosphorous. A silicide layer 208 can be positioned on a top surface of the S/D structure 206. In some embodiments, the silicide layer 208 can be made of TiSi. In addition, a dielectric cap layer 210 can be positioned over the silicide layer 208. In some embodiments, the dielectric cap layer 210 can be made of SiCN.

Figure 2B:
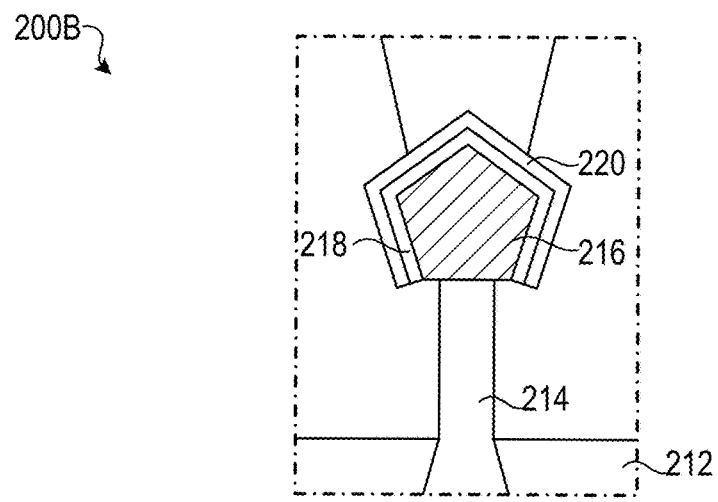

FIG. 2B is a cross-sectional view of wrap-around contact using a silicide formation ahead of the RMG module. As shown in FIG. 2B, a silicon fin (or fin structure) 214 can protrude from a dielectric layer 212. An S/D structure 216 can be positioned on the fin structure 214. In some embodiments, the S/D structure 216 can be made of silicon doped with phosphorous. A silicide layer 218 can be positioned over the S/D structure 216 and surround top surfaces and side surfaces of the S/D structure 216. In some embodiments, the silicide layer 218 can be made of TiSi. A dielectric cap layer 220 can be positioned on the silicide layer 218 to cover the silicide layer 218. In some embodiments, the dielectric cap layer 220 can be made of SiCN.

Figure 2C:
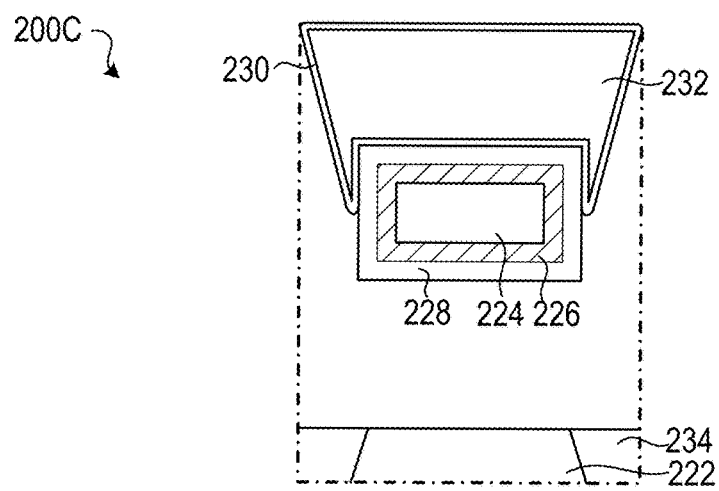

In FIG. 2C, a cross-sectional view of wrap-around contact based on CFET designs can be illustrated. The wrap-around contact can be formed based on a manufacturing process in which the silicide, barrier metal, and via-to-drain high conductance metal can be formed prior to the RMG module. As shown in FIG. 2C, a power rail structure 222 can be positioned in a dielectric layer 234. A channel region 224 can be positioned over the power rail structure 222. The channel region 224 can be made of silicon. An S/D structure 226 can be formed to surround the channel region 224. The S/D structure 226 can be made of silicon doped with phosphorous. A silicide layer 228 can be disposed to wrap the S/D structure 226. The silicide layer 228 can be made of TiSi. A local interconnect structure 232 can be formed over the silicide layer 228. In addition, a barrier layer 230 can be formed between the silicide layer 228 and the local interconnect structure 232, and further surround the local interconnect structure 232. In some embodiments, the local interconnect structure 232 can be made of ruthenium (Ru), and the barrier layer 230 can be made of TiN.

For complementary FET devices in which NMOS and PMOS devices are vertically stacked overtop one another, the integration approach for forming such devices generally consists of a process in which the contact and local interconnect structures are patterned and metalized before the RMG module. Thus, all thermal processing, such as dopant activation and reliability anneal, is done after the source and drain has been grown, the silicide has been formed and metalized with both barrier and high conductance metal fill prior to the RMG module/flow. An example of the CFET integration process can include: (a) silicon pre-clean for upper source and drain epitaxy growth, (b) in-situ doped source and drain epitaxy growth, (c) post high-k deposition reliability drive anneal, and (d) LSA dopant activation anneal.

In 3D monolithic stacked devices such as complementary FET as well as vertically stacked transistors, the lower devices are formed and metallized before the upper devices, and the replacement metal gate module is executed along with the higher thermal process. It is also necessary to prevent any diffusion of the source and drain dopant species from the actual source and drain epitaxy through the silicide and into the actual interconnect metal, which would have a significant increase in the Middle-of-Line (MOL) resistance. In these cases, barrier metals can be used to prevent this diffusion into the interconnect metal. Such barrier metals, however, have significantly lower conductivity compared to the interconnect metal itself. Therefore large thicknesses of the barrier metal can likewise have a net increase in total resistance of the contact and interconnect structure, since the volume of the barrier metal can occupy some portion of the volume that would normally be taken up by the highly conductive fill metal.

Therefore, to rectify many of the thermal processing issues with 3D devices as well as for conventional wrap-around contact, many of the techniques for lowering the temperature of the thermal anneals will have some expected negative impact to the performance or power of the device.

Techniques herein include integration methods in which these high thermal processes can be maintained in order to keep the more desired power and performance of the device, while enabling a 3D logic architecture such as CFET, or even conventional FINFET or GAA devices utilizing wrap-around contacts. This can be accomplished through using a "reverse" or "replacement" silicide and reverse metal interconnect process in which replacement materials are initially implemented into the integration flow and manufacturing process and then subsequently removed and replaced with the final silicide and interconnect metal after the FEOL (front-end of the line) anneals have been done.

Replacement silicide processes herein can be used with many different fabrication flows. In a primary example, FIG. 1 shows a perspective substrate segment along an axis of the source and drain and interconnect structures up to M0 metal tracks. As can be appreciated, replacement silicide processes herein are readily applicable to other devices such as FIN-FET and gate-all-around (GAA) devices. Examples herein primarily focus on the more complex 3D logic devices that can have more obstacles to the implementation of high thermal processes which are needed for current devices in order to achieve necessary power and performance requirements.

FIG. 1 is a perspective view of a semiconductor device 100, in accordance with exemplary embodiments of the disclosure. Particularly, the device 100 is a complementary FET (CFET) device that is formed based on the replacement silicide and replacement interconnect method, in accordance with some embodiments of the disclosure. As shown in FIG. 1, the device 100 can have a plurality of buried power rails (BPRs), for example four BPR structures 104a-104c, arranged over a substrate (not shown). In some embodiments, the device 100 can also include fins structures (not shown) arranged between the BPRs 104a-104c. In some embodiments, the BPRs 104 can further extend along an x direction. The BPRs 104 are buried at a bottom portion of the CFET device 100 and configured to provide operation voltages (e.g., Vdd or GND) to the CFET device 100. A plurality of first dielectric caps 106a-106d are positioned on the BPRs 104 and function as isolation layers. In addition, an insulating layer 108 can be positioned between the BPRs 104.

Still referring to FIG. 1, a plurality of first source/drain (S/D) structures 112a-112c are positioned above the first dielectric caps 106. Each of the first S/D structures 112 can be positioned over a gap between two neighboring dielectric caps 106. For example, the first S/D structure 112a is positioned over the gap between the neighboring dielectric caps 106a and 106b. In an embodiment where fins structures (not shown) are arranged between the BPRs 104, each of the first S/D structures 112 can be positioned over a respective fin structure. The first S/D structures 112 are arranged at first ends of first channel structures (not shown). Each of the first channel structures can include one or more first nanosheets or first nanowires that extend along the x direction. The first nanosheets or first nanowires are spaced apart from one another. In addition, a plurality of first silicide layers 116a-116c is positioned over surfaces of the first S/D structures 112. The first silicide layers 116 further surround the first S/D structures 112 to improve conductivity of the first S/D structures 112. A plurality of first local interconnect structures (also referred to first interconnect structures) 118a-118c are positioned over the first silicide layers 116 so as to be electrically coupled to the first S/D structures 112 through the first silicide layers 116. For example, the first local interconnect structure 118a is coupled to the first S/D structure 112a through the first silicide layer 116a. In addition, a first group of the first local interconnect structures 118 can further be connected to the BPRs 104. For example, the first local interconnect structure 118c can extend through the first dielectric cap 106c and further be connected to the power rail 104c.

The device 100 can have a plurality of second dielectric caps 120a-120c that are positioned on the first local interconnect structures 118 and function as insulating layers. Over the second dielectric caps 120, a plurality of second S/D structures 122a-122c is positioned. The second S/D structures 122 are aligned with the first S/D structures 112 along the z direction. For example, the first S/D structure 112a is aligned with the second S/D structure 122a along the z direction. The second S/D structures 122 are arranged at first ends of second channel structures (not shown). The second channel structures are positioned over the first channel structures. The first channel structures and the second channel structures are aligned along the z direction. In addition, each of the second channel structures can include one or more second nanosheets or second nanowires that extend along the x direction. A plurality of second silicide layers 126a-126c is positioned over top surfaces of the second S/D structures 122. The second silicide layers 126 further surround the second S/D structures 122 to improve the conductivity of the second S/D structures 122.

Still referring to FIG. 1, the device 100 can have a plurality of second local interconnect structures (also referred to second interconnect structures) 128a-128c that are positioned over the second silicide layers 126 so that the second local interconnect structures 128 are coupled to the second S/D structures 122 through the second silicide layers 126. In some embodiments, a first group of the second local interconnect structures 128 can be further connected to the BPRs 104. For example, the second local interconnect structure 128b can extend through the first dielectric cap 106b and connect to the power rail 104b. A plurality of third dielectric caps 130a-130c can be positioned on the second local interconnect structures 128 and function as insulating layers. The device 100 can also have a plurality of vias 132a-132b that extends into a first interlayer dielectric (ILD) 110, where the first S/D structures 112, the second S/D structures 122, the first local interconnect structures 118, and the second local interconnect structures 128 are positioned. The vias 132 can further extend through the second dielectric caps 120 and the third dielectric caps 130 to connect to the first local interconnect structures 118 and the second local interconnect structures 128. For example, the via 132a can extend into the first ILD 110, extend through the third dielectric cap 130a and connect to the second local interconnect structure 128a and the first local interconnect structure 118a. The via 132b can extend through the second dielectric cap 120b to connect to the first local interconnect structure 118b.

In the device 100, a plurality of metal lines 138 can be positioned over the vias 132. The metal lines 138 can be formed in an interlayer dielectric (ILD) 136, where the ILD 136 can be positioned over the first ILD 110. In some embodiments, one or more of the metal lines 138 can be coupled to a second group of the first local interconnect structures 118 or a second group of the second local interconnect structures 128. For example, the metal line 138a is coupled to the second local interconnect structure 128a and the first local interconnect structure 118a through the via 132a.

Still referring to FIG. 1, a plurality of separation structures 180a-180d can be disposed in the first ILD 110. The separation structures 180 extend along the x direction. The separation structures 180 can be configured to separate the first S/D structures 112 and the second S/D structures 122 into a plurality of pairs. For example, the first S/D structure 112a and the second S/D structure 122a can be positioned between the separation structures 180a and 180b. The first S/D structure 112b and the second S/D structure 122b can be positioned between the separation structures 180b and 180c.

In an embodiment, the first S/D structures 112 can be S/D structures of N-type transistors, and the second S/D structures 122 can be S/D structures of P-type transistors. Accordingly, the first S/D structures 112 can be made of silicon doped with phosphorous, and the second S/D structures 122 can be made of silicon germanium doped with boron. In another embodiment, the first S/D structures 112 can be S/D structures of P-type transistors, and the second S/D structures 122 can be S/D structures of N-type transistors. Accordingly, the first S/D structures 112 can be made of silicon germanium doped with boron, and the second S/D structures 122 can be made of silicon doped with phosphorus. In an exemplary embodiment of FIG. 1, the first S/D structures 112 are S/D structures of P-type transistors and the second S/D structures 122 are S/D structures of N-type transistors.

In some embodiments, the BPRs 104, the first local interconnect structures 118, the second local interconnect structures 128, the via 132, and the metal lines 138 can include W, Co, Ru, Al, Cu, or other conductive materials. The first dielectric caps 106, the second dielectric caps 120, the third dielectric caps 130, and the separation structures 180a-180d can include SiN, SiCN, AlO, or other suitable dielectric materials. The first ILD 110 and the ILD 136 can include SiO, TEOS, BPSG, PSG, USG, low-k dielectric or other suitable dielectric materials. The first silicide layer 116 and the second silicide layers 126 can include ruthenium silicide, titanium silicide, or other suitable silicide. In some embodiments, barrier layers or liners can be formed between the first local interconnect structures 118 and the first silicide layers 116. The barrier layers or the liners can also formed between the second local interconnect structures 128 and the second silicide layers 126. The barrier layer or the liners can include TiN, TaN, Ti, Ta, or other suitable barriers.

In an exemplary embodiment of FIG. 1, the BPRs 104, the first local interconnect structures 118, the second local interconnect structures 128, the via 132, and the metal lines 138 are made of Ru. The first dielectric caps 106, the second dielectric caps 120, and the third dielectric caps 130 are made of AlO. The insulating layer 108 and the first ILD 110 are made of SiO. The separation structures 180 are made of SiN. and the ILD 136 are made of low-k dielectric. The first silicide layers 116 are made of ruthenium silicide, and the second silicide layers 126 are made of titanium silicide. In addition, the barrier layers or liners are made of TiN.

In the device 100, a replacement silicide process has been applied to form the first silicide layers 116 and the second silicide layers 126. In the replacement silicide process, first replacement silicide layers and second replacement silicide layers can be formed at first. Then the RMG module can be applied to form the metal gates. A thermal process can be applied to anneal the substrate. The first replacement silicide layers and the second replacement silicide layers can subsequently be replaced with the first silicide layers 116 and the second silicide layers 126. An exemplary manufacturing process can be illustrated in FIGS. 4-42.

Embodiments of the present disclosure include a combinational reverse metal contact and silicide process. In the process, a temporary or sacrificial or replacement or replacement silicide material is selectively or non-selectively deposited overtop the source and drain device structures. The replacement material (replacement silicide material) can be a dielectric with etch selectivity relative to the pre-metallization dielectric (e.g., the first ILD 110) in which the source and drain structures (e.g., the first S/D structure 112 or the second S/D structure 122) are contained within. The replacement material can function as an etch stop layer to protect the source and drain contacts (e.g., the first S/D structures 112 or the second S/D structures 122) when the pre-metallization dielectric is opened in a typical via-to-drain process. The replacement material functions as an efficient and effective diffusion block to silicon, silicon germanium, phosphorous, boron, or other doping species during thermal processing, such as reliability anneals, source and drain device formation within upper devices, dopant activation anneals, and silicon pre-clean anneals. The replacement material is selected to have no interaction with the silicon and/or silicon germanium source and drain contacts during the front end of the line (FEOL) thermal annealing processes mentioned above. The replacement material is selected to be easily removed after the high thermal processing is completed. Therefore a clean tunnel or space can exist around the surface area of the source and drain contacts, and a metal silicide can be subsequently grown thereon. The replacement material can be formed at a thickness sufficient to enable an isotropic etch process to remove (easily remove) all of the replacement silicide material from the surfaces of the source and drain contacts and have selectivity to the pre-metallization dielectric so that a uniform channel is created after the removal of the replacement silicide material. Example replacement silicide materials include, but are not limited to, silicon nitride, SiCN, SiC, and others.

Embodiments include forming a bottom local interconnect structure (e.g., the first local interconnect structure 118) by following the formation of the replacement silicide. The bottom local interconnect can be considered a reverse/dummy interconnect or reverse/dummy contact that is comprised of a replacement material. The replacement material (or the replacement interconnect material) can withstand the high thermal processing anneals that is performed later in the RMG process flow. The bottom local interconnect structure itself maintains its structural characteristics with the exception of the material composition in the final device. Such a process and nomenclature is similar to the replacement metal gate in which polysilicon or amorphous silicon is used to define the metal gate structure, and after the high temperature FEOL anneals is completed, the polysilicon or amorphous silicon material is removed and subsequently replaced with work function metals. In such a process, the physical gate structure is likewise maintained.

Replacement interconnect material is selected as a material with chemical and/or physical properties sufficient to withstand the high thermal anneals that is operated in the RMG module as well as during the formation of devices above. Replacement interconnect material benefits from having excellent etch selectivity to both the replacement silicide material used in the integration as well as the pre-metallization dielectric material in which the replacement interconnect or replacement contact structure can be contained. Replacement interconnect material is relatively easily removed through an isotropic vapor-phase etch, a chemical wet-etch, or an isotropic direct plasma or remote plasma etch process.

The replacement interconnect material is such that a selectively deposited or grown dielectric film or cap can be formed over the upper surface of the intended replacement interconnect structure to act as a dielectric separation between upper (or second) and lower (or first) interconnect structures. The replacement interconnect material also has etch selectivity to the deposited or grown dielectric cap material overtop the local interconnect structure, such that the replacement interconnect material can be removed completely without causing any damage or deformation to the dielectric separation between the upper and lower interconnect structures. Replacement interconnect material is selected so that it can also have no interaction during the thermal annealing processes with either the replacement silicide material, the pre-metallization dielectric, or the dielectric cap (e.g., second dielectric caps 120) used to isolated the upper and lower devices.

Replacement interconnect material can be cyclically etched or recessed after deposition into the interconnect patterning trench within the pre-metallization dielectric, such that a uniform top surface of the interconnect structure can be formed. In such an approach it is also beneficial for the replacement interconnect material to have chemical mechanical polishing (CMP) characteristics such that a planar film can be produced prior to recess within the interconnect trench. Alternatively, a substitution to the CMP characteristics can be a super-conformal deposition process in which a very flat upper surface or over-burden of the replacement interconnect material can be deposited with the subsequent planarization that can be operated either through a CMP or a recess etch. The replacement interconnect can be selectively deposited around the reverse silicide material or bottom-filled within the interconnect trench. Example materials for replacement interconnect include polysilicon and amorphous silicon among others.

Embodiments include a method to create an etch-selective dielectric barrier (e.g., the second dielectric cap 120) at a top of the bottom replacement local interconnect structure. Preferable, this dielectric separation is performed through selective deposition of a dielectric directly on the surface of the replacement interconnect material. If the replacement dielectric material is composed of polysilicon or amorphous silicon, then an alternative way is to grow the dielectric at the top of the replacement local interconnect structure. The dielectric material can be formed with benefits of good etch selectivity to the pre-metallization dielectric material that encases the contacts and local interconnect structures. It is also beneficial that the dielectric (e.g., the second dielectric cap 120) formed over the replacement bottom local interconnect has a sufficiently low dielectric constant that maintains reasonable capacitance and prevents capacitive coupling between the upper and lower (or bottom) devices. For the case of selective deposition over a polysilicon or amorphous silicon replacement local interconnect, the dielectric material can be a metal oxide such as aluminum oxide.

Processes to create the replacement interconnect and the etch-selective dielectric barrier can be repeated sequentially for every stacked device, such as during fabrication of a vertical stack of gate-all-around channel devices or other 3D logic vertical stacks.

Embodiments include isotropically removing (pulling) the replacement local interconnect material and the replacement silicide material after the RMG module and high thermal processes are completed. For example, one or more of the upper and lower replacement local interconnect structures can be opened during the formation of M0 trenches prior to metallization. Because M0 runs perpendicularly to the local interconnect structures, it is provided that one or more local interconnect structures can be accessed through the M0 tracks. During M0 pattern memorization in a hard-mask, such as TiN above the planar surface of the contact region, via-to-drain structures can be patterned which connect to replacement local interconnect structures, regardless if the local interconnect resides at an upper or lower device for a complementary FET device.

The via-to-drain structure can uncover the replacement materials in the local interconnect structures. An isotropic etch process such as vapor phase CERTAS etch by Tokyo Electron, a chemical wet-etch, or a direct or remote plasma isotropic etch can be used to remove the replacement material in the local interconnect structures. The replacement materials (e.g., polysilicon) in the local interconnect structures can be removed while the pre-metallization dielectric (e.g., silicon oxide) and the replacement silicide material (e.g., SiCN) can be impacted very less during the removal process. Selectivity is significantly important because any etching of the replacement silicide at this point can cause un-wanted etching of the source and drain epitaxy. Because the M0 tracks run perpendicular to the local interconnect structures, the via-to-drain structures can be self-aligned. For example, the Y-orientation of the via-to-drain structure is formed/controlled by the size of the M0 trench and the X-direction of the via-to-drain structure is formed/controlled by the size of the local interconnect structure. This self-alignment provides a means for which an overly-sized via-to-drain structure can be formed to enable complete clear-out of the replacement interconnect and replacement silicide materials.

Some embodiments can include using a buried power rail (BRP) (e.g., BPRs 104 formed below channel material in the bulk silicon) in the device design. In some cases, the buried power rail can already be formed and metallized with a high refractive metal (such as ruthenium) prior to any formation of the reverse or replacement local interconnect or silicide structures. Such a fabrication flow imposes a further etch selectivity restriction for selecting the replacement local interconnect during the formation of the local interconnect structures because the local interconnect structures can be coupled to the power rails through Vias. In such a case, the interface between the local interconnect structures and the power rail is preferably ruthenium or other type of metal in the BRP structure, with polysilicon as the replacement interconnect material. Note that sufficiently high etch selectivity should also exist such that any etching of the replacement interconnect material (e.g., polysilicon) does not etch the formed buried power rail (e.g., ruthenium). This is typically challenging because polysilicon and metals would be etched using similar etch chemistries. A vapor-phase etch, however, such as with Tokyo Electron CERTAS etch, can be used to have extremely high etch selectivity between silicon and metals. Alternatively other etch equipment using chemical wet etches and either direct or remote plasma can meet this high selectivity based on what chemistry is used to etch the replacement interconnect material.

In some embodiments, BPRs are also utilized in the device design, and BPRs will be formed but not metalized and instead filled with some type of temporary filling or replacement material such as polysilicon or amorphous silicon. The goal of having a buried power rail that is not metalized will that it can provide wafer through the backside of the wafer where the replacement buried power rail and replacement local interconnects (and associated vias connecting said replacement interconnect structures and replacement buried power rails) can be removed together and provide access to the source and drain contact for silicidation from the back-side access of the wafer. This can prevent the need to create additional dummy metal lines in the BEOL to access the interconnect structures that are connecting to the buried power; hence capacitance in the BEOL can be reduced compared to the case where additional dummy metal lines are being kept solely for the purpose of providing access to metalize interconnect structures connecting to buried power and not to any signal wires in the BEOL such as M0 or M1 This can likewise eliminate the need to incorporate metal recessing and subsequent dielectric capping of any BEOL M0 or M1 access points to the interconnects connecting to the buried power for a metal track that is "flying over" the interconnect. This can save additional complexity in the BEOL processing as these metal recess and dielectric caps are no longer needed; and the additional complexity to the backside wafer processing can be integrated into current approaches for adding back side power distribution to the backside of the wafer. In this process integration the buried power rails will still be formed as conventionally described, by instead of metalizing with high refractive metals after formation, the buried power will be filled with a material such as polysilicon or amorphous silicon which can withstand the high FEOL processing temperatures. Accordingly, the replacement interconnect and silicide process will be broken into two separate steps (a) one step to access the replacement interconnect and replacement silicide connecting to buried power through access the back-side of the wafer, and (b) one step to access the replacement interconnect and replacement silicide connecting to signal tracks in the BEOL through the methods described in this disclosure.

Further, it is assumed in this disclosure that for internal nodes, where the output-side of one source and drain contact feeding directly into a neighboring input-side of another source and drain contact, where no input or output is supplied or delivered through a signal line or from a power line; that no interconnect metal structure will be required and the input from one source and drain contact can flow into the adjacent source and drain contact (this is important since if an interconnect structure were present that this additional claim would not be able to do any type of replacement process with either the silicide or the interconnect structure. It is realized that in the integration process, the replacement silicide material will remain on this internal node and will have no negative influence on the device performance as long as the epitaxy is merged between the two adjacent source and drain contacts which is the expectation of normal devices. In addition, there is no net change to how the replacement silicide or replacement interconnect (contact) structures are made from this disclosure.

In some embodiments, for the contacts connecting down to the replacement buried power, the replacement interconnect and replacement silicide are formed in the same manner as the rest of this disclosure. The replacement interconnect and via connecting down to the replacement power are likewise filled with a material such as polysilicon or amorphous silicon. In the replacement process, in the integration flow described in this disclosure, at the point where the actual silicide is to be formed and the interconnect metal filled, the wafer top-side will be attached to a carrier and the wafer flipped up-side-down to provide access to the backside of the wafer. The silicon on the backside of the wafer will be removed until an etch-stop layer such as SiGe is reached or the replacement buried power rail is reached. It is noted that the replacement buried power rail will have some type of dielectric layer which can also act as a natural etch-stop. The polysilicon or amorphous silicon composing of the replacement buried power rail, the replacement local interconnect structure, and the via connecting the two together can be pulled simultaneously as they are all interconnected. The replacement silicide can be removed accessing the cavity formed by the removal of the replacement power rail and replacement interconnect. The new silicide can be formed over the opened contact. The metallization of the interconnect and buried power rail and the via connecting the two can be done at one time utilizing a suited metal. Note that for the case of monolithic complimentary FET (CFET) the source and drain contacts are already formed as well is the high-k metal gate (HKMG) along with any associated reliability anneals, so this opens the metallization up significantly to metals that are not necessarily high refractive, or to a combination of metals such as (a) initial filling that will fill the smaller structures (i.e. interconnect and vias) with a low-resistive metal at small dimensions such as ruthenium or cobalt, and a secondary filling of the buried rail with metals with lower resistivity at larger features such as copper. The wafer is then flipped back over to provide access back to the top-side of the wafer to allow the replacement contact and silicide process to be done for the interconnect structures connecting to the BEOL.

Embodiments can include using the same access point established by the formation of the via-to-drain structures to connect local interconnect structures. Following removal of the replacement local interconnect material by an etch process, the etch process is switched to remove the replacement silicide material on the surface of the source and drain contacts. A height or thickness of the replacement silicide is created that enables easy access to completely remove the replacement silicide material (e.g., SiCN) from the surface of the contacts, that is, a sufficient thickness to remove without causing any damage or deformation to the contacts themselves. Etch selectivity is such that no etching (or insignificant etching) of the pre-metallization dielectric is realized. Removal of the replacement silicide material causes no damage to the source and drain contact. The initial height or thickness of the reverse silicide material is adequate to allow complete clear-out of the material during an isotropic etch process.

Embodiments include a method to form a self-aligned silicide in the space left behind by the replacement silicide. The self-aligned silicide can be executed by selective deposition, atomic layer deposition (ALD) or chemical vapor deposition (CVD), followed by a wet removal or plasma etching of the unreacted metal from the silicide material. The deposition can fill the relatively small channels created by the removal of the replacement silicide. An in-situ oxide clean process such as COR (chemical oxide removal) manufactured by Tokyo Electron can be incorporated to pre-clean the epitaxy surface prior to the silicide formation process.

The masking step can be done at one time for a complementary FET device if a common silicide is to be used. Otherwise, multiple masking steps can be used to yield different silicide materials over NMOS and PMOS source and drains.

Embodiments include filling the local interconnect structures with a final high conductance metal and any liners or adhesion layers required. Deposition of metal and adhesion layers must be conformal such that the body of the local interconnect structure can be filled without constricting the via-to-drain structure first. Note that the final higher conductance metal fill can not only fill one or more of the local interconnect structures, but also fill the via-to-drain structures as well as the M0 tracks simultaneously. A benefit of the filling process is that some of the local interconnect high conductance metal fill can be done at a single time for complementary and other 3D logic devices. Conventionally in CFET process the filling process is executed across multiple steps in the integration. It is understood that metals desired for leading edge logic are typically expensive and keeping the deposition to a single unit process step can have significant cost benefits as well. Thus, the filling process can be used as a cost saving measure in addition to rectifying the thermal budget associated with the manufacturing process.

Another process step can include isolating the metallized interconnects that are used to connection to any M0 track such as interconnects that are tapping the buried power rails or interconnects which have no upward connection to the back-end of the line (BEOL). The replacement silicide and interconnect process requires an access point at an M0 track where there is no desire to actually connect the interconnect structure to the M0 track. For these situations a dielectric separation can be formed between the interconnect structure and M0 track. In this manner an additional masking step is then used to form a "contact" or "open" pattern after the final interconnect/via-to-drain/M0 metallization.

Some metals such as ruthenium have the benefit of being able to be etched well within an anisotropic etch process while having high conductance. The benefit of these properties allows ruthenium to be recessed only for the via-to-drain structures that are selected to be electrically isolated based on the cell layout. When the isotropic etch is used, there is a risk that the isotropic etch can extend over to adjacent via-to-drain structures in which connection between the local interconnect and the M0 track is still required. After the metal has been recessed well within the desired via-to-drain structures, a dielectric can be selectively deposited, grown, or patterned by using a deposition followed by an etch-back process to create a desired dielectric separation. The material choice in the present disclosure can be a material having an adequately low dielectric constant. For example, aluminum oxide (AlO) can be selected to form the dielectric film because the AlO can be selectively deposited to the recessed ruthenium. Any dielectric deposited on a top of the bulk filled metal above the M0 tracks (referred to as the over-burden of the deposition) can be removed by chemical mechanical polishing or other methods. After the deposition of the dielectric separation, it is desired to refill the area of the M0 tracks from which the high conductance metal had been removed. This can be accomplished through a second deposition of the metal and subsequent CMP or etch-back process to reform the M0 tracks.

In some embodiments, the reverse interconnect and reverse silicide process herein can be incorporated in FINFET, gate-all-around (GAA), and stacked 3D logic devices such as complementary FET. For convenience in describing embodiments herein, example descriptions focus on CFET as the most complex implementation. This is not limiting and embodiments herein can be carried over to conventional wrap-around contact processes used for either FINFET or GAA devices.

Figure 3:
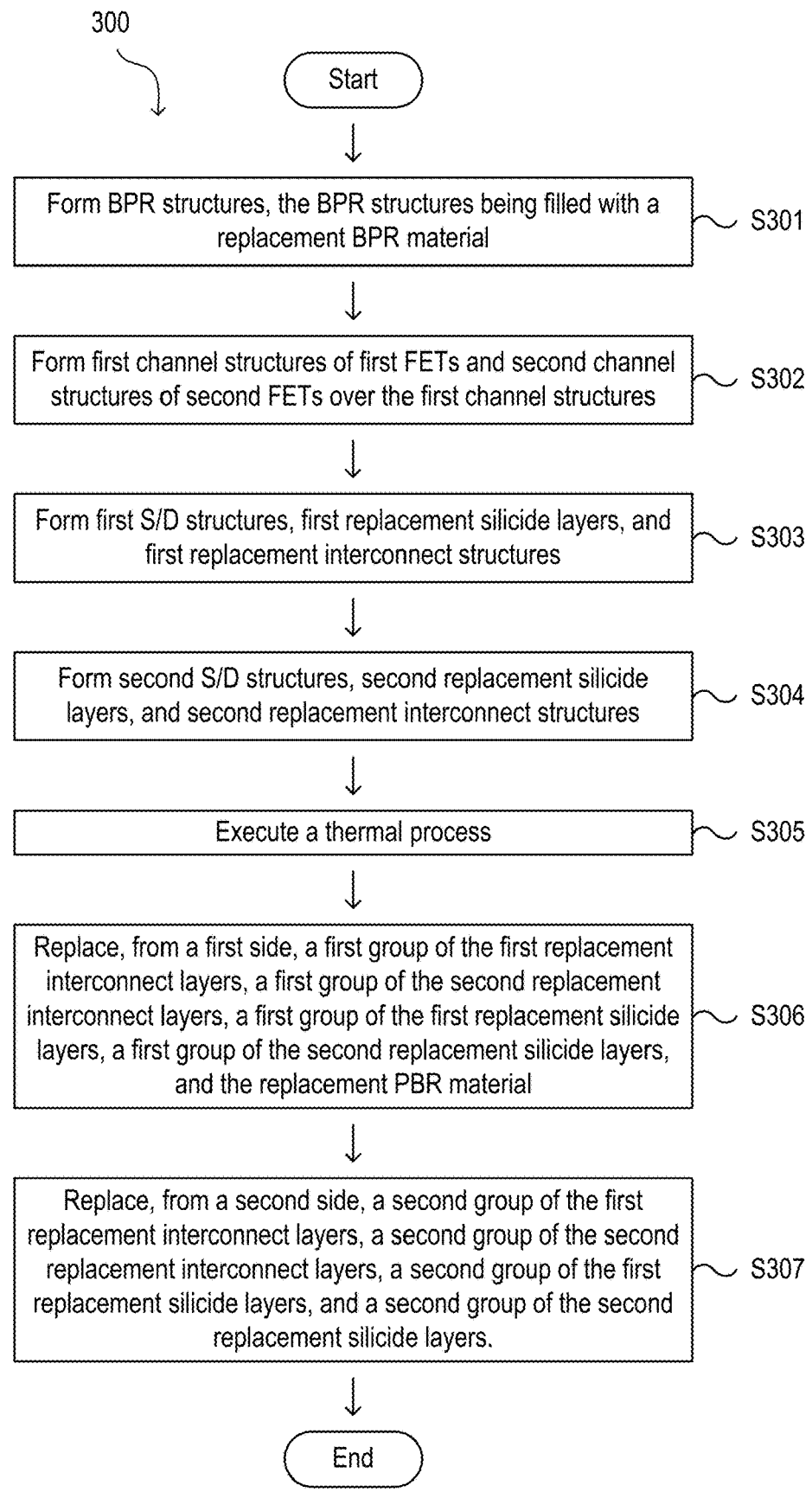
FIG. 3 shows a flowchart of an exemplary process for manufacturing an exemplary semiconductor device, in accordance with embodiments of the disclosure.

FIG. 3 shows a flowchart of an exemplary process 300 for manufacturing an exemplary semiconductor device, in accordance with embodiments of the disclosure. The process 300 begins with step S301 (e.g., FIG. 4) where buried power rail (BPR) structures are formed over a substrate of a first wafer. The BPR structures are separated from each other along a top surface of the substrate by fin structures, and the BPR structures are filled with a replacement BPR material. At step S302 (e.g., FIG. 4), first channel structures of first FETs can be formed over the fin structures, and second channel structures of second FETs can be formed over the first channel structures. The first channel structures and the second channel structures extend along the top surface of the substrate. At step S303 (e.g., FIGS. 5-14), first S/D structures, first replacement silicide layers, and first replacement interconnect structures can be formed at ends of the first channel structures, on surfaces of the first S/D structures, and over the first replacement silicide layers, respectively. At step S304 (e.g., FIGS. 15-24), second S/D structures, second replacement silicide layers, and second replacement interconnect structures can be formed at ends of the second channel structures, on surfaces of the second S/D structures, and over the second replacement silicide layers, respectively. At step S305, a thermal process can be executed for the first wafer.

The process 300 then proceeds to step S306 (e.g., FIGS. 26-31) by replacing, from a first side of the first wafer, a first group of the first replacement interconnect layers, a first group of the second replacement interconnect layers, a first group of the first replacement silicide layers, a first group of the second replacement silicide layers, and the replacement BPR material. The process then proceeds to step S307 (e.g., FIGS. 34-42) by replacing, from a second side of the first wafer, a second group of the first replacement interconnect layers, a second group of the second replacement interconnect layers, a second group of the first replacement silicide layers, and a second group of the second replacement silicide layers. The first side and the second side are opposing sides to each other.

FIGS. 4-42 are perspective views of a semiconductor device 400, such as the device 100 and the like, at various intermediate steps of manufacturing, in accordance with exemplary embodiments of the disclosure.

Figure 4:
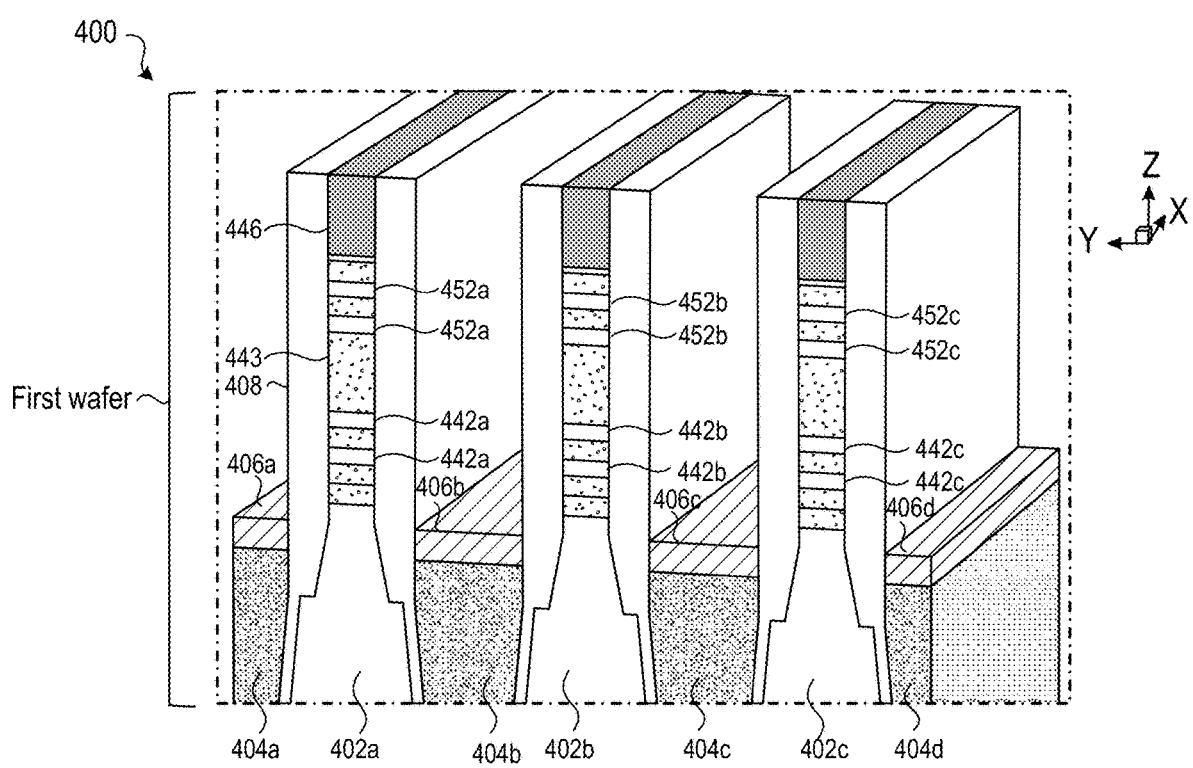
FIGS. 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, and 42 are perspective views of a semiconductor device at various intermediate steps of manufacturing, in accordance with exemplary embodiments of the disclosure.
Figure 5:
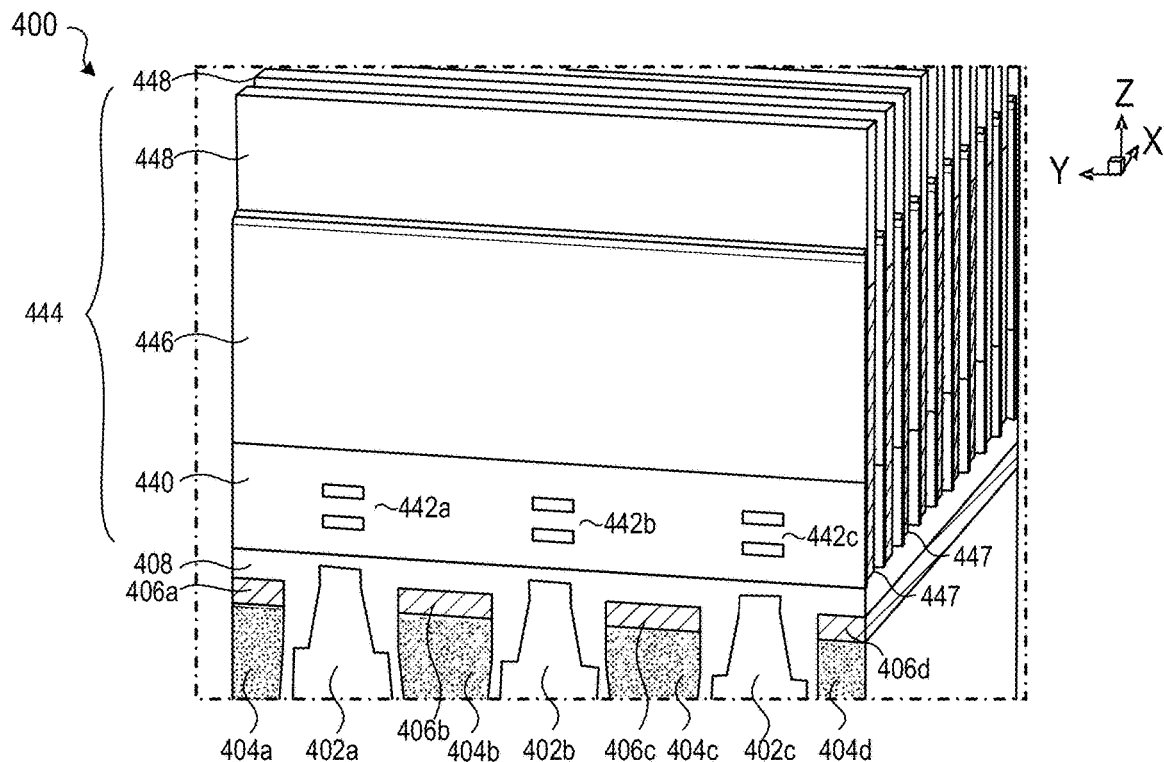

In FIG. 4, the device 400 can have a plurality of fin structures 402 protruding from a substrate (not shown) of a first wafer. For example, three fin structures 402a-402c are included in FIG. 4. A plurality of BPR structures 404a-404c that is filled with a replacement BPR material can be arranged over the substrate and positioned between the fin structures 402. The BPR structures 404 are buried at a bottom portion of the semiconductor device 400. In some embodiments, the BPR structures 404 can further extend along an x direction. In some embodiments, the BPR structures 404 are filled with some type of replacement BPR material that can withstand the high thermal processing conditions in the FEOL such as polysilicon or amorphous silicon. It should be understood that any number of BPR structures 404 can be formed to meet specific design requirements. Additionally, a plurality of first dielectric caps 406a-406d is positioned on the BPR structures 404 and functions as isolation layers. In addition, an insulating layer 408 (e.g., silicon oxide) can be positioned between the BPR structures 404 and the fin structures 402.

Still referring to FIG. 4, a plurality of first channel structures 442a-442c can be positioned over the fin structures 402. Each of the first channel structures 442 can be disposed over a respective fin 402. For example, the first channel structure 442a is positioned over the fin 402a. The first channel structures 442 are further aligned with the fin structures 402 along a z direction. Each of the first channel structures 442 can include one or more first nanosheets or first nanowires that extend along the X-direction. The first nanosheets or nanowires can be stacked over the fin structures 402 and spaced apart from one another by an insulating layer 443. In an embodiment of FIG. 4, the first channel structures 442 include two first nanosheets.

Further, a plurality of second channel structures 452a-452c can be positioned over the first channel structures 442. Each of the second channel structures 452 can be disposed over a respective first channel structure 442. For example, the second channel structures 452 can be further aligned with the first channel structures 442 along the z direction. Each of the second channel structures 452 can include one or more first nanosheets or first nanowires that extend along the x direction. The second nanosheets or nanowires can be stacked over the first channel structures 442 and spaced apart from one another by the insulating layer 443. In an embodiment of FIG. 4, the first channel structures 452 include two first nanosheets.

A sidewall spacer approach can be used to form a cover spacer 246 to block upper (or second) device nanosheets (or second channel structures) in FIG. 4 and open the lower (or the first or the bottom) device nanosheets (or the first channel structures) 442. As a result in FIG. 5, the first channel structure 442 can be exposed in a low-k gate spacer 440 and positioned within a plane (e.g., the yz plane in FIG. 5) parallel/aligned with the intended contact and interconnect region. The exposed silicon nanosheets (or first channel structures) 442 of the bottom device (e.g., P-type transistor) can be pre-cleaned either through an in-situ high thermal anneal or through an in-situ chemical oxide removal (COR) vapor-phase etch process performed immediately prior to source and drain epitaxy growth. The exposed nanosheets (or first channel structures) 242 can be isotropically recessed within the low-k gate spacer 440 in order to reduce the gate extension of the channel structure. The first channel structures 442 can be buried in a hard mask stack 444 that includes an underlying layer 447 and a cap layer 448. In some embodiments, the underlying layer 447 can be made of carbon, and the cap layer 448 can be made of SiN.

Figure 6:
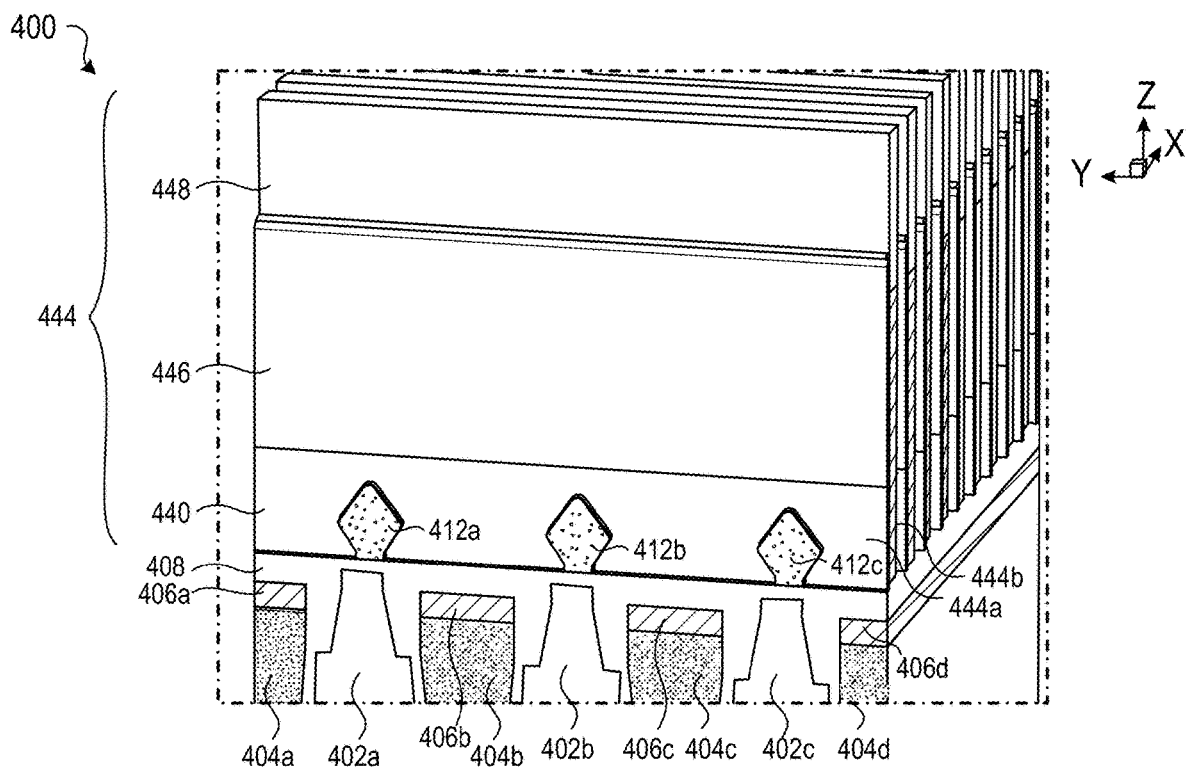

FIG. 6 shows formation of the lower source and drain contacts (or first source/drain structures) 412a-412c through an in-situ doped epitaxy growth process. The first source/drain (S/D) structures 412 of bottom devices are positioned at the bottom of the semiconductor device 400. In an exemplary embodiment of FIG. 6, the bottom devices can be PMOS devices. Thus the first S/D structures 412 are comprised of silicon germanium with in-situ doped boron. The source and drain contact (or first source/drain structures) 412 after formation can be etched in order to fit any desired minimum specification on size to fit within the cell height of the proposed standard cell design. It should be noted that the bottom devices that include the first S/D structures 412 can be either NMOS devices or PMOS devices depends on the circuit designs and factors such as number of connections between PMOS and NMOS to upper metal tracks, thermal considerations for in-situ doping, et cetera.

Still referring to FIG. 6, the first S/D structures 412 of the bottom devices are shown to be positioned at first ends of the first channel structures 442 that are positioned at a first side 444a of the hard mask stack 444. In addition, the first S/D structures of the bottom devices can also be formed at second ends of the first channel structures 442 (not shown) that are positioned at a second side 444b of the hard mask stack 444. Therefore, each of the first channel structures of the bottom devices are arranged between two of the first S/D structures 412 and embedded in the hard mask stack 444.

Figure 7:
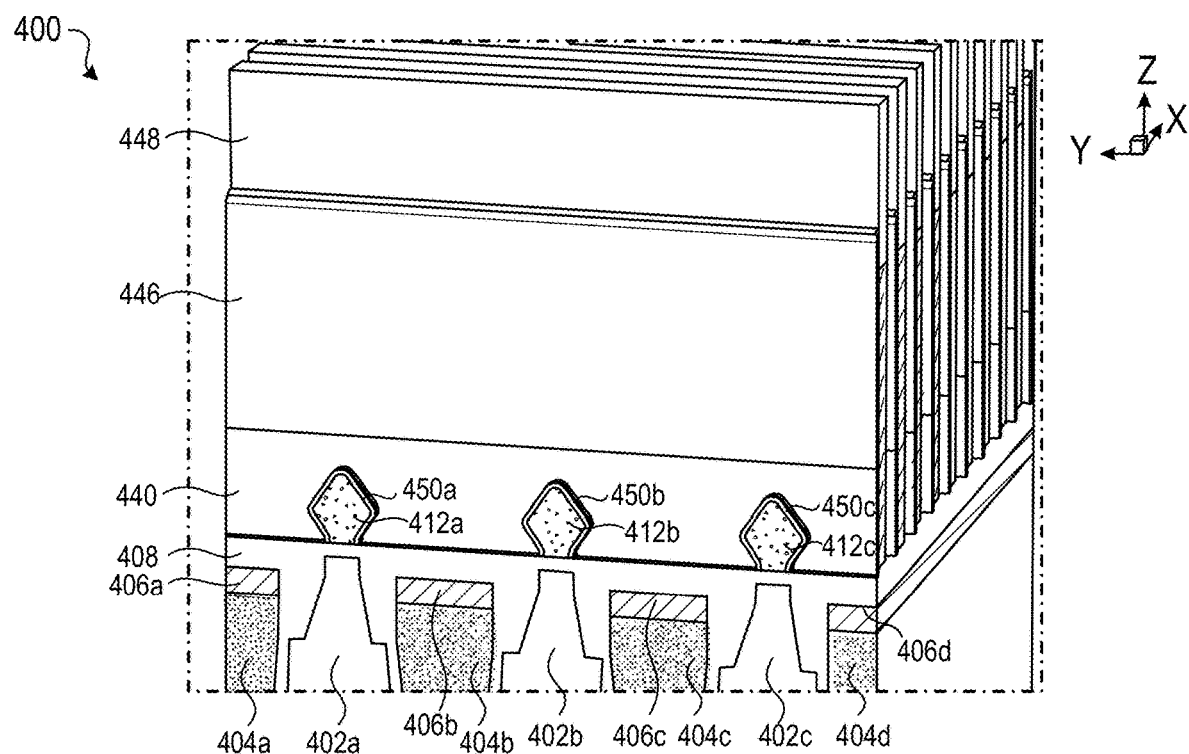

In FIG. 7, a replacement silicide material is either selectively deposited or isotropically deposited around surfaces of the source and drain contact structures (or first S/D structures) 412 for form a plurality of first replacement silicide layers 450 (also referred to as (or first substitute silicide layers)). The first substitute silicide layers 450 can be arranged on surfaces of the first S/D structures 412. The preferred approach herein is selective deposition of the replacement silicide directly over the surfaces of only the source and drain contacts 412.

Figure 8:
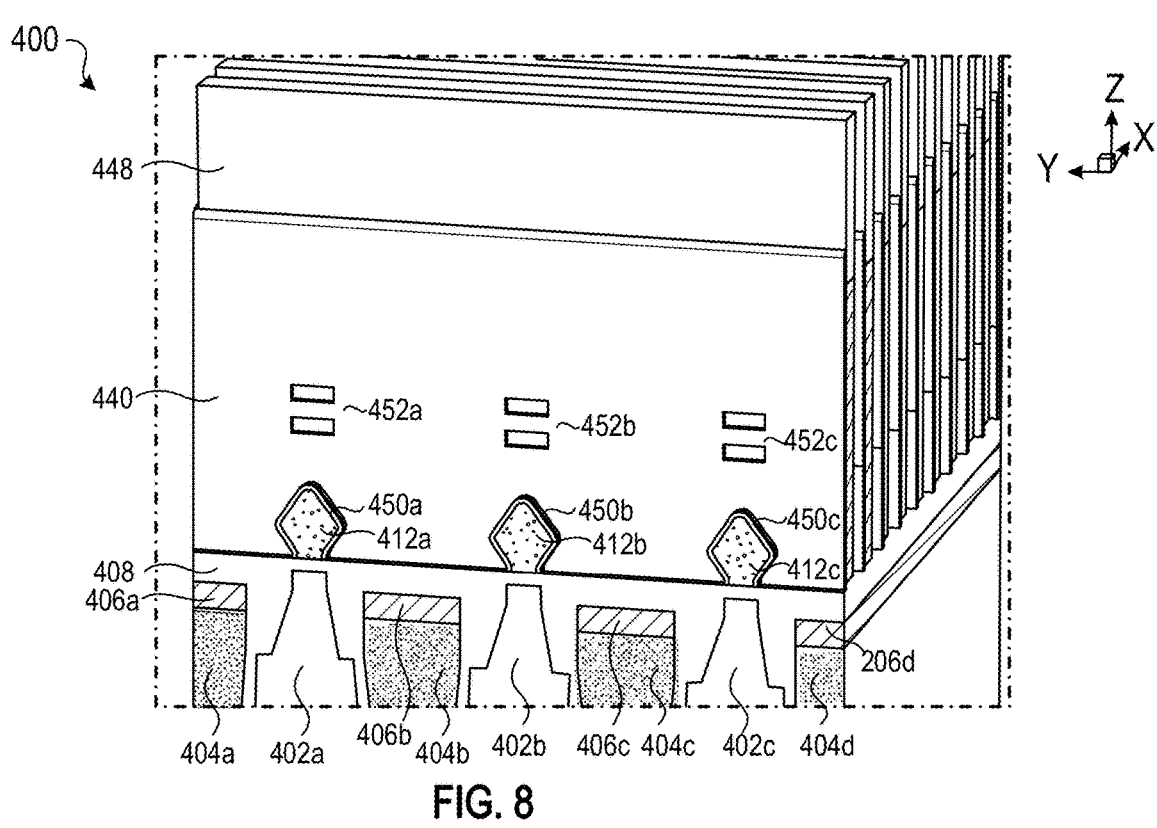

In FIG. 8, the cover spacer 446 is removed from the upper devices (or second devices) to expose silicon nanosheets (or second channel structures) 452a-452c of the upper complementary devices. As shown in FIG. 8, the second channel structures 452 are positioned over the fin structures 402 and the first S/D structures 412. In addition, the second channel structures 452, the fin structures 402, and the first S/D structures 412 are aligned with each other along the z direction. For example, the second channel structure 452a, the first S/D structure 412a and the fin structure 402a are aligned along the z direction. The exposed silicon nanosheets (or second channel structures) 252 at the upper device can be pre-cleaned either through an in-situ high thermal anneal or through an in-situ chemical oxide removal (COR) vapor-phase etch process. The pre-clean process can be done immediately prior to the source and drain epitaxy growth. The exposed nanosheets (or second channel structures) can be isotropically recessed within the low-k gate spacer 440 to reduce the gate extension of the channel.

Figure 9:
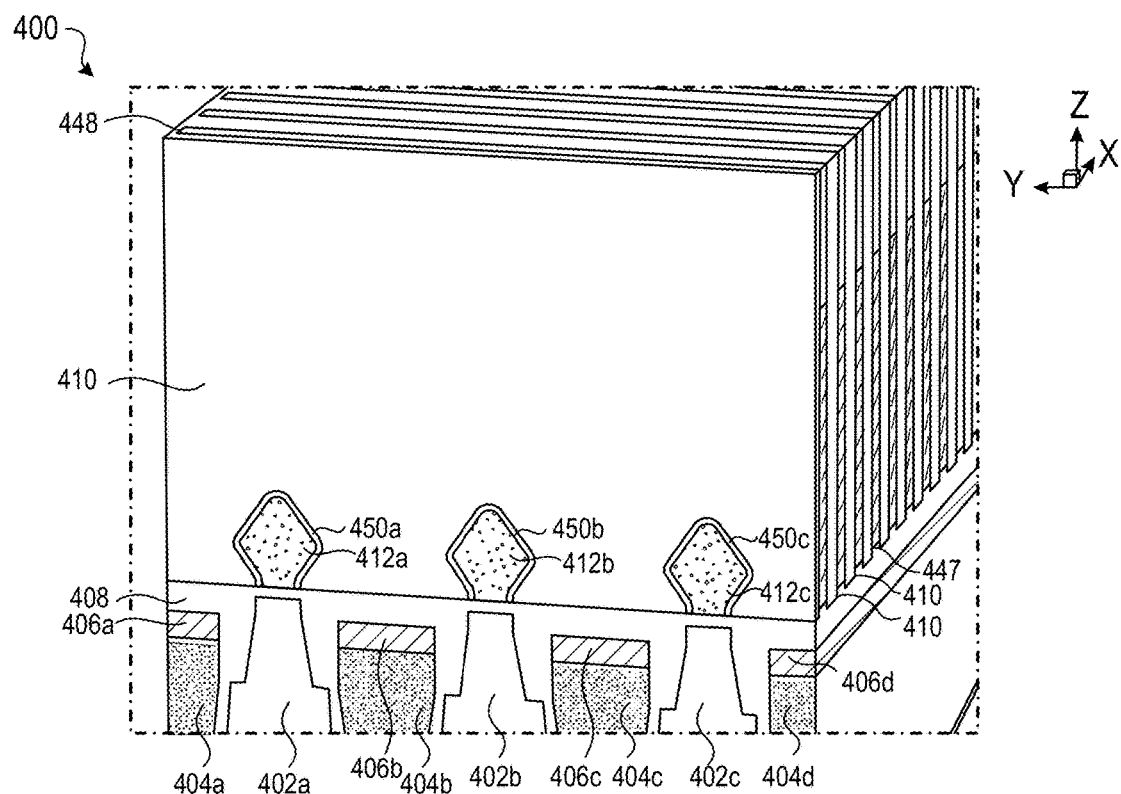

In FIG. 9, a pre-metallization dielectric 410 such as silicon oxide is deposited within the source and drain plane (e.g., the spaces between the hard mask stacks 244). The pre-metallization dielectric 410 can function as a first ILD 410 in which the interconnect trench structures for the bottom devices can be initially formed in subsequent manufacturing steps.

Figure 10:
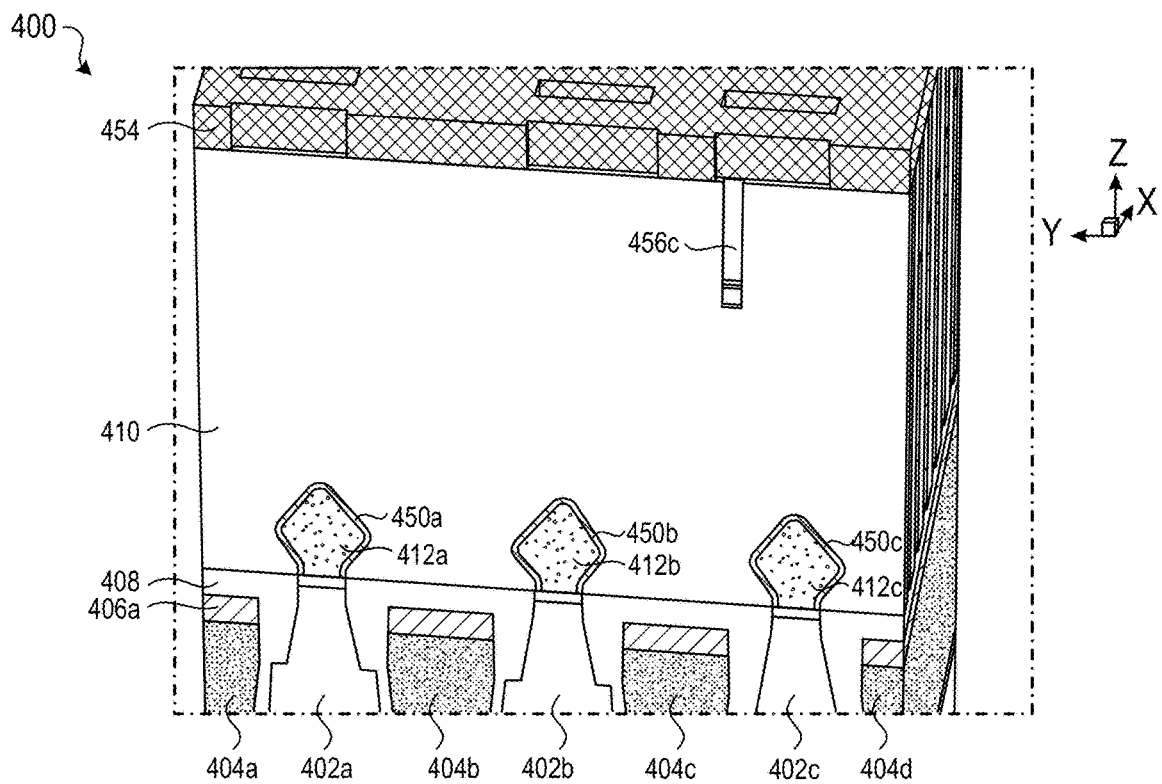

In FIG. 10, a hardmask 454 can be deposited over the pre-metallization dielectric 410 and patterned with the lower local interconnect structure template. The lower local interconnect structure template can eventually be transferred down through the pre-metallization dielectric 410. At least one via-to-rail opening 456c can be patterned and partially transferred down in to the pre-metallization dielectric 410 through an etching process. The via-to-rail opening 456c can form via-to-rail structures in the subsequent manufacturing steps. The via-to-rail structure 456c can connect the bottom interconnects (or first local interconnect structures) to the BPR structure 404c. In an exemplary embodiment of FIG. 10, the via-to-rail opening and interconnect patterning to form the bottom interconnects (or first interconnect structures) can be formed through a dual damascene process. The dual damascene process is similar to a dual damascene process during a BEOL metallization.

Figure 11:
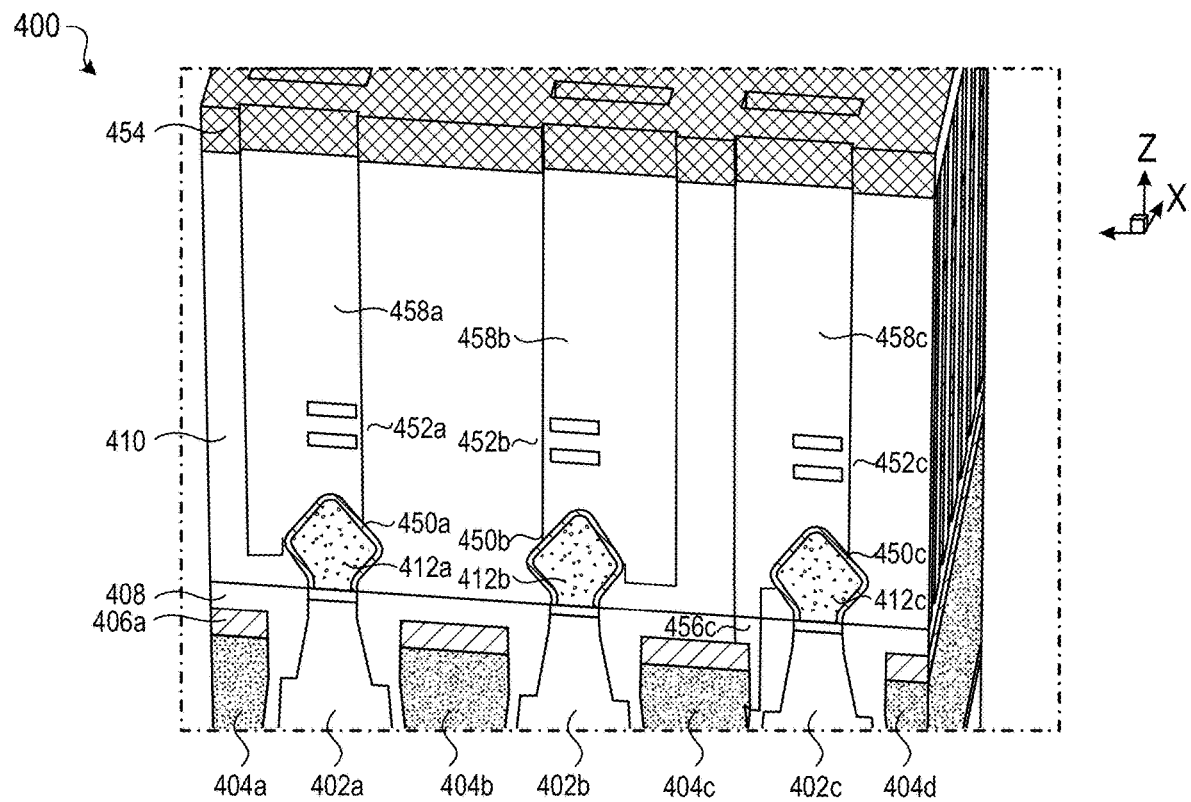

In FIG. 11, a lower device interconnect pattern is transferred down through the pre-metallization dielectric 410 where the first interconnect trenches 458a-458c can be formed within the pre-metallization dielectric 410 to uncover the first S/D structures 412 and the replacement silicide (or the first substitute silicide layers) 450 while the bottom of the via-to-rail opening 456c can be in direct contact with the BPR structure 404c. For example, the first interconnect trench 458c can uncover the first S/D structure 412c and the first substitute silicide layer 450c and can be connected to the BPR structure 404c through the via-to-rail opening 456c.

Figure 12:
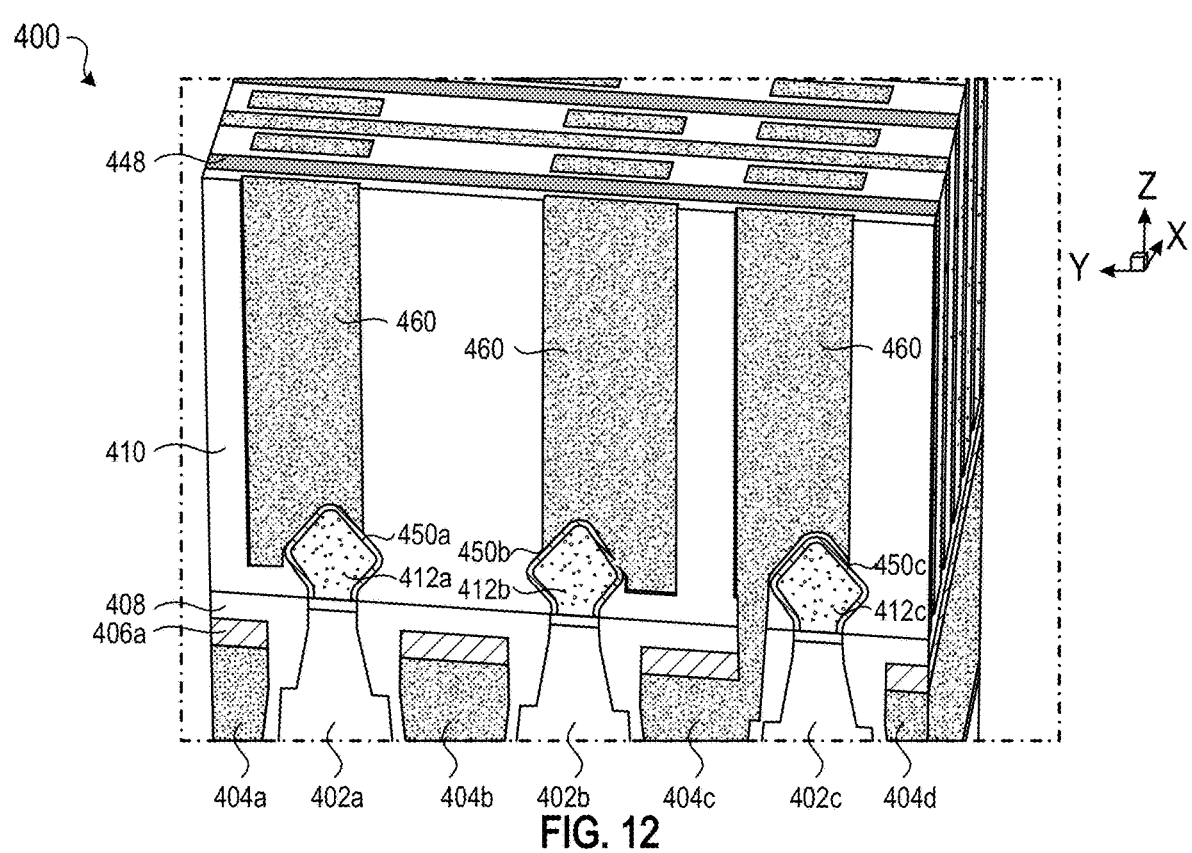

In FIG. 12, the first interconnect trenches 458 and via-to-rail openings 456c are then filled with a first replacement interconnect material 460 (also referred to as first substitute interconnect material), which can be polysilicon or amorphous silicon. The first replacement interconnect material 460 can be conformally filled and CMP planarized by utilizing the cap layers 448 (e.g., silicon nitrides) over the dummy gates as an effective and convenient etch-stop layer (ESL). Alternatively, the first replacement interconnect material 460 can be conformally "super-filled" in which the overburden of the film is of adequate uniformity to allow an isotropic etch-back recess to be done, or the material can be bottom-filled with unique capabilities available from Tokyo Electron tools.

Figure 13:
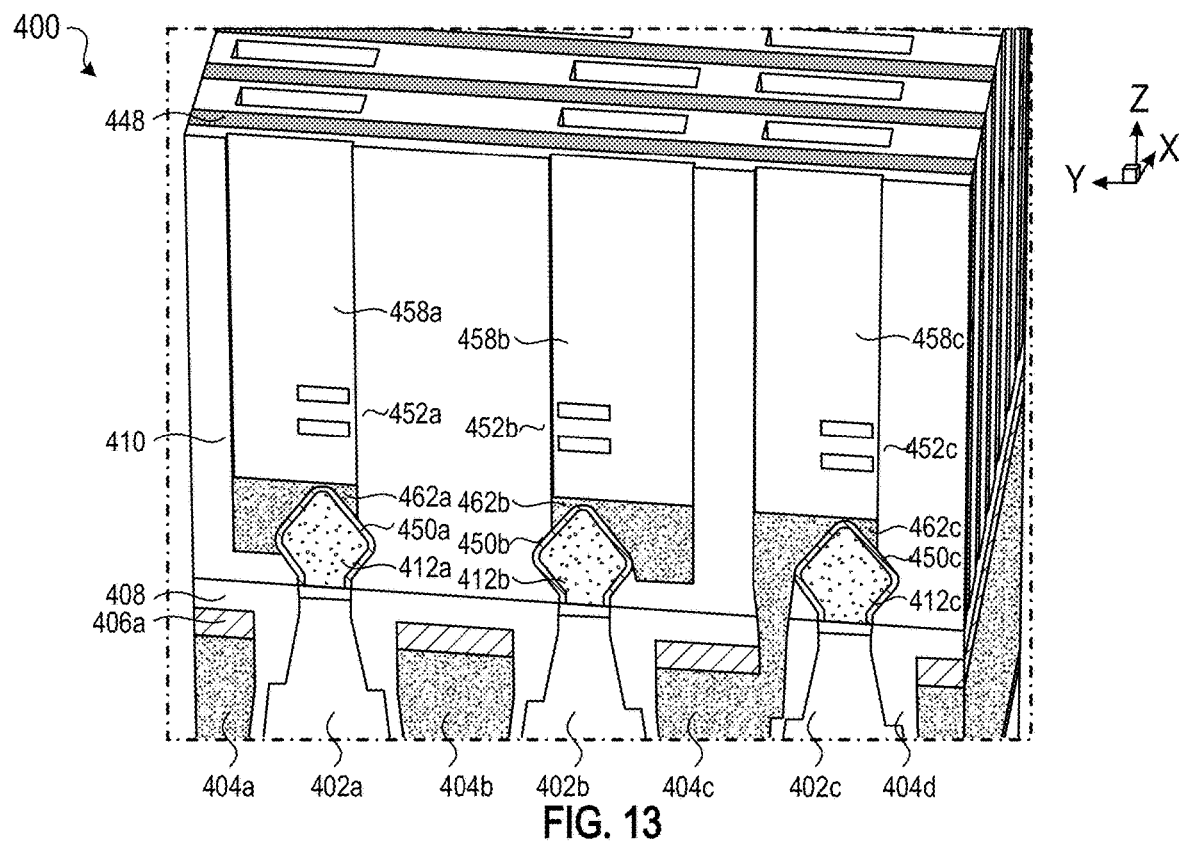

In FIG. 13, the first replacement interconnect material 460 can then be isotropically etch-recessed back to form a plurality of first replacement interconnect structures 462a-462c (also referred to as first substitute interconnect structures) with a desired height. Accordingly, the first interconnect trenches 458a-458c can be uncovered. As shown, the first substitute interconnect structure 462a is positioned over the first substitute silicide layer 450a and the first S/D structure 412a. The first substitute interconnect structure 462b is positioned over the first substitute silicide layer 450b and the first S/D structure 412b. The first substitute interconnect structure 462c is positioned over the first substitute silicide layer 450c and the first S/D structure 412c and further connected to the power rail 404c. In the exemplary case of polysilicon or amorphous silicon, multiple etch hardware and chemistries can be used for this process with excellent selectivity to the pre-metallization dielectric 410, the low-k gate spacer 440, and the intended replacement silicide material 450.

Figure 14:
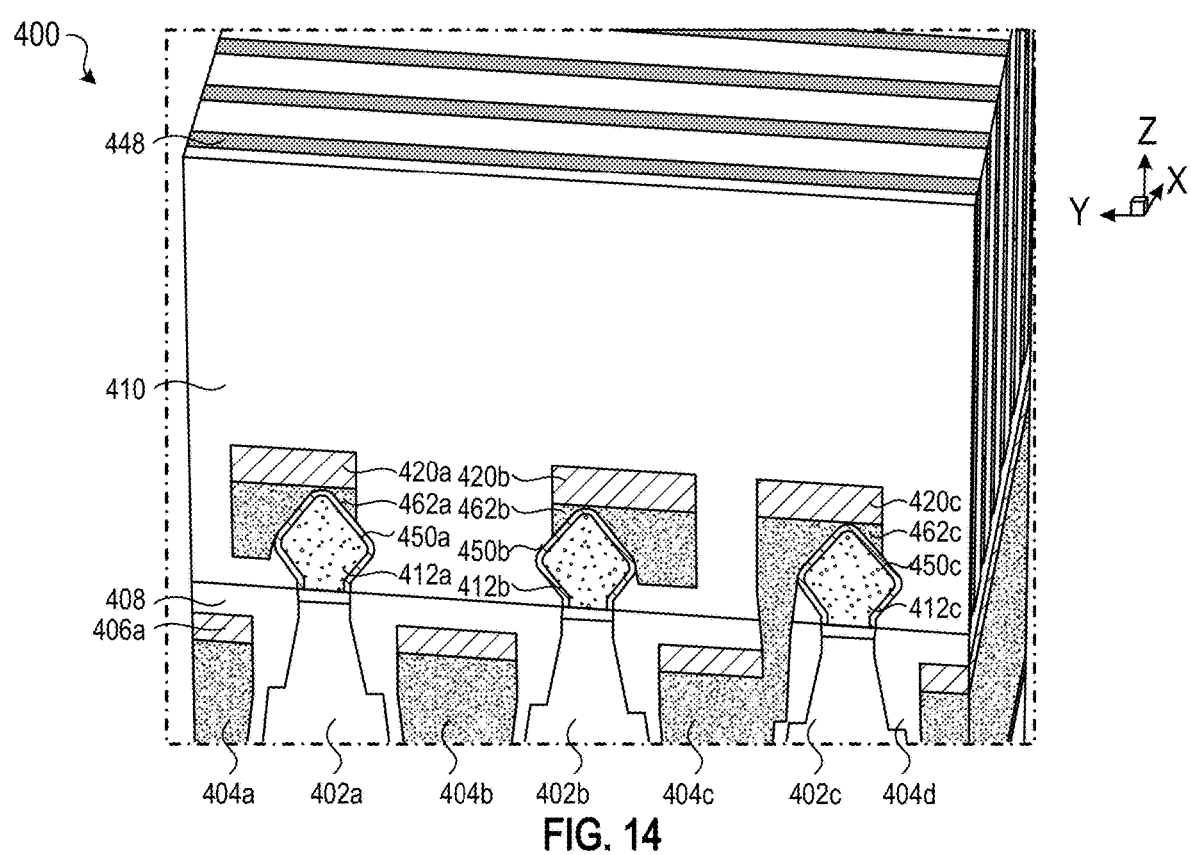

In FIG. 14, a plurality of second dielectric caps 420a-420c are formed over the top surfaces of the replacement interconnect structures (or first substitute interconnect structures) 462a-462c. For example, the second dielectric caps 420a, 420b, and 420c are positioned over the top surfaces of the first substitute interconnect structures 462a, 462b, and 462c, respectively. The second dielectric caps 220a-220c can be used for multiple purposes, including preserving a fixed minimum dielectric separation between upper and lower devices through any self-aligned formation processes of the interconnect structures, to provide a "ceiling" for the replacement interconnect structures when the replacement material is removed and replaced with a high conductive metal. The pre-metallization dielectric 410 can then be used to fill the first interconnect trenches 458a-458c and then CMP-planarized to provide a planar surface by using the cap layers 448 (e.g., silicon nitrides) over the dummy gate as a CMP-stop layer.

Figure 15:
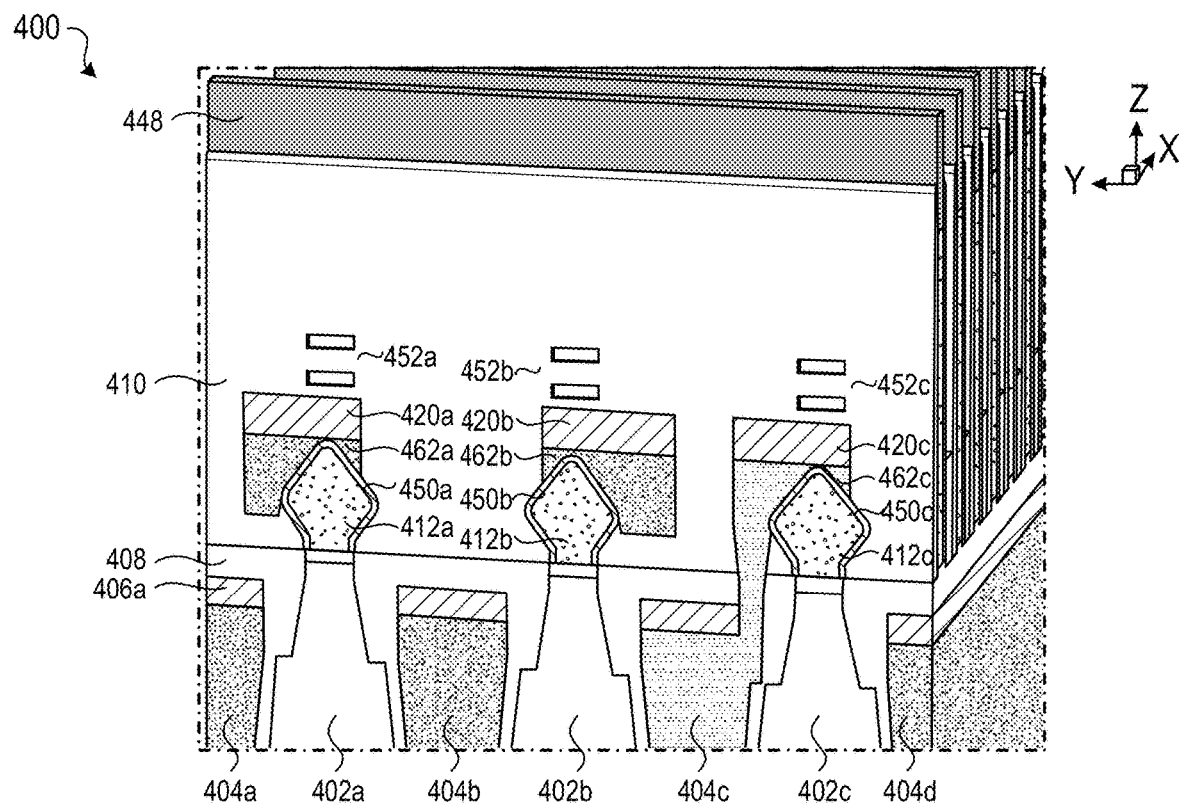

In FIG. 15, the pre-metallization dielectric 410 is then isotropically etched and recessed down to uncover the second channel structures 452 of the upper device. It should be noted that the low-k gate spacer 440 is also uncovered when the pre-metallization dielectric 410 is recessed. The second dielectric caps 420 over the top surfaces of the bottom replacement interconnect structures (or the first substitute interconnect structures) 462 can be used as an etching endpoint for recessing the pre-metallization dielectric 410.

Figure 16:
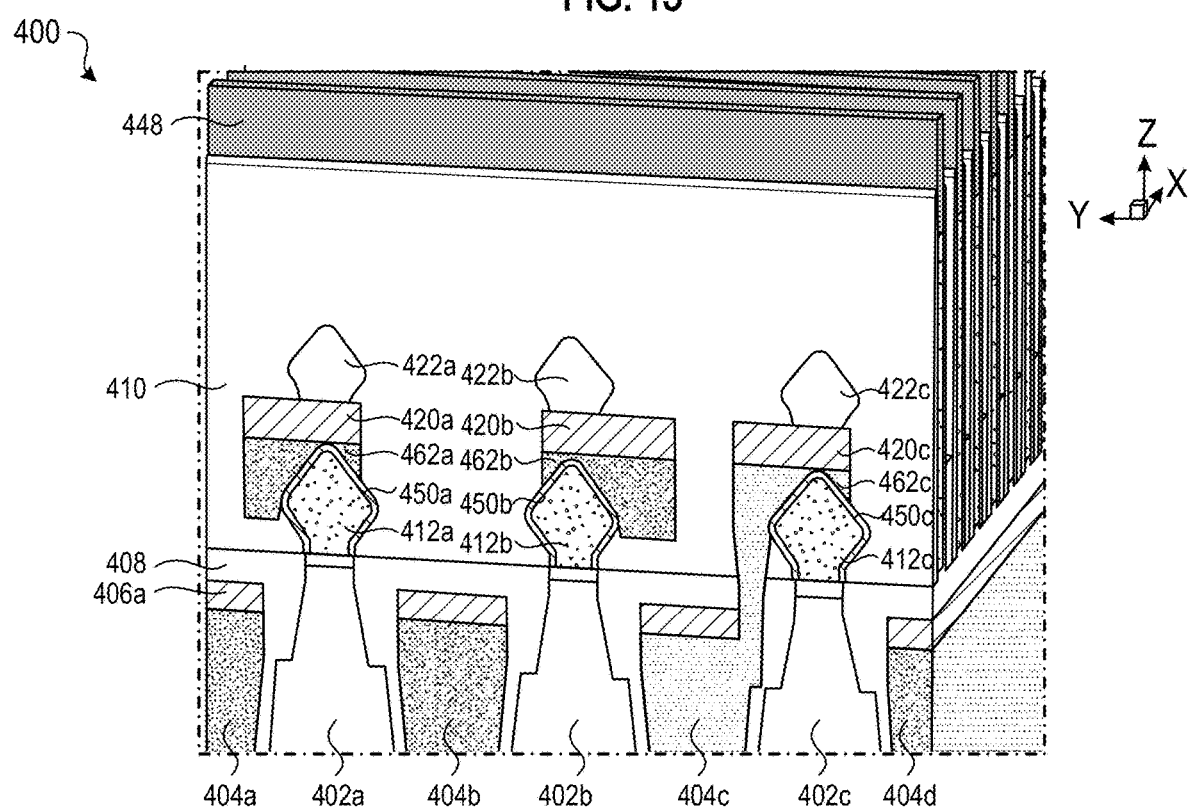

FIG. 16 shows formation of the upper source and drain contacts (or second S/D structures) 422a-422c through an in-situ doped epitaxy growth process. In an exemplary embodiment, the upper (or second) devices are NMOS devices while the bottom (or first) devices are PMOS. Accordingly, the second S/D structures 422 are made of silicon with in-situ doped phosphorous while the first S/D structures 412 are made of silicon with in-situ doped boron. Alternatively, the upper (or second) devices can be PMOS devices while the bottom (or first) devices can be PMOS. The source and drain contacts (or second S/D structures) 422a-422c after formation can be etched in order to fit any desired minimum specification on size to fit within the cell height of the proposed standard cell design.

Figure 17:
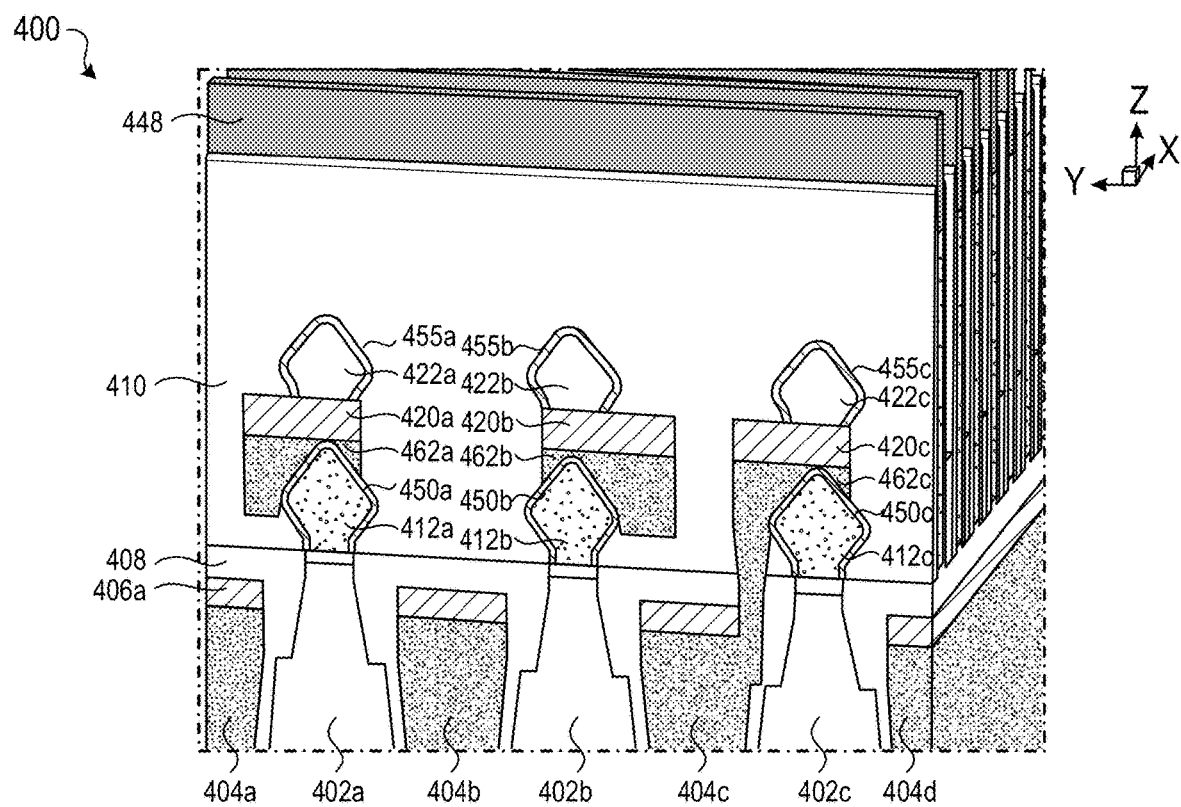

In FIG. 17, a second replacement silicide material is either selectively deposited or isotropically deposited around the surfaces of the second S/D structures 422 to form a plurality of second substitute silicide layers 455. Deposition of the second replacement silicide material can be accomplished by a selective deposition process to form the second substitute silicide layers 455 on the surfaces of the second S/D structures 422.

Figure 18:
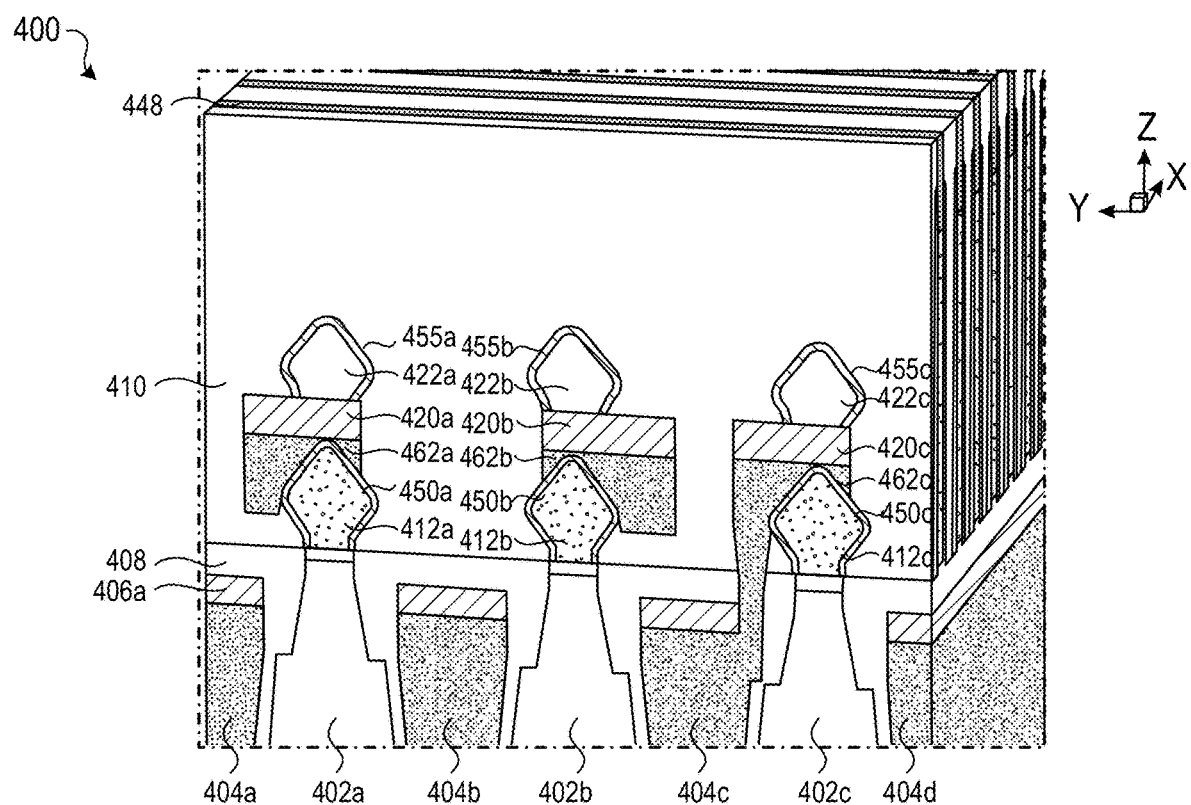

In FIG. 18, the pre-metallization dielectric 410 is deposited again within the source and drain plane (e.g., the spaces between the hard mask stacks 444). The pre-metallization dielectric 410 can function as the first ILD 410 in which the interconnect trench structures for the upper devices can be initially formed in subsequent manufacturing steps.

Figure 19:
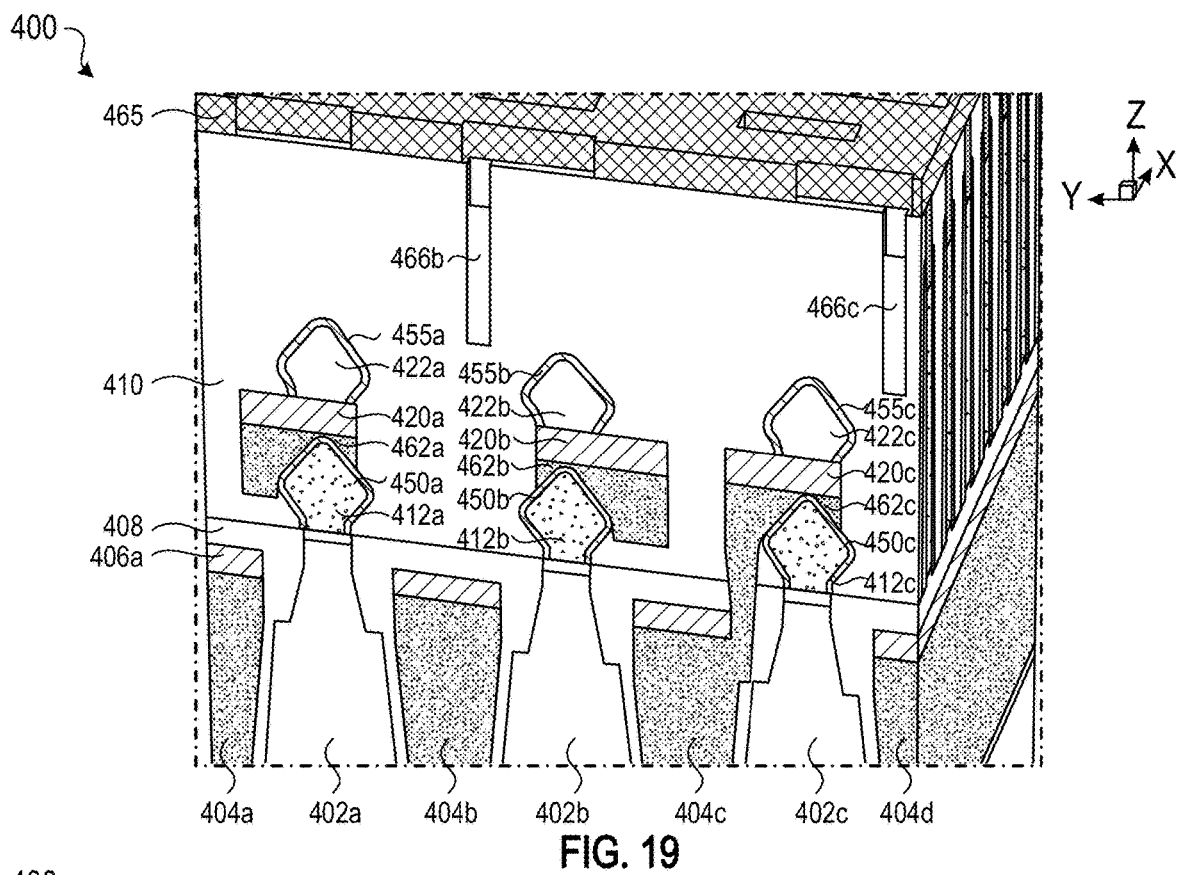

In FIG. 19, a hardmask 465 can be deposited over the pre-metallization dielectric 410 and patterned with the upper local interconnect structure template that can eventually be transferred down through the pre-metallization dielectric 410. Particularly, via-to-rail openings 466 (e.g., 466b and 466c) can be patterned and partially transferred down in to the pre-metallization dielectric 410 through an etching process. The via-to-rail openings 466 can form via-to-rail structures in the subsequent manufacturing steps. The via-to-rail structures can connect the upper interconnects (or second local interconnect structures) to the PBR structures 404. In an exemplary embodiment of FIG. 19, the via-to-rail opening and interconnect patterning to form the upper interconnects can be formed through a dual damascene process. The dual damascene process is similar to a dual damascene process during a BEOL metallization.

Figure 20:
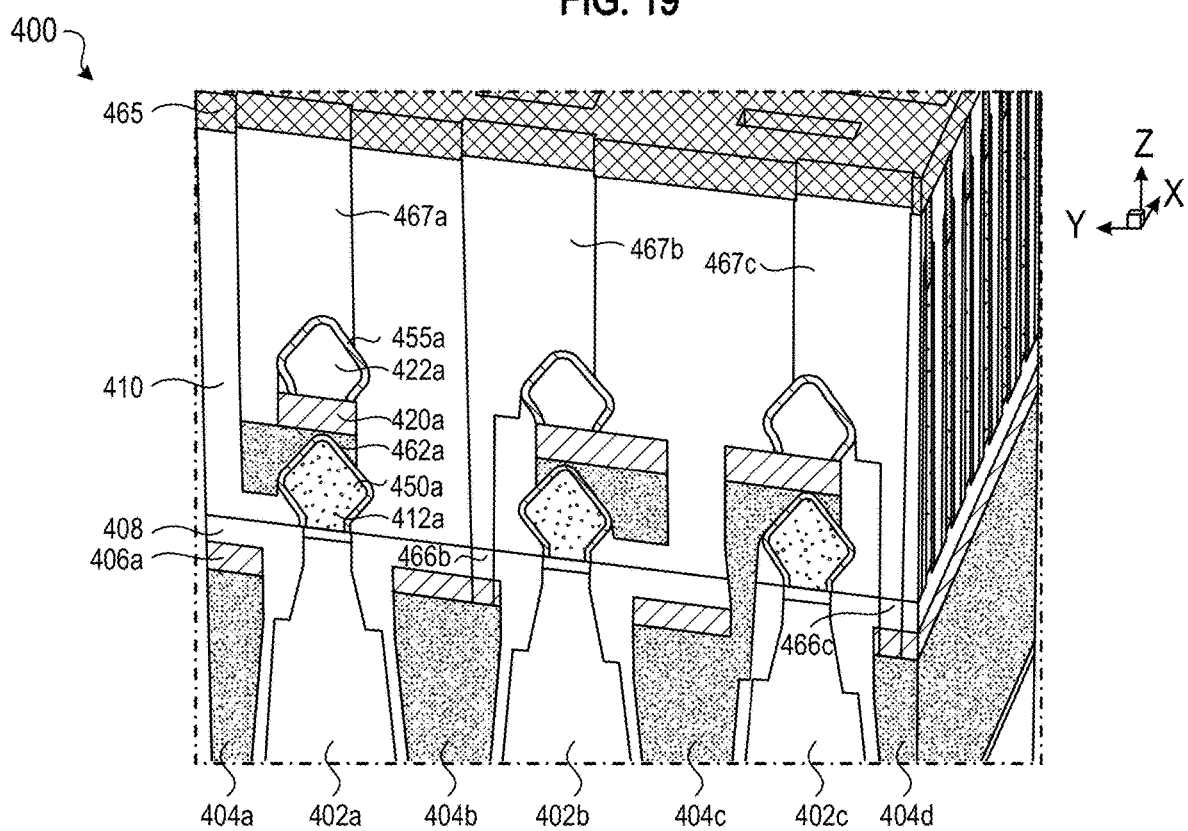

In FIG. 20, an upper device interconnect pattern is transferred down through the pre-metallization dielectric 410 where the second interconnect trenches 467a-467c can be formed within the pre-metallization dielectric 410 to uncover the second S/D structures 422 and the second replacement silicide (or the second substitute silicide layers) 455 while the bottom of the via-to-rail opening 466 can be in direct contact with the respective BPR structures 404. For example, the second interconnect trench 467b can uncover the second S/D structure 422b and the second substitute silicide layer 455b, and can be connected to the PBR structure 404b through the bottom of the via-to-rail opening 466b.

In some embodiments, one or more upper (or second) interconnect structures can be merged with corresponding lower (or first) interconnect structures to function as an output terminal of an inverter. Accordingly, an interconnect trench to form the upper interconnect structure of the upper device can be connected to a corresponding lower replacement interconnect structure (or first substitute interconnect structure) of the lower interconnect structure. For example, the second interconnect trench 467a can be connected to the first substitute interconnect structure 462a. Accordingly, the second dielectric cap 420a covering the lower replacement interconnect (e.g., the first substitute interconnect structure) 462a are opened in order to form a merged NMOS/PMOS interconnect structure. Additionally, the replacement silicide (e.g., the second substitute silicide layers) 455 can be used to protect the source and drain epitaxy (e.g., the second S/D structures) 422 from any damage during the etch considering that etch chemistries used for anisotropic etching of the first dielectric caps and the second dielectric caps are common to what is commonly used for etching silicon.

Figure 21:
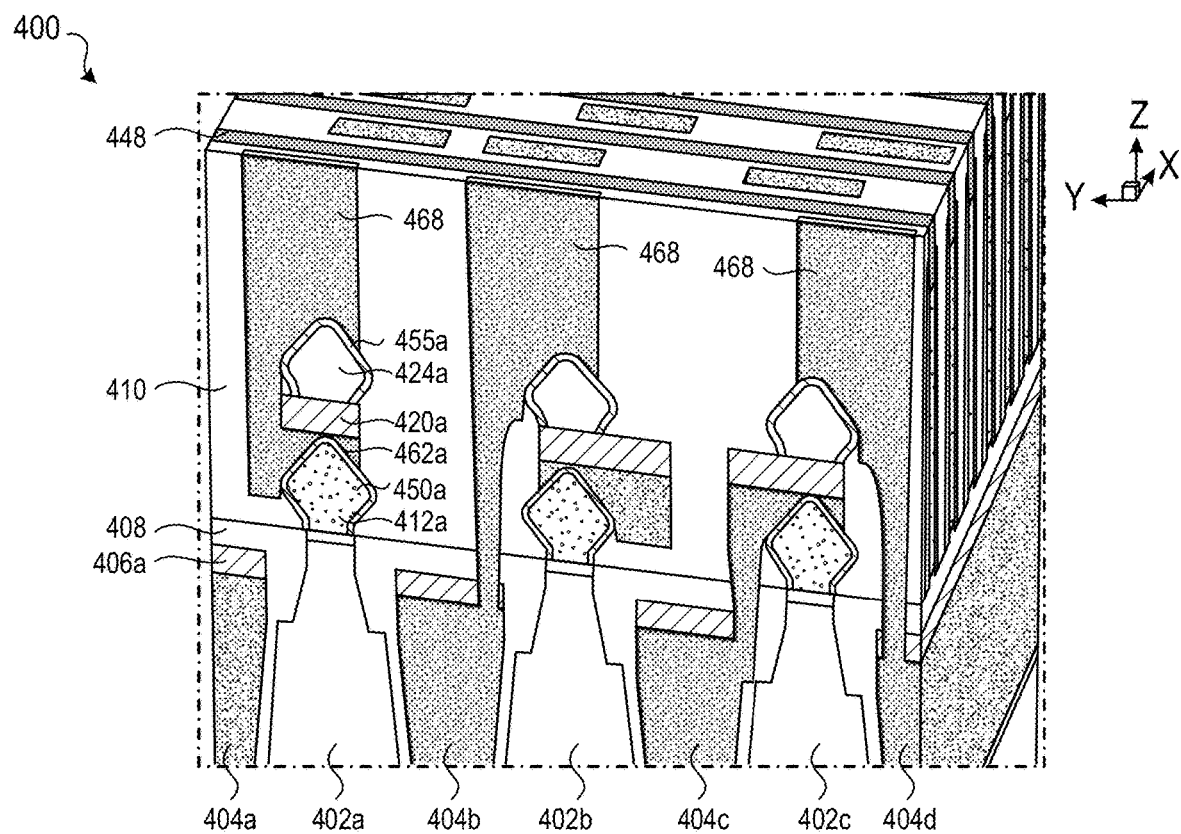

In FIG. 21, the second interconnect trenches 467 and via-to-rail opening 466 are filled with a second replacement interconnect material 468 (also referred to as second substitute interconnect material), which can be polysilicon or amorphous silicon. The second replacement interconnect material 468 can be conformally filled and CMP-planarized by utilizing the cap layers 448 (e.g., silicon nitrides) over the dummy gate as an effective etch-stop layer (ESL), or the material can be conformally "super-filled" in which the overburden of the film is of adequate uniformity to allow an isotropic etch-back recess to be done, or the material can be bottom-filled with CVD tools from Tokyo Electron.

Figure 22:
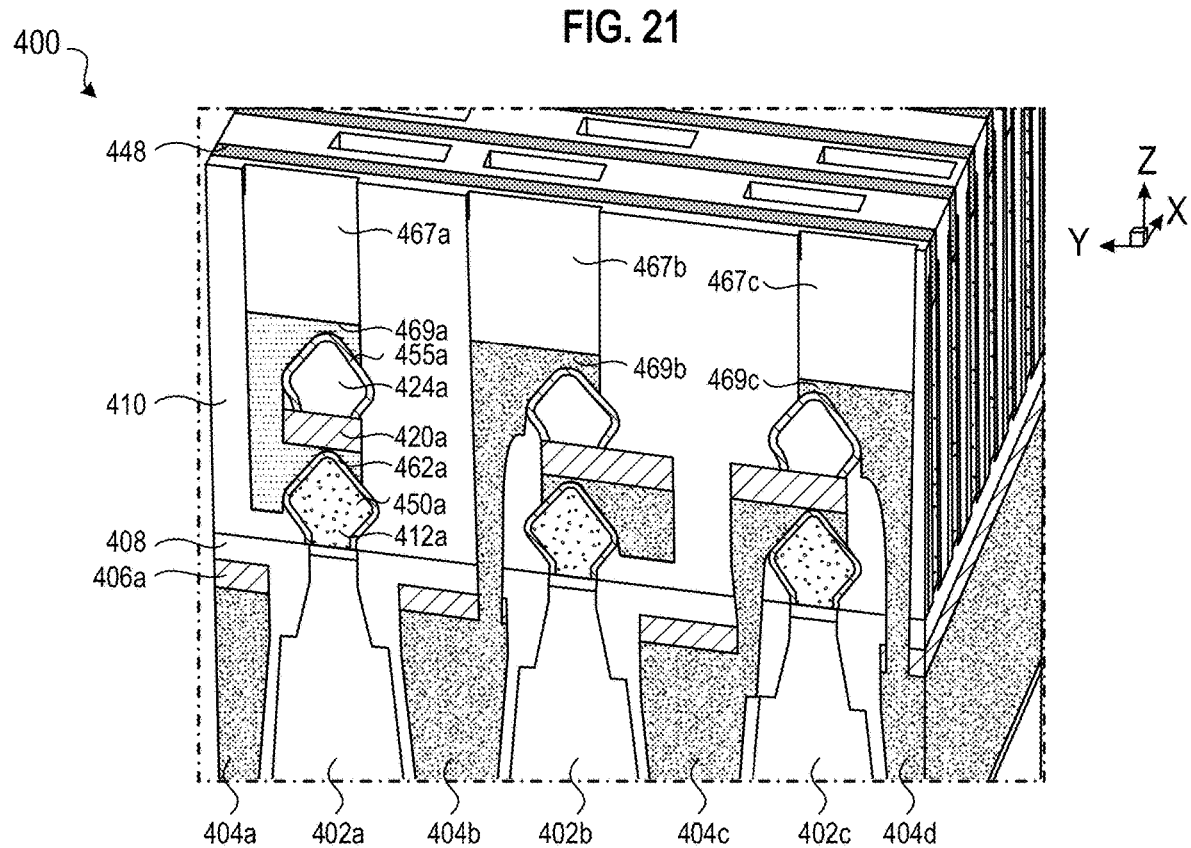

In FIG. 22, the second replacement interconnect material 468 is then isotropically etched and recessed back to form a plurality of second replacement interconnect structures 469a-469c (also referred to as second substitute interconnect structures) with a desired height. When the second replacement interconnect material 468 is recessed, the second interconnect trenches 467a-467c are uncovered accordingly. In an embodiment where the second replacement interconnect material 468 is polysilicon or amorphous silicon, multiple etch hardware and chemistries can be used for this process with excellent selectivity to the pre-metallization dielectric 410, the low-k gate spacer 440, and the intended replacement silicide material (e.g., 450 or 455).

Figure 23:
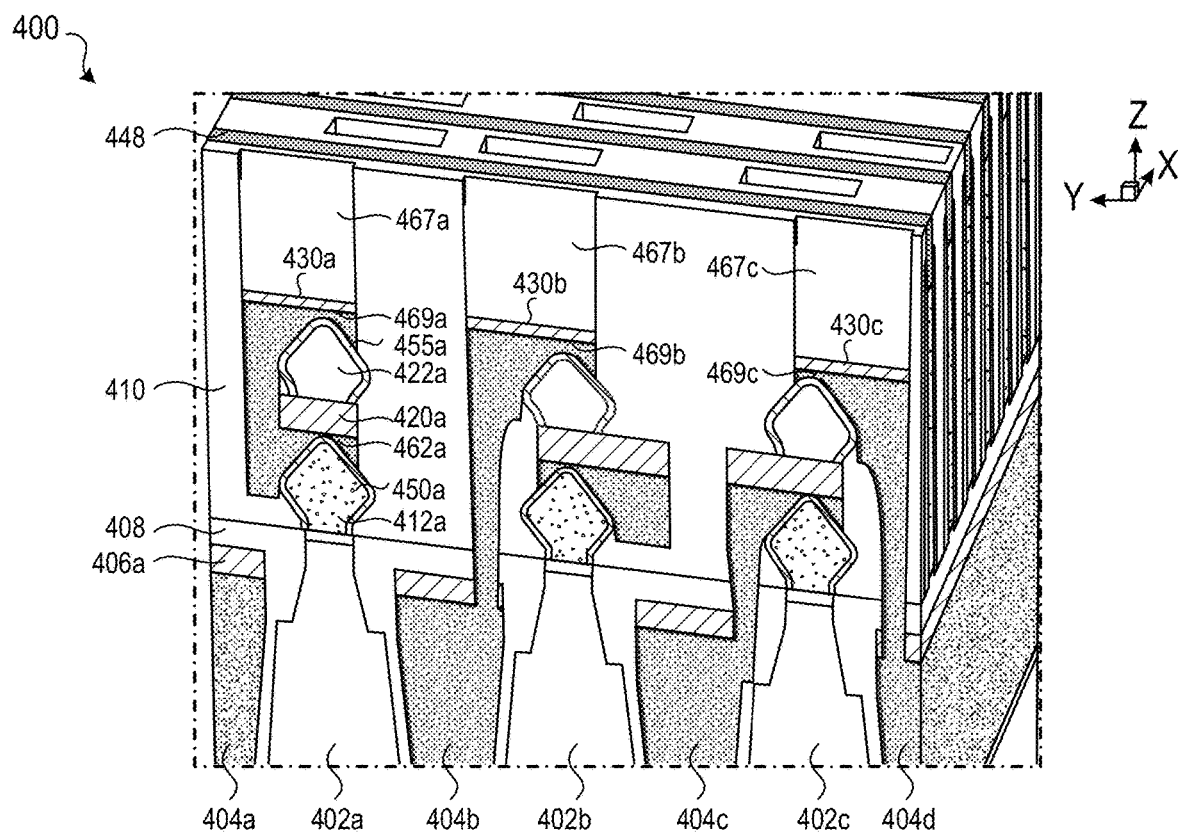

In FIG. 23, a plurality of third dielectric caps 430a-430c are formed over the top surfaces of the second replacement interconnect structures 469a-469c. It should be noted that the second substitute interconnect structure 469a is merged with the first substitute interconnect structure 462a to function as an output terminal of an inverter.

Figure 24:
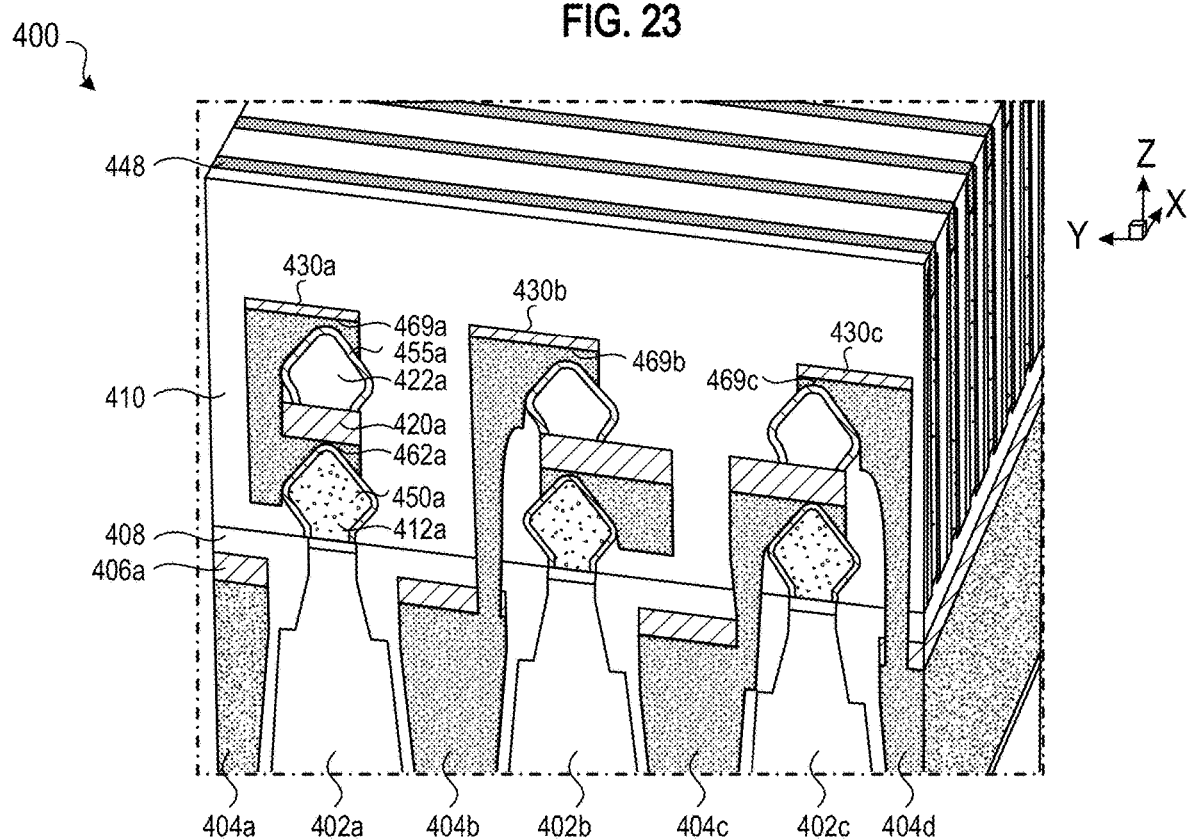

In FIG. 24, the pre-metallization dielectric 410, such as silicon oxide, is deposited within the source and drain plane (e.g. yz plane) to fill in the second interconnect trenches 467. Final interconnect structures for the bottom and upper devices can be eventually formed within the pre-metallization dielectric 410 in subsequent manufacturing steps.

Figure 25:
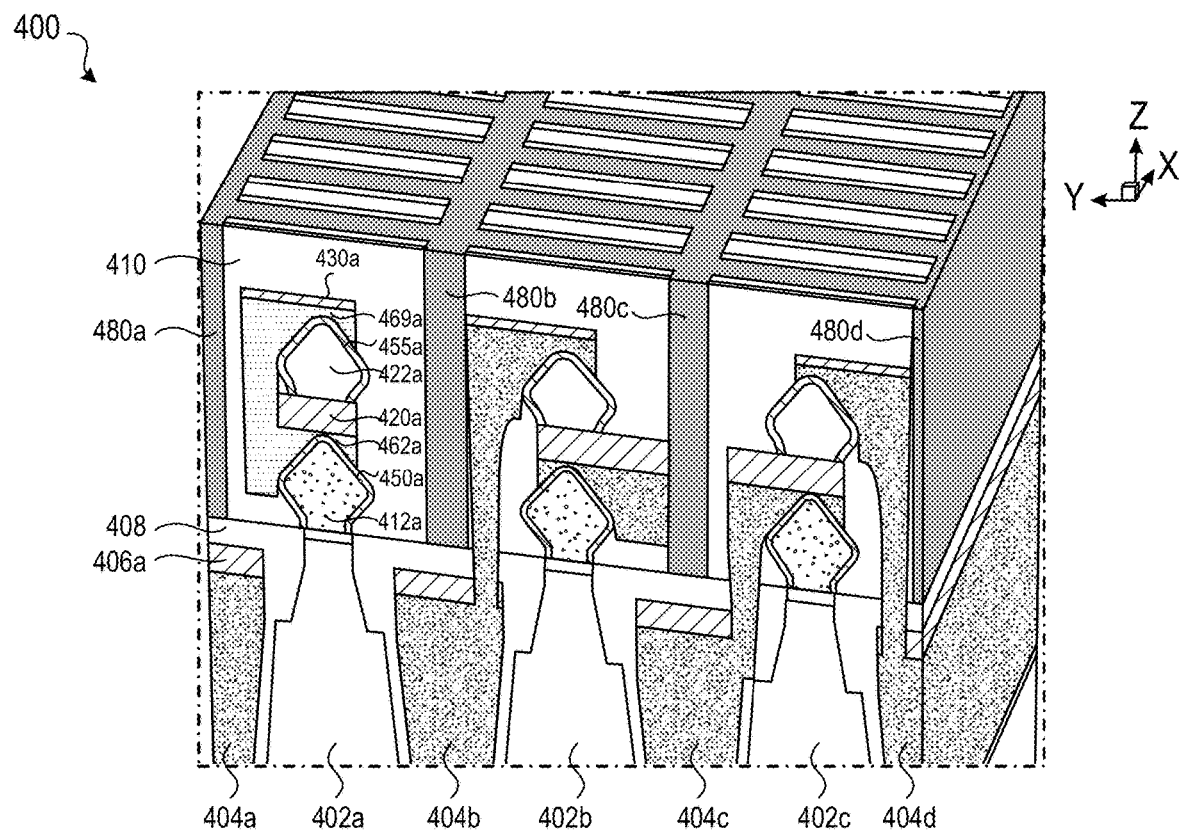

In FIG. 25, the dummy gates can be replaced with metal gates (not shown) and a plurality of separation structures 480a-480d can be disposed in the first ILD 410. The separation structures 480 can be positioned over the insulating layer 408 and extend along the x direction. The separation structures 480 can be configured to separate the first S/D structures 412 and the second S/D structures 422 into a plurality of pairs. For example, the first S/D structure 412a and the second S/D structure 422a can be positioned between the separation structures 480a and 480b. The first S/D structure 412b and the second S/D structure 422b can be positioned between the separation structures 480b and 480c.

In some embodiments, the formation of the metal gate can include one or more high temperature thermal processes applied to the semiconductor device 400. The formation of the metal gate can include opening the dummy gate structure, pulling the polysilicon or amorphous silicon, removing the protective thermal or chemical oxide liner protecting the channel material, deposition or formation of an interface layer such as a thermal oxide or chemical oxide over the intended channel material(s), deposition of a high-k dielectric film such as HfO or varieties of HfO coupled with dipole forming layers such as LaO and AlO over the interface layer material that covers the channel material(s), capping the high-k dielectric with a conductive barrier material such as TiN, performing a high-k reliability or drive anneal to reduce the formation of charge traps (such reliability anneals are typically done within a range of 700° C. to 750° C.), performing laser spike anneal (LSA) in order to activate the dopants within the source and drain area (such anneals are done within a range of 800° C. to 1250° C. with durations ranging from sub-millisecond to full second), continuation of the replacement metal gate (RMG) process in which NMOS and PMOS work function metals are deposited, etched-tuned to set various threshold voltages, and then filled with a high conductance metal.

Figure 26:
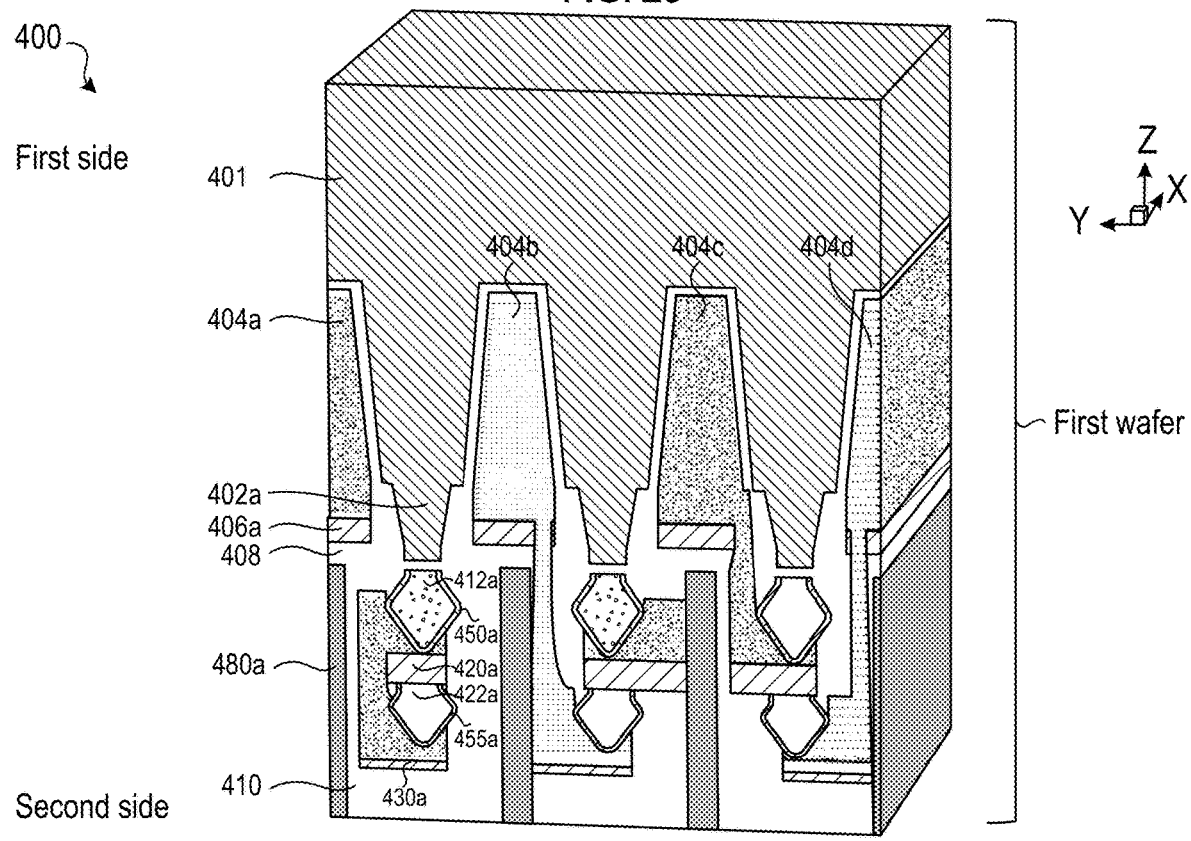

In FIG. 26, a second wafer (not shown) is bonded to the first wafer from the second side of the first wafer. The second wafer can function as a carrier wafer while the first wafer can be a donor wafer. The device 400 is then flipped over so that the first side of the first wafer is exposed. As shown, the bulk layer 401 can be the substrate of the first wafer or a bulk silicon layer. Note that the insulating layer 408 and the pre-metallization dielectric 410 are both made of silicon oxide in the example of FIG. 26. In other embodiments, the insulating layer 408 and the pre-metallization dielectric 410 can be made of different materials.

Figure 27:
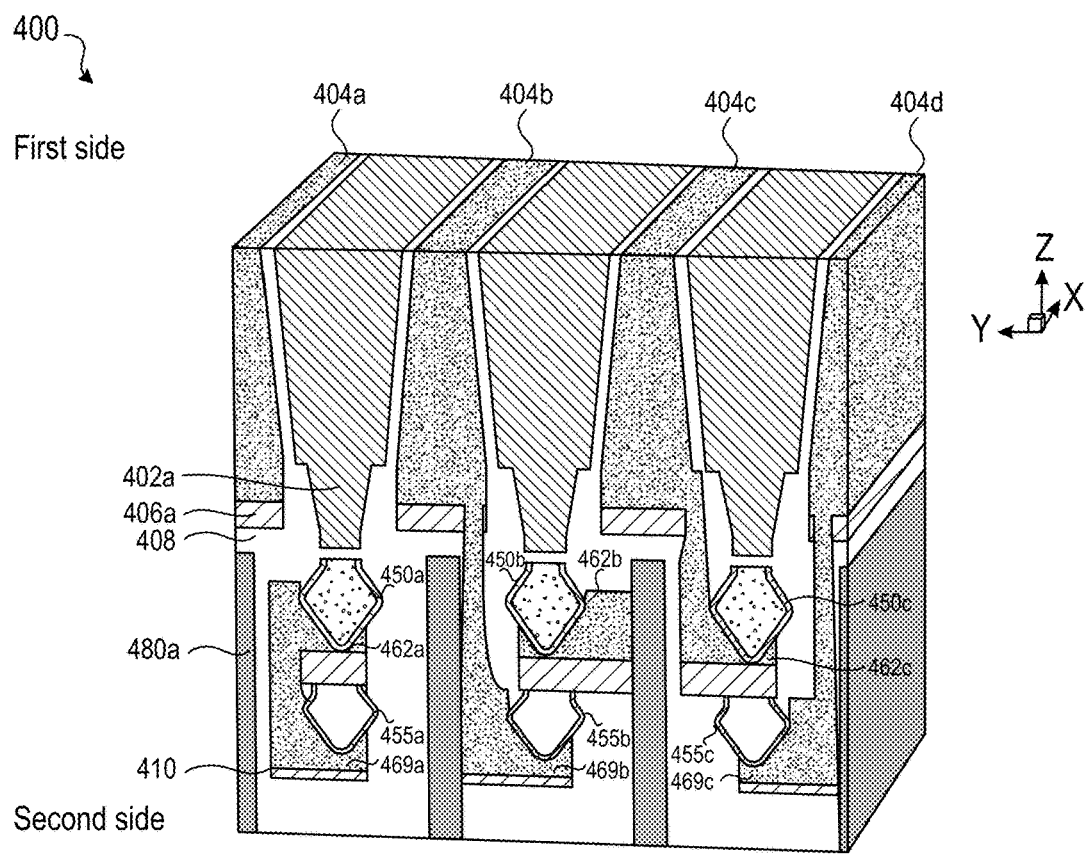

In FIG. 27, the bulk layer 401 from the donor wafer (the first wafer) is then grinded or etched away to either some type of embedded etch stop layer (not shown) such as epitaxy silicon germanium or until some other point of etch process end detection can be registered. As a result, the BPR structures 404 are exposed from the first side.

Figure 28:
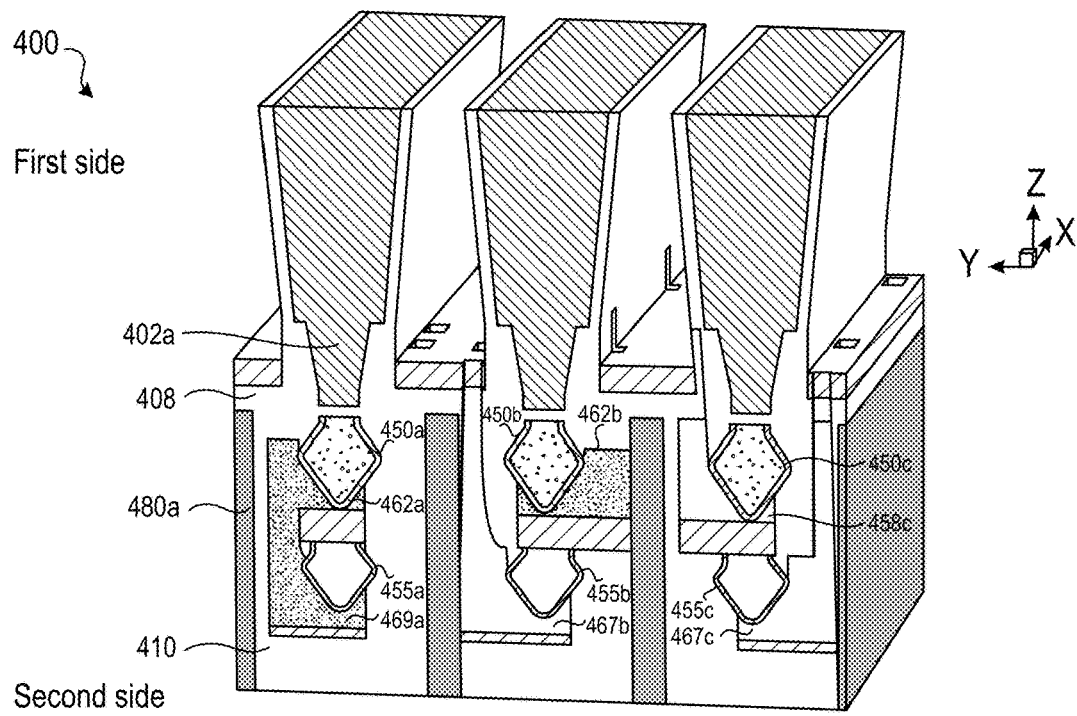

In FIG. 28, the PBR replacement material filled within the PBR structures 404, vias connecting the PBR structures 404 to the local replacement interconnect structures, and the local replacement interconnect structures tapping the PBR structures 404 can be removed through wet etch or dry etch to leave empty cavities within these structures. The presence of the replacement silicide material (e.g., the first and second substitute silicide layers 450 and 455) prevents the etching or any damage to the source and drain contacts (412 and 422) during the removal of the replacement interconnect materials. Consequently, a first group of the first replacement interconnect structures (e.g., 462c) and a first group of the second replacement interconnect structures (e.g., 469b and 469c) can be removed. For example, the second replacement interconnect structure 469b is removed so that the second interconnect trench 467b is uncovered. It is important to note that the interconnect structures (e.g., 462a, 462b, and 469a) which will be connected to the BEOL metal lines will not be impacted by this processing and will be handled during M0 layer processing.

Figure 29:
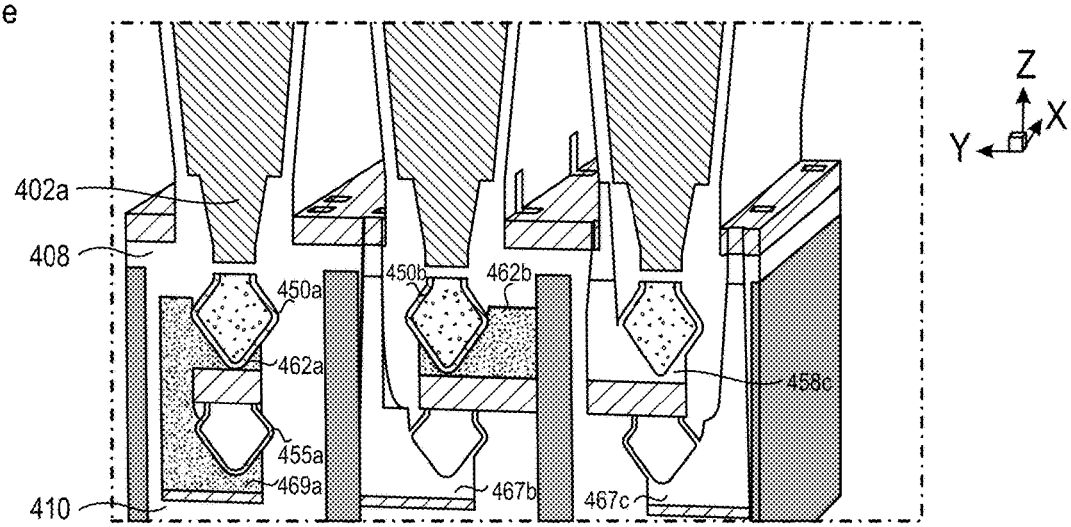

In FIG. 29, once the replacement interconnect material is removed from the actual interconnect structures (e.g., 469b, 496c, and 462c), the etch chemistry can then be changed in order to selectively and isotropically remove the replacement silicide material (e.g., 450c, 455b, and 455c) selective to the other dielectric materials present within the structures (these materials would include pre-metallization dielectric 410 such as silicon oxide, capping materials 420 and 430 such aluminum oxide which would exist as the ceiling of the interconnect structures, low-k gate spacer 440 such as SiOC). For example, a first group of the first replacement silicide layers (e.g., 450c) and a first group of the second replacement silicide layers (e.g., 455b and 455c) are removed as shown.

Figure 30:
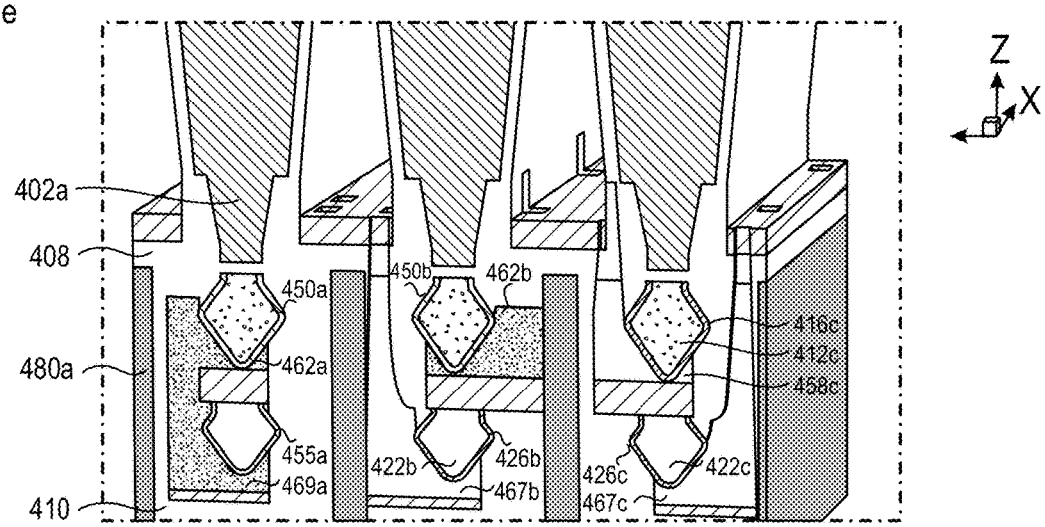

In FIG. 30, a silicon pre-clean be done on the surface of the source and drain (412c, 422b, and 422c) epitaxy using a low-temperature COR (chemical oxide removal) etch process produced by Tokyo Electron. Alternatively, the etching of the replacement silicide can be done in-situ with the deposition and formation of the actual silicide material. As a result, a first silicide layer 416c and second silicide layers 426b-426c are formed. It is understood that in this example, a common silicide is used for both upper and lower devices. In some embodiments, different silicides may be used for upper and lower devices.

Figure 31:
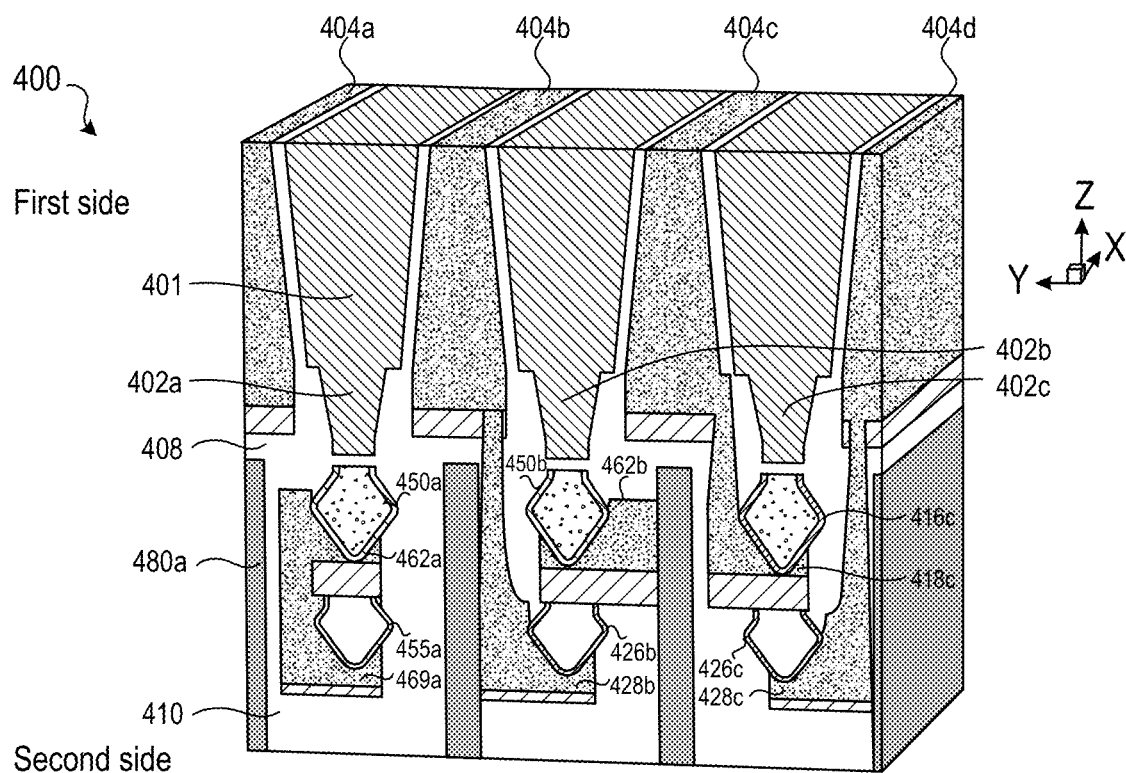

In FIG. 31, common metallization process can be done to fill the interconnect structures (e.g., the second interconnect trenches 467b-467c and the first interconnect trench 458c), the vias connecting the interconnect structures to the BPR structures 404, and the BPR structures 404. Given the large relative large dimensions of the BPR structures 404, a dual metallization approach can be used where a high thin-wire conductance metal such as ruthenium or cobalt can fill the smaller structures such as the interconnect (e.g., 467b-467c and 458c) and via structures while the power rail (e.g., 404) will be conformally filled along its edges which leaves significant volume open for better conductive metals to fill in the larger structure such as copper or other metals. This may pose some cost benefit to CFET devices in that both device interconnect structures can be metallized at the end as opposed to separately one device interconnect at a time where some type of lower conductive liner or barrier would naturally be used to separate the buried rail from the via connecting the buried rail to the interconnect structure. Consequently, a first interconnect structure 418c and second interconnect structures 428b-428c are formed. PBR structures 404 can be refilled with conductive metals.

Figure 32:
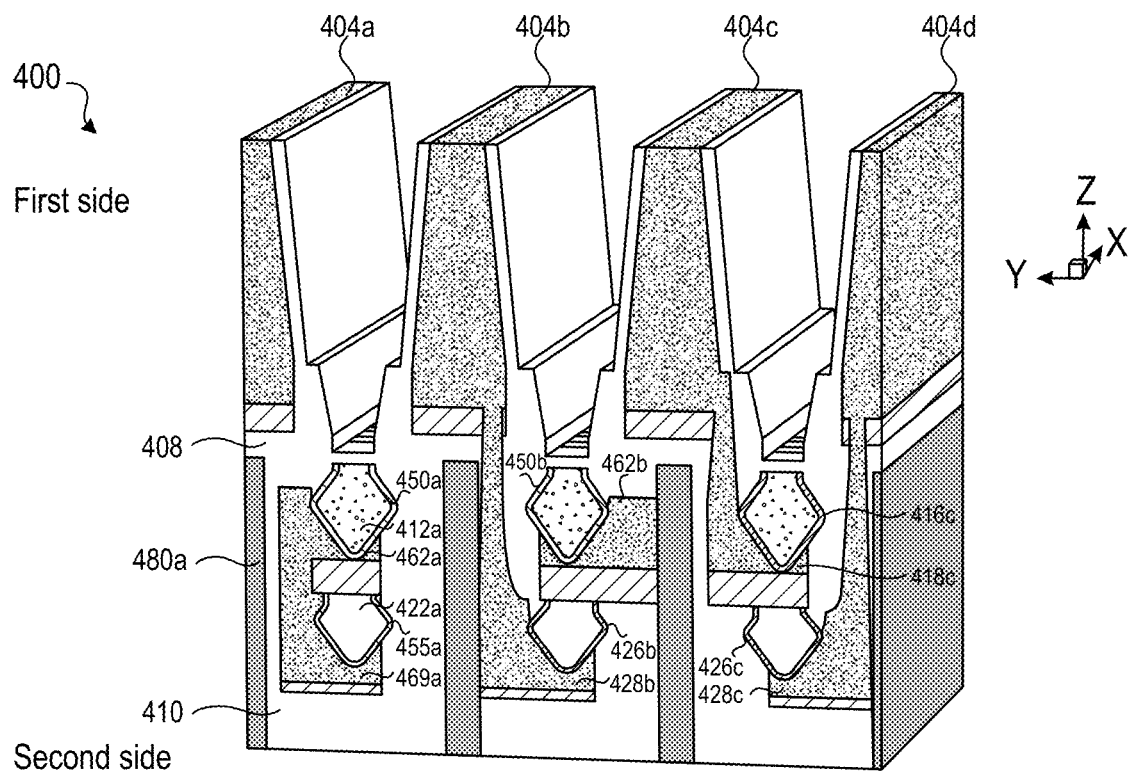
Figure 33:
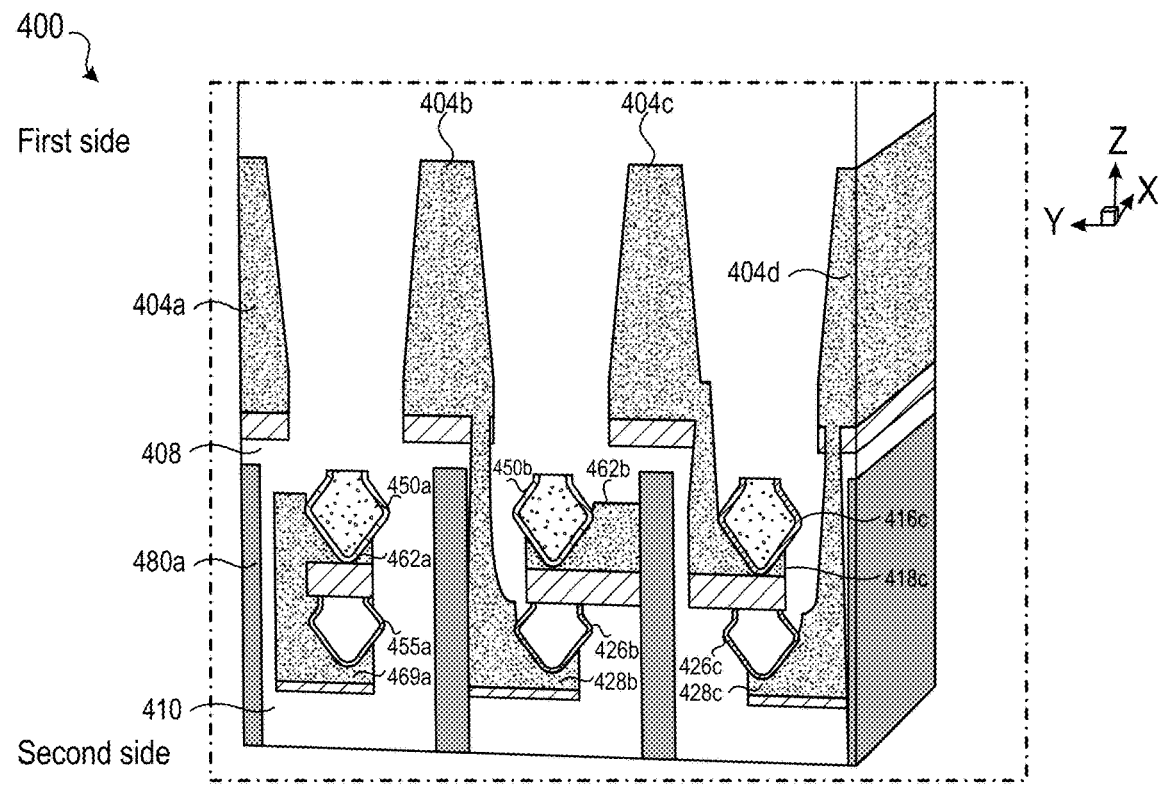

In FIG. 32, the remaining bulk layer 401 (e.g., bulk silicon) making up the bulk fin base and the fin structures 402 can be removed following the metallization of the power rail (404). This step is not required but enables the silicon between the BPR structures 404 to be replaced by a dielectric if desired. In FIG. 33, the volume between the BPR structures 404 occupied by the bulk silicon fin base can be replaced by a dielectric such as silicon oxide, which in this example is the same as the pre-metallization dielectric 410. In some embodiments, steps in FIGS. 32-33 may not be necessary.

Figure 34:
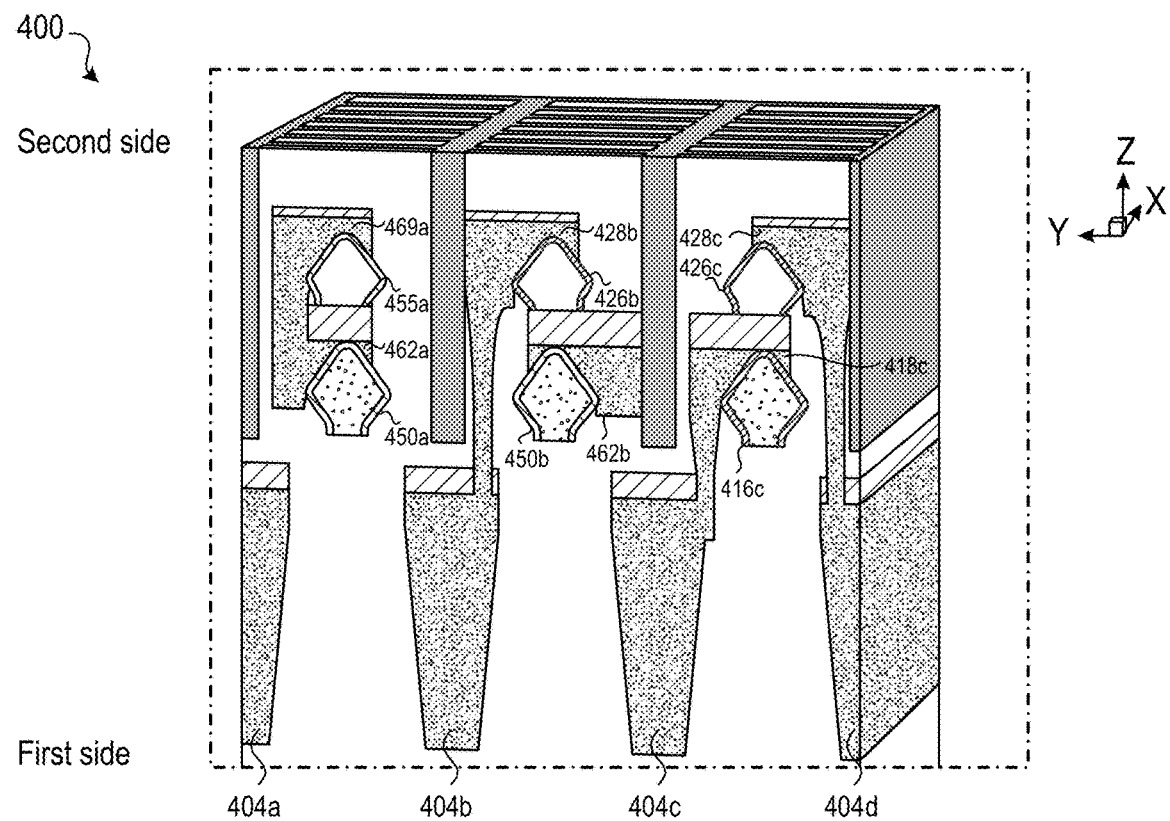

In FIG. 34, the wafer backside (the first side) is then bonded to a third wafer (another carrier wafer), and the device 300 is flipped over again and the original carrier wafer (the second wafer) from the first wafer top-side surface (the second side) is removed to expose the first wafer top-side (the second side). Silicon nitride or other type of CMP-stop material is incorporated into the earlier process integration such that the bonding silicon oxide used in the original carrier wafer process (e.g., FIG. 26) can be removed by either CMP or some type of etch recess.

Figure 35:
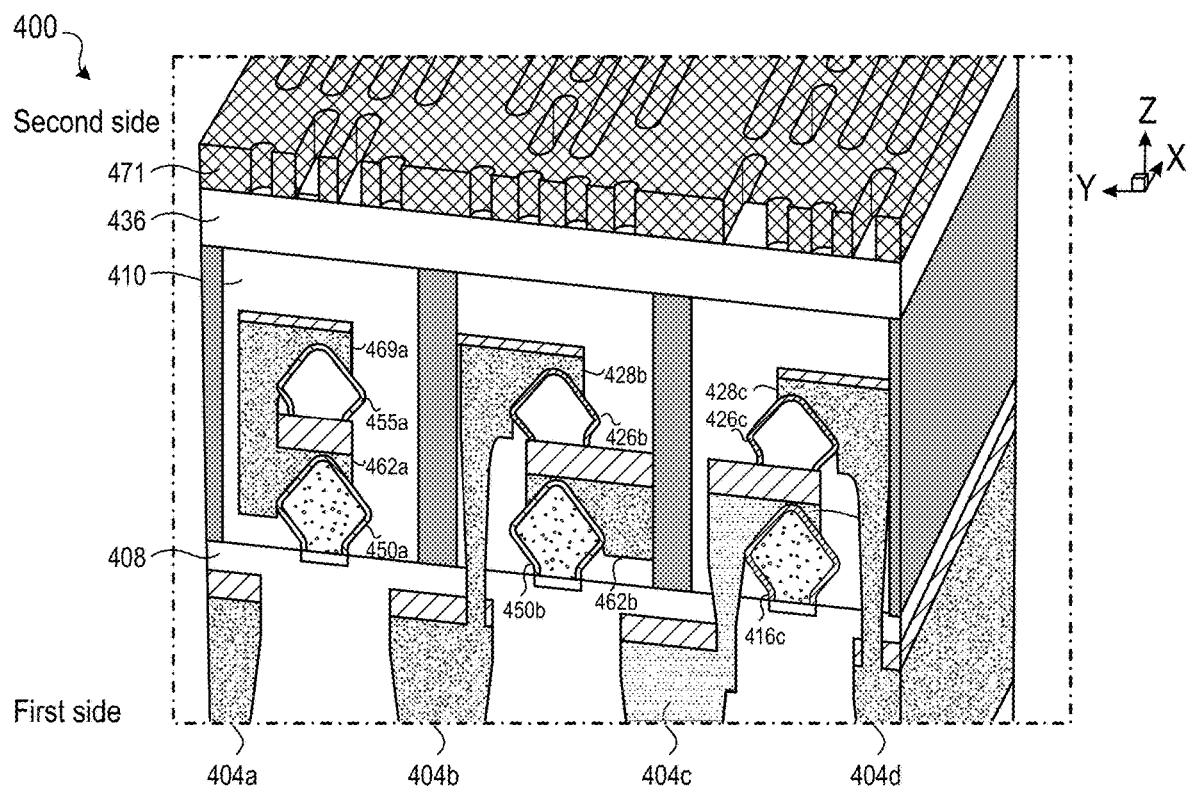

In FIG. 35, a second ILD 436 can be formed over the first ILD 410, and a hardmask 471 can be formed over the second ILD 436. The hardmask 471 can be patterned with the combined patterns of the intended M0 track structures (e.g., metal line trenches) as well as M0 extensions (e.g., via openings) which can provide access to one or more of the individual replacement interconnect structures (e.g., the first and second substitute interconnect structures 462 and 469) and replacement silicide structures (e.g., the first and second substitute silicide layers 450 and 455). The combined patterns also include the intended via-to-drain structures (or via-to-drain openings) electrically connecting interconnects to M0 tracks (or M0 metal line trenches).

Figure 36:
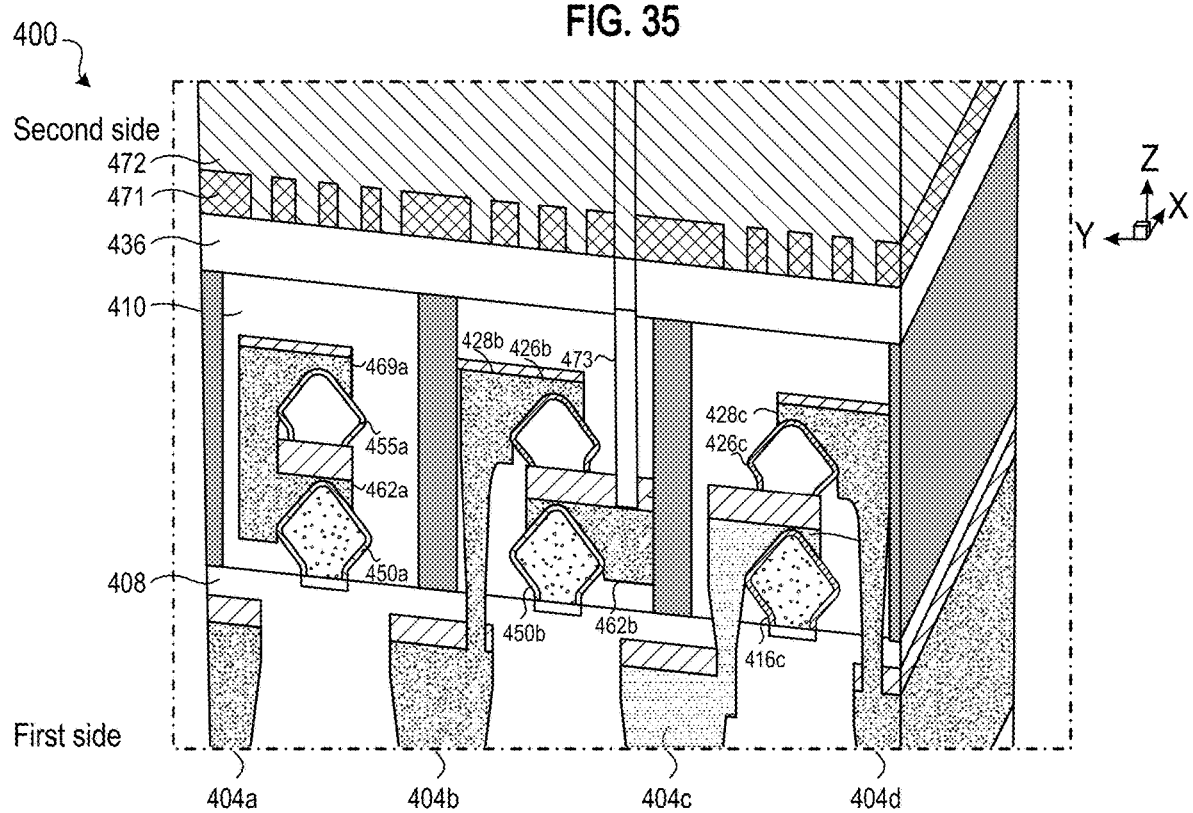

In FIG. 36, at least one first via-to-drain structure (or via-to-drain opening) 473 can be patterned through a self-aligned method in which a pattern to form the first via-to-drain structure 473 can be captured within a film 472. The film 472 can be positioned over the patterned memorization film (or hardmask) 471 that contains the M0 track structures and M0 extensions. The first via-to-drain structure 473 can be etched through the pre-metallization dielectric 410, and then the second dielectric cap 420b (e.g., a metal oxide cap) over the replacement interconnect structures (e.g., 462b) are anisotropically opened to provide access to the replacement interconnect structures (e.g., 462b) and the first substitute silicide layers (e.g., 450b) for the interconnect structures connecting to the BEOL. The pattern density of the vias may warrant multiple exposures for both the interconnect and gate contacts.

Figure 37:
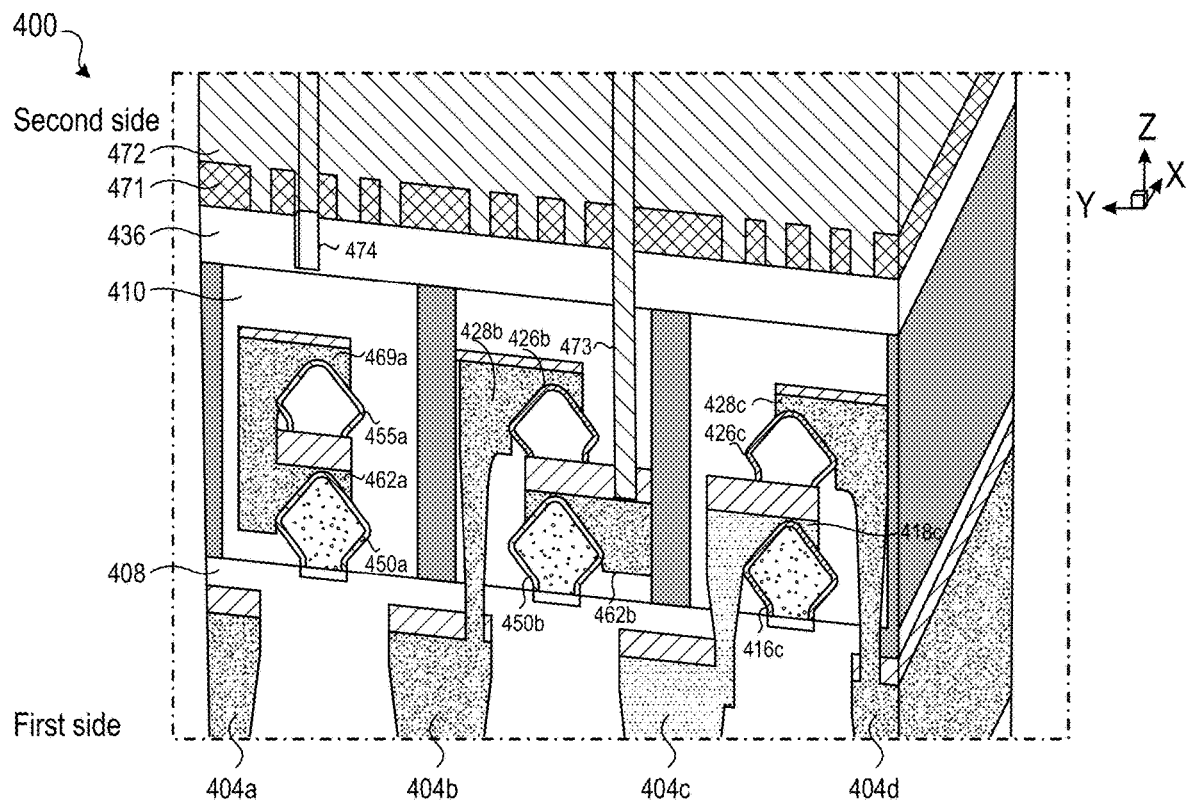

In FIG. 37, given that the number of via-to-drain structures is not extensive, and given the need to initially open one or more of the replacement interconnects and replacement silicide materials, in some flows, the via patterning can be executed in a litho-etch-litho-etch (LELE) scheme. As illustrated, the LELE scheme can include filling the first via-to-drain structures (e.g., 473) with a resist layer, and forming another pattern in the film 472 to form second via-to-drain structures or via-to-drain openings (e.g., 474). The second via-to-drain structures (e.g., 474) can be formed by transferring another pattern in the film 472 into the pre-metallization dielectric 410 by an etching process.

Figure 38:
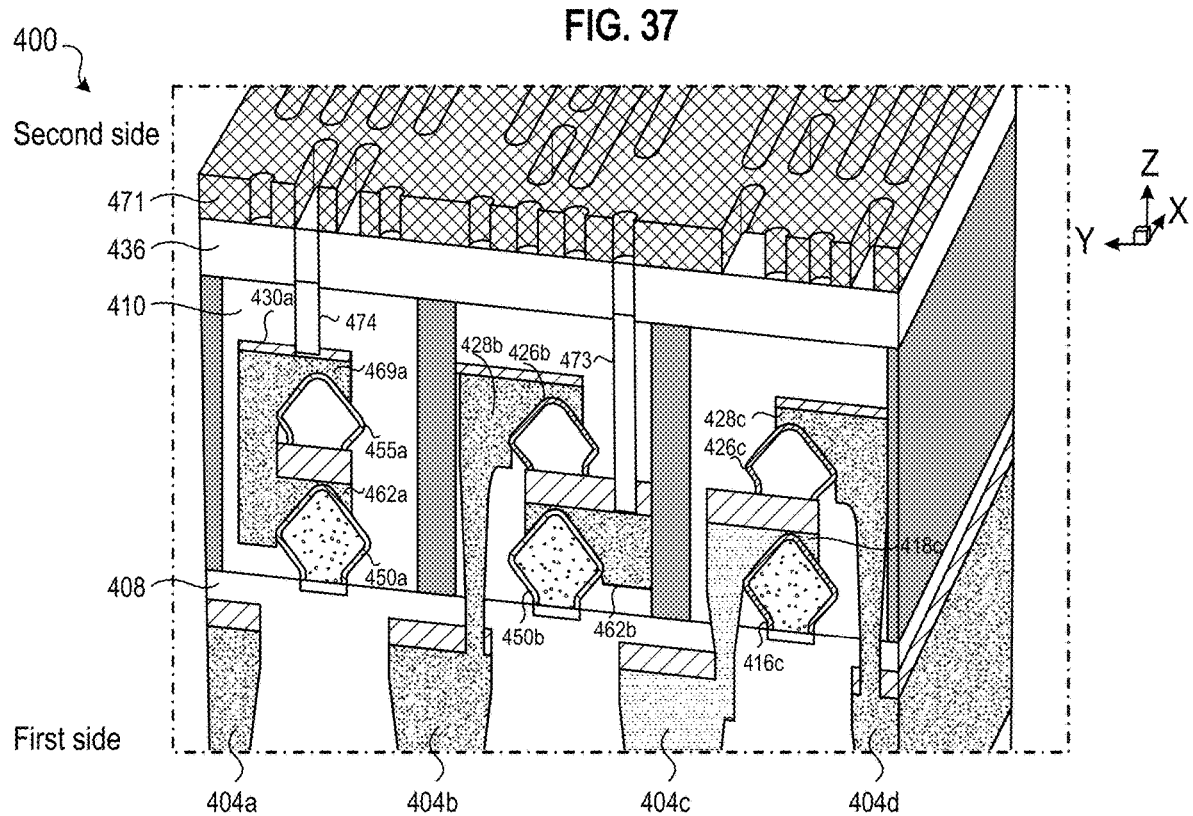

In FIG. 38, the third dielectric caps (e.g., 430a) can be further opened to expose the second substitute interconnect structures 469. The filling pattern material (e.g., the film 472) can be isotropically removed by a simple ash step to reveal the opened replacement interconnect (e.g., the first and second substitute interconnect structures 462 and 469) and replacement silicide materials (e.g., the first and second substitute silicide layers 450 and 455). As shown, the second via-to-drain structures (e.g., 274) can open the second substitute interconnect structures (e.g., 469a) and the second substitute silicide layers (e.g., 462a).

Figure 39:
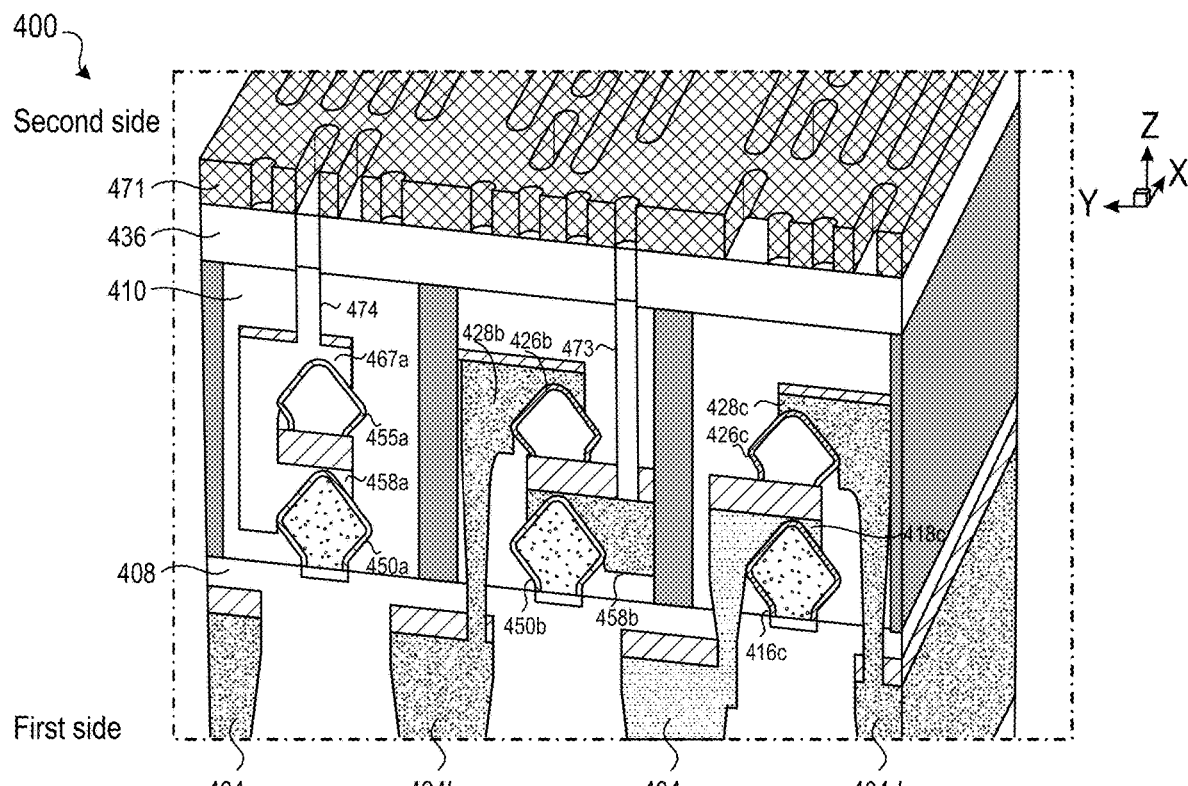

In FIG. 39, the replacement interconnect materials (e.g., the first and second substitute interconnect structures) which would be polysilicon or amorphous silicon in an exemplary embodiment can be isotropically etched with either a vapor-phase etch such as Tokyo Electron CERTAS, or by a wet etch, or a direct or a remote plasma isotropic etch. The presence of the replacement silicide material (e.g., the first and second substitute silicide layers) prevents the etching or any damage to the source and drain contacts during the removal of the replacement interconnect materials. The benefit of incorporating a CERTAS-type etch in current disclosure is that very good etch selectivity can be achieved between the poly/amorphous silicon and the ruthenium (Ru) that is the metal used for the BPR structures 404. Typically both materials (e.g., the poly/amorphous silicon and the Ru) are etched using similar etch chemistries, but the incorporation of CERTAS etch can provide good selectivity between metals and silicon. When the etch is completed, a second group of the first interconnect structures (e.g., 462a and 462b) and a second group of the second interconnect structures (e.g., 469a) are removed. As a result, the first interconnect trenches 458a-458b and the second interconnect trenches 467a are uncovered.

Figure 40:
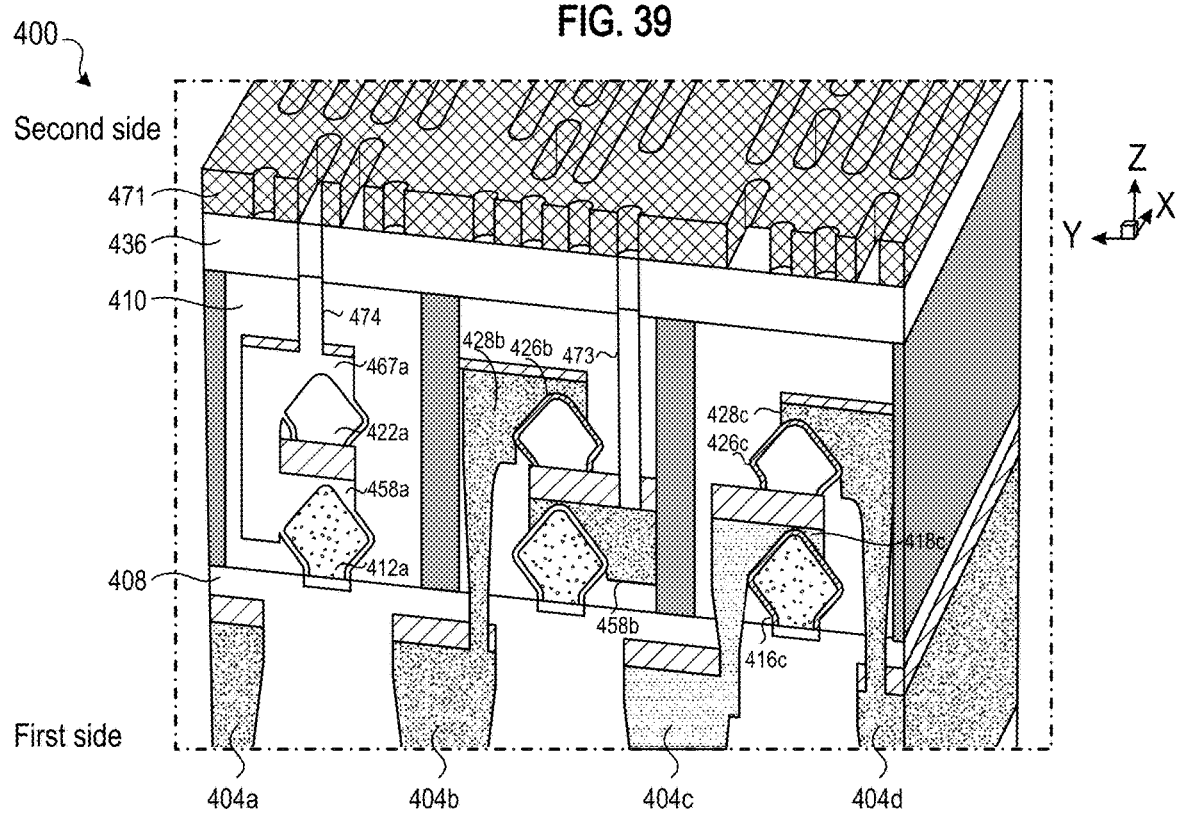

In FIG. 40, once the replacement interconnect material is removed from the actual interconnect structures, the etch chemistry can then be changed to selectively and isotropically remove the replacement silicide material (e.g., the first and second substitute silicide layers) selective to the other dielectric materials present within the semiconductor device 400, including the pre-metallization dielectric 410 such as silicon oxide, capping materials (e.g., the second and third dielectric caps 420 and 430) such as aluminum oxide which can exist as the ceiling of the interconnect structures, and the low-k gate spacer 440 such as SiOC. Once the selective etch is completed, a second group of the first replacement silicide layers (e.g., 450a-450b) and a second group of the second replacement silicide layers (e.g., 455a) are removed from the first S/D structures 412 and the second S/D structures 422 respectively.

Figure 41:
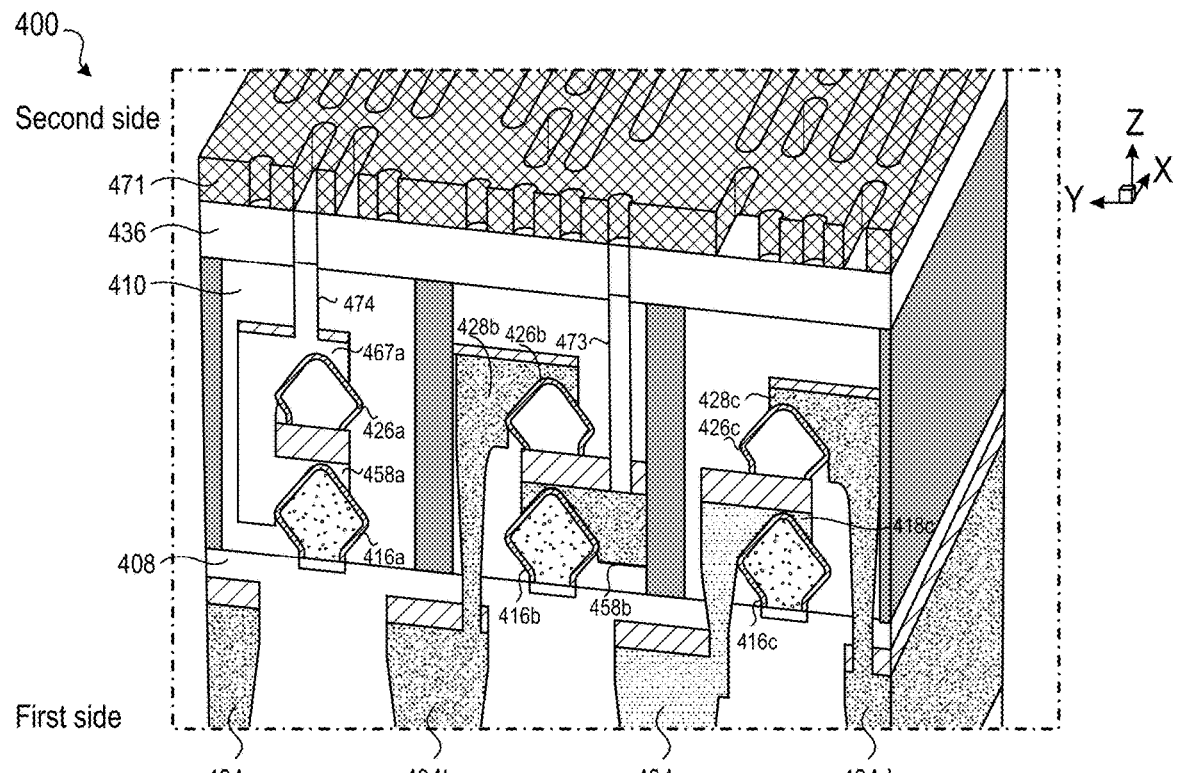

In FIG. 41, a silicon pre-clean be done on the surface of the source and drain epitaxy (e.g., the first S/D structures 412 and the second S/D structures 422) by using a low-temperature COR (chemical oxide removal) etch process produced by Tokyo Electron. Optionally, the etching of the replacement silicide can be done in-situ with the deposition and formation of the actual silicide material. It is understood that in an exemplary embodiment of FIG. 41, a common silicide material is used for both upper and lower devices. For cases where different silicide materials are desired in the upper (or NMOS) and lower (or PMOS) devices, the deposition process can be executed sequentially where the second via-to-drain patterning (e.g., the via-to-drain structures) 474 can be used to open the second substitute interconnect structures 469 so that the second replacement interconnect material 469, and the second replacement silicide material 455 can be removed only from the second S/D structures 422. Subsequently, a silicide material is deposited on the second S/D structures 469, and then the trenches and the via-to drain structures can be filled with a material such as spin-on-carbon. The process can be repeated for the complementary devices (e.g., the lower devices) to deposit another silicide material on the first S/D structures by forming the first via-to-drain structures 473 to open the first substitute interconnect structures (e.g., 462b) and the first replacement silicide material (e.g., 450b) and by using the second via-to-drain patterning (e.g., the via-to-drain structures) 474 to further open the first substitute interconnect structures (e.g., 462a) and the first replacement silicide material (e.g., 450a). In an exemplary embodiment, the silicide material can be completed via a self-aligned silicide process in which a metal such as Ti for NMOS devices (or the upper devices) and Ru for PMOS devices (or lower devices) can be deposited through ALD or CVD method, and the unreacted silicide can be removed in a wet etch process.

Figure 42:
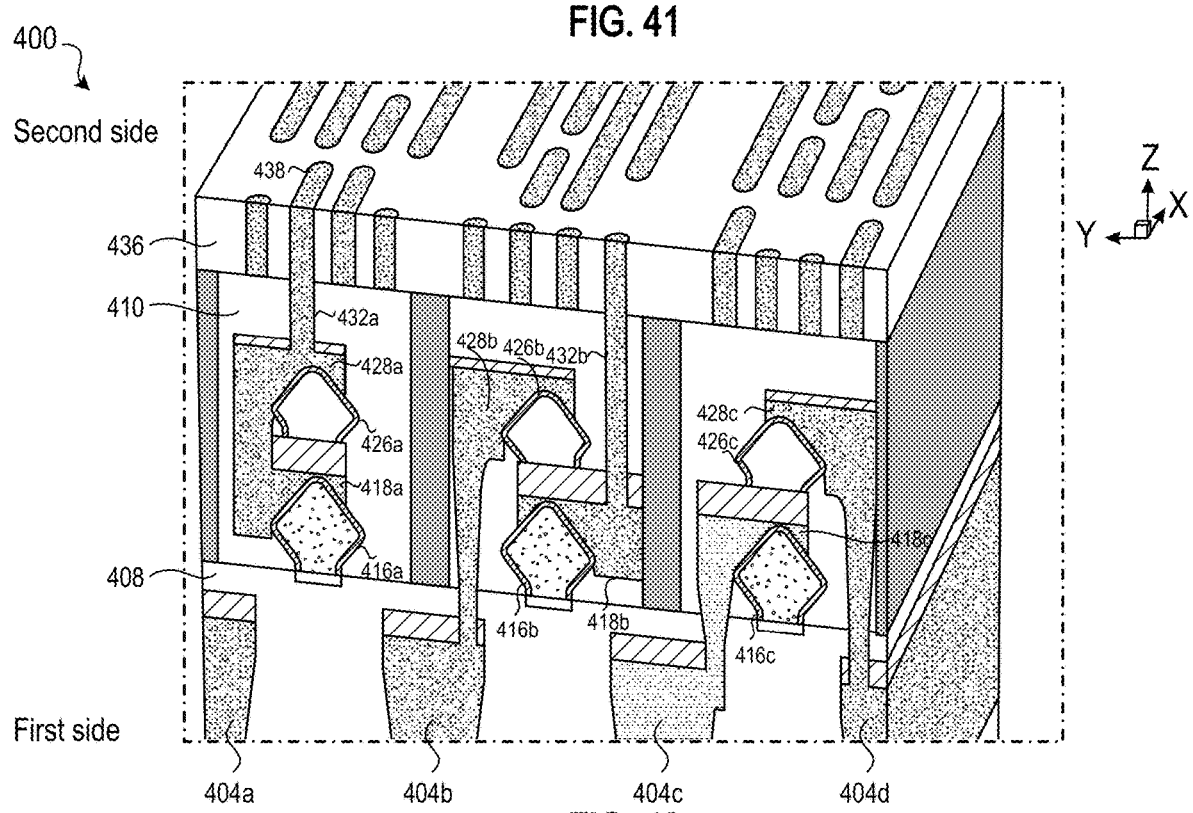

In FIG. 42, an etch process can be performed to transfer the M0 track structures and the M0 extensions in the hardmask 471 into the low-k dielectric film (e.g., the second ILD) 436 to form a plurality of M0 trenches (not shown). Subsequently, the first interconnect trenches 458a-458b, the second interconnect trenches 467a, the M0 trenches, the first via-to-drain structures 473, and the second via-to-drain structures 474 can be metallized at the same time. In some embodiments, the via-to-gate structures that are not shown in this image but extend along an adjacent cross-sectional plane and are positioned over the channel structures can also be metallized together. The metallization process can include filling the first interconnect trenches 458a-485b, the second interconnect trenches 467a, the M0 trenches, the first via-to-drain structures 273, and the second via-to-drain structures 274 with a high conductive metal, such as Ru. The metallization process can provide some cost benefit to the CFET devices in that interconnect structures of both devices (e.g., the upper and lower devices) can be metallized at the end as opposed to forming the interconnect structures separately for the upper and lower devices so there is no liner or barrier composed of lower conductance metal separating the interconnect structures from the via connecting up to M0 as would be seen in typical dual damascene processing. As shown, once the metallization process is completed, first local interconnect structures (or first interconnect structures) 418a-418b can be formed in the first interconnect trenches 458a-458b. Second local interconnect structures or second interconnect structures (e.g., 428a) can be formed in the second interconnect trenches (e.g., 467). Vias 432a-432b can be formed in the first via-to-drain structures 473 and the second via-to-drain structures 474. Metal lines 438 can be formed in the M0 trenches in the second ILD 436. Further, an ash process or an etch process can be applied to remove the hardmask 471.

The device 400 can further have dielectric separations (or insulating layers) that are positioned between the metal lines and the interconnect structures to disconnect one or more metal lines with one or more interconnect structures. Accordingly, additional "blocking" or "cutting" of the metal line pattern is not required.

Figure 43:
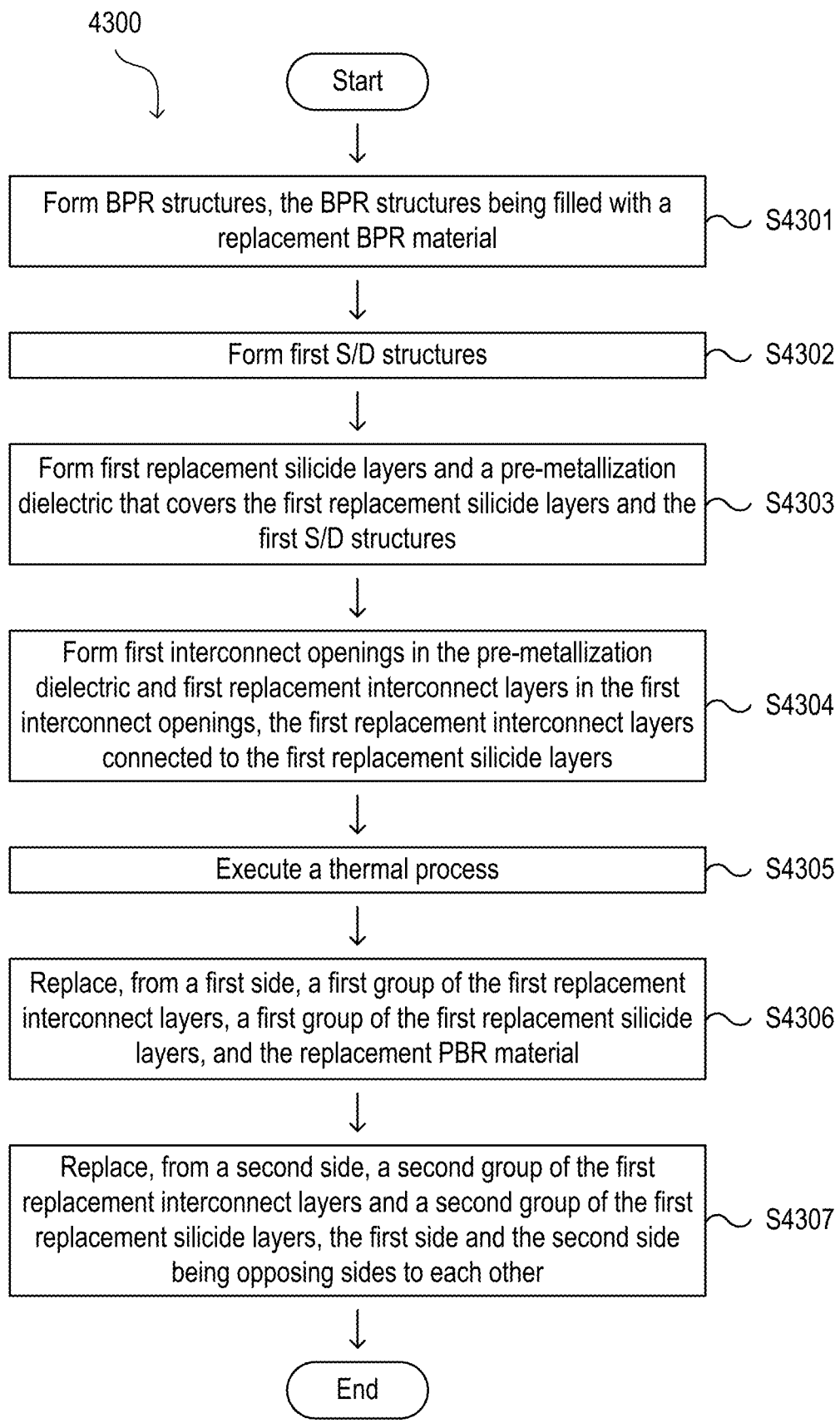
FIG. 43 shows a flowchart of an exemplary process for manufacturing an exemplary semiconductor device, in accordance with embodiments of the disclosure.

FIG. 43 shows a flowchart of an exemplary process 4300 for manufacturing an exemplary semiconductor device, in accordance with embodiments of the disclosure. The process 4300 begins with step S4301 where BPR structures are formed over a substrate of a first wafer. The BPR structures are separated from each other along a top surface of the substrate by fin structures, and the BPR structures are filled with a replacement BPR material. At step S4302, first S/D structures of first FETs can be formed over the substrate. The first S/D structures are positioned at ends of first channel structures of the first FETs, and the first channel structures are positioned over the fin structures and extend along the top surface of the substrate. At step S4303, first replacement silicide layers are formed on surfaces of the first S/D structures. A pre-metallization dielectric layer that covers the first replacement silicide layers and the first S/D structures can then be formed. At step S4304, first interconnect openings are formed in the pre-metallization dielectric and first replacement interconnect layers are then formed in the first interconnect openings, where the first replacement interconnect layers are connected to the first replacement silicide layers.

At step S4305, a thermal process can be executed for the first wafer. For example, the thermal process can include heating the first wafer above 500 degrees Celsius. In one embodiment, the thermal process includes source and drain epitaxy pre-clean and reactor heat-up, typically performed at 750-780° C. ranges. In another embodiment, the thermal process includes source and drain epitaxy growth between 500° C. and 800° C. In another embodiment, the thermal process may include source and drain dopant activation that can be executed using LSA at temperatures ranging from 800° C. up to 1250° C. with durations ranging from sub-millisecond to full second durations.

The process 4300 can then proceed to step S4306 by replacing, from a first side of the first wafer, a first group of the first replacement interconnect layers, a first group of the first replacement silicide layers, and the replacement BPR material. The process 4300 can then proceed to step S4307 by replacing, from a second side of the first wafer, a second group of the first replacement interconnect layers and a second group of the first replacement silicide layers. The first side and the second side are opposing sides to each other.

In some embodiments, the process 4300 can further include forming second FETs that include second channel structures, second S/D structures, second replacement silicide layers, and second replacement interconnect structures over the first FETs, prior to executing the thermal process for the first wafer. Hence, the process 4300 can include some embodiments of the process 300 in FIG. 3. Further, in some embodiments, more FETs, such as third FETs, may be formed over the second FETs.

The various embodiments described herein offer several advantages. For example,

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of fabricating a semiconductor device, the method comprising:
    forming buried power rail (BPR) structures over a substrate of a first wafer, the BPR structures being separated from each other along a top surface of the substrate by fin structures, the BPR structures being filled with a replacement BPR material;
    forming first source/drain (S/D) structures of first field-effect transistors (FETs) over the substrate, the first S/D structures being positioned at ends of first channel structures of the first FETs, the first channel structures being positioned over the fin structures and extending along the top surface of the substrate;
    forming first replacement silicide layers on surfaces of the first S/D structures and a pre-metallization dielectric that covers the first replacement silicide layers and the first S/D structures;
    forming first interconnect openings in the pre-metallization dielectric and first replacement interconnect layers in the first interconnect openings, the first replacement interconnect layers connected to the first replacement silicide layers;
    executing a thermal process for the first wafer;
    replacing, from a first side of the first wafer, a first group of the first replacement interconnect layers, a first group of the first replacement silicide layers, and the replacement BPR material; and
    replacing, from a second side of the first wafer, a second group of the first replacement interconnect layers, and a second group of the first replacement silicide layers, the first side and the second side being opposing sides to each other.

2. The method of claim 1, wherein:
    the BPR structures are connected to the first group of the first replacement interconnect layers;
    the first group of the first replacement interconnect layers are connected to the first group of the first replacement silicide layers; and
    the second group of the first replacement silicide layers are connected to the second group of the first replacement interconnect layers.

3. The method of claim 2, wherein replacing the first group of the first replacement interconnect layers, the first group of the first replacement silicide layers, and the replacement BPR material comprises:
    bonding a second wafer to the second side of the first wafer so that the substrate of the first wafer is exposed from the first side;
    etching from the first side of the first wafer so that the BPR structures are exposed from the first side;
    removing the replacement BPR material;
    removing the first group of the first replacement interconnect layers and the first group of the first replacement silicide layers;
    filling the removed first group of the first replacement silicide layers with first silicide layers;
    filling the removed first group of the first replacement interconnect layers with first interconnect layers; and
    filling the BPR structures with a BPR material.

4. The method of claim 3, wherein replacing the second group of the first replacement interconnect layers and the second group of the first replacement silicide layers comprises:
    bonding a third wafer to the first side of the first wafer;
    removing the second wafer from the second side so that the pre-metallization dielectric of the first wafer is exposed from the second side;
    forming an interlayer dielectric (ILD) over the pre-metallization dielectric;
    forming a patterned mask over the ILD;
    forming first via openings based on the patterned mask, the first via openings extending into the ILD and the pre-metallization dielectric to uncover the second group of the first replacement interconnect layers;

removing the second group of the first replacement interconnect layers and the second group of the first replacement silicide layers;

filling the removed second group of the first replacement silicide layers with second silicide layers; and filling the removed second group of the first replacement interconnect layers with second interconnect layers.

5. The method of claim 4, before executing the thermal process for the first wafer, further comprising:

recessing the first replacement interconnect layers in the first interconnect openings;

forming first dielectric caps on the first replacement interconnect layers;

refilling the first interconnect openings with the pre-metallization dielectric;

recessing the pre-metallization dielectric to uncover second channel structures of second FETs, the second channel structures being positioned over the first channel structures and separated from the first channel structures, the second FETs being positioned over the first FETs and separated from the first FETs;

forming second S/D structures of the second FETs, the second S/D structures being positioned at ends of the second channel structure and separated from the first S/D structures;

forming second replacement silicide layers on surfaces of the second S/D structures;

depositing the pre-metallization dielectric to cover the second replacement silicide layers and the second S/D structures;

forming second interconnect openings in the pre-metallization dielectric, the second interconnect openings uncovering the second replacement silicide layers; and forming second replacement interconnect layers in the second interconnect openings.

6. The method of claim 5, after forming the second replacement interconnect layers in the second interconnect openings, further comprising:

recessing the second replacement interconnect layers in the second interconnect openings;

forming second dielectric caps on the second replacement interconnect layers; and refilling the second interconnect openings with the pre-metallization dielectric.

7. The method of claim 6, after executing the thermal process for the first wafer, further comprising:

replacing, from the first side of the first wafer, a first group of the second replacement interconnect layers and a first group of the second replacement silicide layers; and replacing, from the second side of the first wafer, a second group of the second replacement interconnect layers and a second group of the second replacement silicide layers, wherein:

the BPR structures are connected to the first group of the second replacement interconnect layers;

the first group of the second replacement interconnect layers are connected to the first group of the second replacement silicide layers; and the second group of the second replacement silicide layers are connected to the second group of the second replacement interconnect layers.

8. The method of claim 7, wherein replacing the first group of the second replacement interconnect layers and the first group of the second replacement silicide layers comprises:

removing the first group of the second replacement interconnect layers and the first group of the second replacement silicide layers after removing the replacement BPR material;

filling the removed first group of the second replacement silicide layers with third silicide layers; and filling the first group of the second replacement interconnect layers with third interconnect layers.

9. The method of claim 8, wherein replacing the second group of the second replacement interconnect layers and the second group of the second replacement silicide layers comprises:

forming second via openings based on the patterned mask, the second via openings extending into the ILD and the pre-metallization dielectric to uncover the second group of the second replacement interconnect layers;

removing the second group of the second replacement interconnect layers and the second group of the second replacement silicide layers;

filling the removed second group of the second replacement silicide layers with fourth silicide layers; and filling the removed second group of the second replacement interconnect layers with fourth interconnect layers.

10. The method of claim 9, wherein:

the first silicide is the same as the second silicide;

the third silicide is the same as the fourth silicide;

the first interconnect material is the same as the second interconnect material;

the third interconnect material is the same as the fourth interconnect material; and the BPR material is a conductive metal.

11. The method of claim 5, prior to executing the thermal process for the first wafer, further comprising:

forming first gate structures on surfaces of the first channel structures, and second gate structures on surfaces of the second channel structures, wherein:

the first gate structure includes a first interface layer on the surfaces of the first channel structure, a first high-k dielectric film on the first interface layer, and a first conductive barrier layer on the first high-k dielectric film; and the second gate structure includes a second interface layer on the surfaces of the second channel structure, a second high-k dielectric film on the second interface layer, and a second conductive barrier layer on the second high-k dielectric film.

12. The method of claim 11, after executing the thermal process for the first wafer, further comprising:

forming a first work function metal over the first conductive barrier layer; and forming a second work function metal over the second conductive barrier layer.

13. The method of claim 3, after filling the BPR structures with the BPR material, further comprising:

removing the fin structures from the first side; and filling the removed fin structures with an insulating material.

14. The method of claim 1, wherein the thermal process comprises heating the first wafer above 500 degrees Celsius.

15. A method of fabricating a semiconductor device, the method comprising:

forming BPR structures over a substrate of a first wafer, the BPR structures being separated from each other along a top surface of the substrate by fin structures, the BPR structures being filled with a replacement BPR material;

forming first channel structures of first FETs over the fin structures and second channel structures of second FETs over the first channel structures, the first channel structures and the second channel structures extending along the top surface of the substrate;

forming first S/D structures at ends of the first channel structures, first replacement silicide layers on surfaces of the first S/D structures, and first replacement interconnect structures over the first replacement silicide layers;

forming second S/D structures at ends of the second channel structures, second replacement silicide layers on surfaces of the second S/D structures, and second replacement interconnect structures over the second replacement silicide layers;

executing a thermal process for the first wafer;

replacing, from a first side of the first wafer, a first group of the first replacement interconnect layers, a first group of the second replacement interconnect layers, a first group of the first replacement silicide layers, a first group of the second replacement silicide layers, and the replacement BPR material; and replacing, from a second side of the first wafer, a second group of the first replacement interconnect layers, a second group of the second replacement interconnect layers, a second group of the first replacement silicide layers, and a second group of the second replacement silicide layers, the first side and the second side being opposing sides to each other.

16. The method of claim 15, wherein forming the first replacement interconnect structures comprises:

depositing a pre-metallization dielectric that covers the first replacement silicide layers and the first S/D structures;

forming first interconnect openings in the pre-metallization dielectric, the first interconnect openings uncovering the first replacement silicide layers;

filling the first interconnect openings with the first replacement interconnect structures;

recessing the first replacement interconnect structures in the first interconnect openings; and forming first dielectric caps on the first replacement interconnect structures.

17. The method of claim 16, wherein forming the second S/D structures, the second replacement silicide layers, and the second replacement interconnect structures comprises:

refilling the first interconnect openings with the pre-metallization dielectric;

recessing the pre-metallization dielectric to uncover the second channel structures of the second FETs;

forming the second S/D structures at the ends of the second channel structures;

forming the second replacement silicide layers on the surfaces of the second S/D structures;

depositing the pre-metallization dielectric to cover the second replacement silicide layers and the second S/D structures of the second FETs;

forming second interconnect openings in the second dielectric, the second interconnect openings uncovering the second replacement silicide layers;

filling the second interconnect openings with the second replacement interconnect structures;

recessing the second replacement interconnect structure in the second interconnect openings;

forming second dielectric caps on the second replacement interconnect structures; and refilling the second interconnect openings with the pre-metallization dielectric.

18. The method of claim 17, wherein replacing the first group of the first replacement interconnect layers, the first group of the second replacement interconnect layers, the first group of the first replacement silicide layers, the first group of the second replacement silicide layers, and the replacement BPR material comprising:

bonding a second wafer to the second side of the first wafer so that the substrate of the first wafer is exposed from the first side;

etching the first wafer from the first side so that the BPR structures are exposed from the first side;

removing the replacement BPR material, the first group of the first replacement interconnect layers, the first group of the first replacement silicide layers, the first group of the second replacement interconnect layers, and the first group of the second replacement silicide layers; and filling the removed first group of the first replacement silicide layers, the removed first group of the second replacement silicide layers, the removed first group of the first replacement interconnect layers, the removed first group of the second replacement interconnect layers, and the BPR structures with a first silicide, a second silicide, a first interconnect material, a second interconnect material, and a BPR material, respectively.

19. The method of claim 18, wherein replacing the second group of the first replacement interconnect layers, the second group of the second replacement interconnect layers, the second group of the first replacement silicide layers, and the second group of the second replacement silicide layers comprising:

bonding a third wafer to the first side of the first wafer;

removing the second wafer from the second side so that the pre-metallization dielectric of the first wafer is exposed from the second side;

forming an interlayer dielectric (ILD) over the pre-metallization dielectric;

forming a patterned mask over the ILD;

forming first via openings and second via openings based on the patterned mask, the first via openings and the second via openings extending into the ILD and the pre-metallization dielectric to uncover the second group of the first replacement interconnect layers and the second group of the second replacement interconnect layers, respectively;

removing the second group of the first replacement interconnect layers, the second group of the second replacement interconnect layers, the second group of the first replacement silicide layers, and the second group of the second replacement silicide layers; and filling the removed second group of the first replacement silicide layers, the removed second group of the second replacement silicide layers, the removed second group of the first replacement interconnect layers, and the removed second group of the second replacement interconnect layers with a third silicide, a fourth silicide, a third interconnect material, and a fourth interconnect material, respectively.

20. The method of claim 19, wherein:

the first silicide, the second silicide, the third silicide, and the fourth silicide are a same silicide material; and the first interconnect material, the second interconnect material, the third interconnect material, the fourth interconnect material, and the BPR material are a same conductive metal.

* * * * *